US010234764B2

(12) United States Patent
Lewis et al.

(10) Patent No.: US 10,234,764 B2
(45) Date of Patent: Mar. 19, 2019

(54) ELECTRON BEAM RESIST COMPOSITION

(71) Applicant: The University of Manchester, Manchester (GB)

(72) Inventors: Scott Lewis, Manchester (GB); Richard Winpenny, Manchester (GB); Stephen Yeates, Manchester (GB)

(73) Assignee: The University of Manchester, Manchester (GB)

( * ) Notice: Subject to any disclaimer, the term of this patent is extended or adjusted under 35 U.S.C. 154(b) by 116 days.

(21) Appl. No.: 15/501,417

(22) PCT Filed: Jul. 30, 2015

(86) PCT No.: PCT/GB2015/052204
§ 371 (c)(1),
(2) Date: Feb. 2, 2017

(87) PCT Pub. No.: WO2016/020650
PCT Pub. Date: Feb. 11, 2016

(65) Prior Publication Data
US 2017/0235227 A1 Aug. 17, 2017

(30) Foreign Application Priority Data
Aug. 6, 2014 (GB) .................................. 1413924.0

(51) Int. Cl.
*G03F 7/20* (2006.01)
*G03F 7/004* (2006.01)
*H01J 37/317* (2006.01)

(52) U.S. Cl.
CPC .......... *G03F 7/2059* (2013.01); *G03F 7/0047* (2013.01); *H01J 37/3175* (2013.01)

(58) Field of Classification Search
CPC ... G03F 7/2059; G03F 7/0047; H01J 37/3175

USPC ................................................... 430/296, 942
See application file for complete search history.

(56) References Cited

U.S. PATENT DOCUMENTS

| 4,517,276 A | 5/1985 | Lewis |
| 6,147,184 A | 11/2000 | Castellanos et al. |
| 6,171,757 B1 | 1/2001 | Angelopoulos et al. |
| 6,436,605 B1 | 8/2002 | Angelopoulos et al. |
| 2013/0043389 A1 | 2/2013 | Schiavone et al. |
| 2013/0224652 A1 | 8/2013 | Bass et al. |

FOREIGN PATENT DOCUMENTS

| EP | 0097417 A2 | 1/1984 |
| GB | 1291441 B | 10/1972 |
| WO | 2016020650 A1 | 2/2016 |

OTHER PUBLICATIONS

GB 1413924.0 UKIPO Search Report dated Mar. 2, 2015; 4 pages.
PCT/GB2015/052204 International Search Report and Written Opinion dated Oct. 7, 2015; 11 pages.
Medeiros et al. Recent progress in electron-beam resists for advanced mask-making. IBM Journal of Research and Development (2001). 45(5):639-650.

*Primary Examiner* — Christopher G Young
(74) *Attorney, Agent, or Firm* — Linda B. Huber; Nixon Peabody LLP

(57) ABSTRACT

The present invention relates to an electron beam (eBeam) resist composition, particularly an (eBeam) resist composition for use in the fabrication of integrated circuits. Such resist compositions include an anti-scattering compound which minimizes scattering and secondary electron generation, thus affording extremely high resolution lithography. Such high resolution lithography may be used directly upon silicon-based substrates to produce integrated circuits, or may alternatively be used to produce a lithographic mask (e.g. photomask) to facilitate high-resolution lithography.

21 Claims, 14 Drawing Sheets

(a)

(b)

(a)

(b)

(a)

(b)

ELECTRON BEAM RESIST COMPOSITION

CROSS-REFERENCE TO RELATED APPLICATIONS

This application is a National Phase of International Application No. PCT/GB2015/052204 filed Jul. 30, 2015, which designated the U.S. and that International Application was published under PCT Article 21(2) in English. Both applications also include a claim of priority under 35 U.S.C. § 119(a) and § 365(b) to British patent application No. GB 1413924.0 filed Aug. 6, 2014, the entirety of which is hereby incorporated by reference.

INTRODUCTION

The present invention relates to an electron beam (eBeam) resist composition, particularly an (eBeam) resist composition for use in the fabrication of integrated circuits. The present invention also relates to an eBeam resist-coated material/substrate and method for its preparation, a patterned substrate and method for its preparation, a method of imaging, a method of performing electron-beam lithography and an imaged substrate formed from said method, a method of selectively modifying a surface of a substrate, a lithographic mask and method for its preparation, a method of performing lithography with said lithographic mask and an imaged substrate formed from said method, a multi-layered substrate and a method for its preparation, an integrated circuit die or an integrated circuit wafer comprising a plurality of integrated circuit dice and methods for their preparation, an integrated circuit package and method for its preparation, a circuit board and its method of preparation, an electronic device or system and its method of preparation, and a use of an eBeam resist composition to produce all the above.

BACKGROUND

There is a continuous drive in the electronics industry to miniaturize integrated circuits, for a variety of reasons well known to those skilled in the art. Significant developments in the semiconductor industry were made possible by advances in photolithography, from the micron scale to the nanometer scale, but the physical resolution limits of optical lithography have now almost been reached, thus constraining further advancement. However, continued growth of the semiconductor industry depends on increasing the performance of integrated circuits on a silicon substrate.

Recent developments in extreme ultraviolet (EUV) lithography, at 13.5 nm, has enabled some further scaling/miniaturization of integrated circuits, but enormous challenges still obstruct the full implementation of this technique in the semiconductor industry.

Electron-beam lithography (e-beam, EBL) has been considered as a potential complement to optical lithography on account of its high resolution. However, even this high resolution is somewhat limited by the nature of the eBeam resists currently available, which tend to scatter primary electrons, thus producing secondary electrons and proximity effects which compromise the resolution and clarity of the ultimate printed pattern.

It is therefore an object of the present invention to solve at least one of the problems of the prior art.

SUMMARY OF THE INVENTION

According to a first aspect of the present invention there is provided an eBeam resist composition comprising an anti-scattering compound.

According to a further aspect of the invention, there is provided a method of preparing an eBeam resist-coated material/substrate, the method comprising coating a substrate with an eBeam resist coating; wherein the eBeam resist coating comprises an optionally dried and/or cured eBeam resist composition; and wherein the eBeam resist composition comprises an anti-scattering compound.

According to a further aspect of the invention, there is provided an eBeam resist-coated material/substrate obtainable by, obtained by, or directly obtained by a method of preparing an eBeam resist-coated material/substrate as defined herein.

According to a further aspect of the invention, there is provided an eBeam resist-coated material/substrate comprising a substrate coated with an eBeam resist coating; wherein the eBeam resist coating comprises an optionally dried and/or cured eBeam resist composition; wherein the eBeam resist composition comprises an anti-scattering compound.

According to a further aspect of the invention, there is provided a method of preparing a patterned substrate, the method comprising:
  i) providing an eBeam resist-coated substrate as defined herein or applying an eBeam resist coating to a substrate;
  ii) exposing part(s) of the eBeam resist coating to electron beam radiation to provide an exposed eBeam resist coating;
  iii) developing the exposed eBeam resist coating to generate an eBeam resist pattern layer, the eBeam resist pattern layer comprising: developer-insoluble coating portions of the eBeam resist coating (i.e. ridges); and an array of grooves extending through the eBeam resist pattern layer;
wherein the eBeam resist coating comprises an optionally dried and/or cured eBeam resist composition;
wherein the eBeam resist composition comprises an anti-scattering compound.

According to a further aspect of the invention, there is provided a patterned substrate obtainable by, obtained by, or directly obtained by a method of preparing a patterned substrate as defined herein.

According to a further aspect of the invention, there is provided a method of imaging, the method comprising:
  i) providing an eBeam resist-coated substrate as defined herein or applying an eBeam resist coating to a substrate;
  ii) exposing part(s) of the eBeam resist coating to electron beam radiation to provide an exposed eBeam resist coating;
  iii) developing the exposed eBeam resist coating to generate an eBeam resist pattern layer, the eBeam resist pattern layer comprising: developer-insoluble coating portions of the eBeam resist coating (i.e. ridges); and an array of grooves extending through the eBeam resist pattern layer;
wherein the eBeam resist coating comprises an optionally dried and/or cured eBeam resist composition;
wherein the eBeam resist composition comprises an anti-scattering compound.

According to a further aspect of the invention, there is provided a method of performing electron-beam lithography, the method comprising:
  i) providing an (eBeam) resist-coated substrate as defined herein or applying an (eBeam) resist coating to a substrate;

ii) exposing part(s) of the (eBeam) resist coating to (electron beam) radiation to provide an exposed (eBeam) resist coating;

iii) developing the exposed (eBeam) resist coating to generate an (eBeam) resist pattern layer, the (eBeam) resist pattern layer comprising: developer-insoluble coating portions of the (eBeam) resist coating (i.e. ridges); and an array of grooves extending through the (eBeam) resist pattern layer;

iv) optionally modifying the substrate, substrate surface, or part(s) thereof, underlying the (eBeam) resist pattern layer;

v) optionally removing the (eBeam) resist pattern layer to provide a modified substrate;

vi) optionally repeating, one or more times, step iv) and/or steps i)-v) (optionally with an alternative resist coating, such as a photoresist, instead of the eBeam resist coating; and optionally using alternative radiation during exposure, such as visible or ultraviolet light, instead of electron beam radiation) upon the modified substrate;

wherein step (i) of the method is optionally preceded by performing steps (i) to (vi) (i.e. pre-steps (i)-(vi)), optionally repeated one or more times, using either an eBeam resist coating or an alternative resist coating and using either electron beam radiation or alternative radiation during exposure;

wherein the eBeam resist coating comprises an optionally dried and/or cured eBeam resist composition;

wherein the eBeam resist composition comprises an anti-scattering compound.

According to a further aspect of the invention, there is provided an imaged substrate obtainable by, obtained by, or directly obtained by the method of performing electron-beam lithography as defined herein.

According to a further aspect of the invention, there is provided a method of selectively modifying a surface of a substrate, the method comprising:

i) providing an (eBeam) resist-coated substrate as defined herein or applying an (eBeam) resist coating to a substrate;

ii) exposing part(s) of the (eBeam) resist coating to electron beam radiation to provide an exposed (eBeam) resist coating;

iii) developing the exposed (eBeam) resist coating to generate an (eBeam) resist pattern layer, the (eBeam) resist pattern layer comprising: developer-insoluble coating portions of the (eBeam) resist coating (i.e. ridges); and an array of grooves extending through the (eBeam) resist pattern layer;

iv) selectively modifying the substrate, substrate surface, or part(s) thereof, underlying the (eBeam) resist pattern layer, v) optionally removing the (eBeam) resist pattern layer to provide a modified substrate;

vi) optionally repeating, one or more times, step iv) and/or steps i)-v) (optionally with an alternative resist coating, such as a photoresist, instead of the eBeam resist coating; and optionally using alternative radiation during exposure, such as visible or ultraviolet light, instead of electron beam radiation) upon the modified substrate;

wherein step (i) of the method is optionally preceded by performing steps (i) to (vi) (i.e. pre-steps (i)-(vi)), optionally repeated one or more times, using an alternative resist coating instead of the eBeam resist coating and optionally using alternative radiation during exposure instead of electron beam radiation;

wherein the eBeam resist coating comprises an optionally dried and/or cured (eBeam) resist composition;

wherein the eBeam resist composition comprises an anti-scattering compound.

According to a further aspect of the invention, there is provided a method of manufacturing a lithographic mask (e.g. a photomask), the method comprising:

i) providing an (eBeam) resist-coated substrate as defined herein or applying an resist coating to a substrate (suitably a substrate suitable for use in lithography);

ii) exposing part(s) of the (eBeam) resist coating to electron beam radiation to provide an exposed (eBeam) resist coating;

iii) developing the exposed (eBeam) resist coating to generate an (eBeam) resist pattern layer, the (eBeam) resist pattern layer comprising: developer-insoluble coating portions of the (eBeam) resist coating (i.e. ridges); and an array of grooves extending through the (eBeam) resist pattern layer;

iv) optionally selectively modifying the substrate, substrate surface, or part(s) thereof, underlying the (eBeam) resist pattern layer (suitably such that the modified part(s) of the substrate or substrate surface have increased or decreased transparency to a predetermined type of radiation, e.g. radiation used in photolithography, relative to the original substrate or unmodified part(s) of the substrate or substrate surface);

v) optionally removing the (eBeam) resist pattern layer to provide a modified substrate;

wherein the eBeam resist coating comprises an optionally dried and/or cured (eBeam) resist composition;

wherein the eBeam resist composition comprises an anti-scattering compound.

According to a further aspect of the invention, there is provided a lithographic mask (e.g. a photomask) obtainable by, obtained by, or directly obtained by the method of manufacturing a lithographic mask (e.g. a photomask) defined herein.

According to a further aspect of the invention, there is provided a method of performing lithography, the method comprising:

i) providing a resist-coated substrate or applying a resist coating to a substrate (the resist coating may be any resist coating suitable for exposing via a lithographic mask, e.g. a photoresist);

ii) exposing part(s) of the resist coating, through a lithographic mask (e.g. photomask) as defined herein (or obtainable by a method defined herein), to radiation (e.g. UV or visible light) to provide an exposed resist coating;

iii) developing the exposed resist coating to generate a resist pattern layer, the resist pattern layer comprising: developer-insoluble coating portions of the resist coating (i.e. ridges); and an array of grooves extending through the resist pattern layer;

iv) optionally modifying the substrate, substrate surface, or part(s) thereof, underlying the resist pattern layer;

v) optionally removing the resist pattern layer to provide a modified substrate;

vi) optionally repeating, one or more times, step iv) and/or steps i)-v) (with either an eBeam resist coating of the invention or an alternative resist coating, such as a photoresist; and optionally using electron beam radiation with or without a lithographic mask or alternative radiation during exposure, such as visible or ultraviolet light) upon the modified substrate;

wherein step (i) of the method is optionally preceded by performing steps (i) to (vi) of this method and/or the method of performing electron-beam lithography (i.e. pre-steps (i)-(vi)), optionally repeated one or more times, using either an eBeam resist coating or an alternative resist coating and using either electron beam radiation or alternative radiation during exposure.

According to a further aspect of the invention, there is provided an imaged substrate obtainable by, obtained by, or directly obtained by the method of performing lithography as defined herein.

According to a further aspect of the invention, there is provided a method of manufacturing a multi-layered substrate, the method comprising:
i) providing a resist-coated substrate or applying a resist coating to a substrate (the resist coating may be any resist coating suitable for exposing via a lithographic mask, e.g. a photoresist);
ii) exposing part(s) of the resist coating, through a lithographic mask (e.g. photomask) as defined herein (or obtainable by a method defined herein), to radiation (e.g. UV or visible light) to provide an exposed resist coating;
iii) developing the exposed resist coating to generate a resist pattern layer, the resist pattern layer comprising: developer-insoluble coating portions of the resist coating (i.e. ridges); and
an array of grooves extending through the resist pattern layer;
iv) selectively modifying the substrate, substrate surface, or part(s) thereof, underlying the resist pattern layer,
v) removing the resist pattern layer to provide a modified substrate;
vi) optionally repeating, one or more times, step iv) and/or steps i)-v) (with either an eBeam resist coating of the invention or an alternative resist coating, such as a photoresist; and optionally using electron beam radiation with or without a lithographic mask or alternative radiation during exposure, such as visible or ultraviolet light) upon the modified substrate;
wherein step (i) of the method is optionally preceded by performing steps (i) to (vi) of this method and/or of the method of performing electron-beam lithography (i.e. pre-steps (i)-(vi)), optionally repeated one or more times, using either an eBeam resist coating or an alternative resist coating and using either electron beam radiation or alternative radiation during exposure;
wherein the eBeam resist coating comprises an optionally dried and/or cured resist composition;
wherein the eBeam resist composition comprises an anti-scattering compound.

According to a further aspect of the invention, there is provided a method of manufacturing a multi-layered substrate, the method comprising:
i) providing an (eBeam) resist-coated substrate as defined herein or applying an (eBeam) resist coating to a substrate;
ii) exposing part(s) of the (eBeam) resist coating to electron beam radiation to provide an exposed (eBeam) resist coating;
iii) developing the exposed (eBeam) resist coating to generate an (eBeam) resist pattern layer, the (eBeam) resist pattern layer comprising: developer-insoluble coating portions of the resist coating (i.e. ridges); and
an array of grooves extending through the (eBeam) resist pattern layer;
iv) selectively modifying the substrate, substrate surface, or part(s) thereof, underlying the (eBeam) resist pattern layer,
v) removing the (eBeam) resist pattern layer to provide a modified substrate;
vi) optionally repeating, at least once, step iv) and/or steps i)-v) (optionally with an alternative resist coating, such as a photoresist, instead of the eBeam resist coating; and optionally using alternative radiation during exposure, such as visible or ultraviolet light, instead of electron beam radiation) upon the modified substrate;
wherein step (i) of the method is optionally preceded by performing steps (i) to (vi) of this method and/or of the method of performing electron-beam lithography (i.e. pre-steps (i)-(vi)), optionally repeated one or more times, using either an eBeam resist coating or an alternative resist coating and using either electron beam radiation or alternative radiation during exposure;
wherein the eBeam resist coating comprises an optionally dried and/or cured resist composition;
wherein the eBeam resist composition comprises an anti-scattering compound.

According to a further aspect of the invention, there is provided a method of manufacturing a multi-layered substrate, the method comprising:
i) providing an (eBeam) resist-coated substrate as defined herein or applying an (eBeam) resist coating to a substrate; and
ii) exposing part(s) of the (eBeam) resist coating to electron beam radiation to provide an exposed (eBeam) resist coating;
OR
i) providing a resist-coated substrate or applying a resist coating to a substrate (wherein the resist coating is either as defined herein or is any alternative resist coating suitable for exposing via a lithographic mask, e.g. a photoresist); and
ii) exposing part(s) of the resist coating, through a lithographic mask (e.g. photomask) as defined herein (or obtainable by a method defined herein), to radiation (e.g. UV or visible light) to provide an exposed resist coating;
AND
iii) developing the exposed (eBeam) resist coating to generate an (eBeam) resist pattern layer, the (eBeam) resist pattern layer comprising: developer-insoluble coating portions of the resist coating (i.e. ridges); and
an array of grooves extending through the (eBeam) resist pattern layer;
iv) selectively modifying the substrate, substrate surface, or part(s) thereof, underlying the (eBeam) resist pattern layer,
v) removing the (eBeam) resist pattern layer to provide a modified substrate;
vi) optionally repeating, one or more times, step iv) and/or steps i)-v) (with either an eBeam resist coating of the invention or an alternative resist coating, such as a photoresist; and optionally using electron beam radiation with or without a lithographic mask or alternative radiation during exposure, such as visible or ultraviolet light) upon the modified substrate;
wherein step (i) of the method is optionally preceded by performing steps (i) to (vi) of this method (i.e. pre-steps (i)-(vi), optionally using either of the two step (i)/(ii) combinations) and/or performing steps (i) to (vi) of the method of performing electron beam lithography, optionally repeated one or more times, using either an eBeam resist coating or an alternative resist coating and using either electron beam radiation or alternative radiation during exposure;

wherein the eBeam resist coating comprises an optionally dried and/or cured resist composition;

wherein the eBeam resist composition comprises an anti-scattering compound.

According to a further aspect of the invention, there is provided a multi-layered substrate obtainable by, obtained by, or directly obtained by a method of manufacturing a multi-layered substrate as defined herein.

According to a further aspect of the invention, there is provided a method of fabricating an integrated circuit die or an integrated circuit wafer comprising a plurality of integrated circuit dice, the or each die comprising a plurality of electronic components, wherein the method comprises:

i) providing an (eBeam) resist-coated substrate as defined herein or applying an (eBeam) resist coating to a substrate; and ii) exposing part(s) of the (eBeam) resist coating to electron beam radiation to provide an exposed (eBeam) resist coating;

OR i) providing a resist-coated substrate or applying a resist coating to a substrate (the resist coating may be any resist coating suitable for exposing via a lithographic mask, e.g. a photoresist); and ii) exposing part(s) of the resist coating, through a lithographic mask (e.g. photomask) as defined herein (or obtainable by a method defined herein), to radiation (e.g. UV or visible light) to provide an exposed resist coating;

AND iii) developing the exposed (eBeam) resist coating to generate an (eBeam) resist pattern layer, the (eBeam) resist pattern layer comprising: developer-insoluble coating portions of the (eBeam) resist coating (i.e. ridges); and an array of grooves extending through the (eBeam) resist pattern layer;

iv) modifying the substrate, substrate surface, or part(s) thereof, underlying the (eBeam) resist pattern layer (this may involve conductively interconnecting the electronic components of the or each die with conductor(s));

v) removing the (eBeam) resist pattern layer to provide a modified substrate;

vi) optionally repeating, one or more times, step iv) and/or steps i)-v) (with either a resist coating of the invention or an alternative resist coating, such as a photoresist; and optionally using electron beam radiation with or without a lithographic mask or alternative radiation during exposure, such as visible or ultraviolet light) upon the modified substrate;

vii) optionally conductively interconnecting the electronic components of the or each die with conductor(s) (if not already performed during one or more substrate/substrate-surface modifying steps) to provide an integrated circuit with external contact terminals;

viii) optionally performing one or more further finishing steps;

ix) optionally separating an integrated circuit die from a wafer comprising a plurality of integrated circuit dice;

wherein step (i) of the method is optionally preceded by performing steps (i) to (vi) of this method (i.e. pre-steps (i)-(vi), optionally using either of the two step (i)/(ii) combinations) and/or performing steps (i) to (vi) of the method of performing electron beam lithography, optionally repeated one or more times, using either an eBeam resist coating or an alternative resist coating and using either electron beam radiation or alternative radiation during exposure;

wherein the eBeam resist coating comprises an optionally dried and/or cured resist composition;

wherein the eBeam resist composition comprises an anti-scattering compound.

According to a further aspect of the invention, there is provided an integrated circuit die obtainable by, obtained by, or directly obtained by a method of fabricating an integrated circuit die as defined herein.

According to a further aspect of the invention, there is provided an integrated circuit wafer comprising a plurality of integrated circuit dice, the integrated circuit wafer being obtainable by, obtained by, or directly obtained by a method of fabricating an integrated circuit wafer as defined herein.

According to a further aspect of the invention, there is provided a method of manufacturing an integrated circuit package, the integrated circuit package comprising a plurality of pins and an integrated circuit die with external contact terminals conductively connected to the corresponding plurality of pins, wherein the method comprises:

i) providing an integrated circuit die as defined herein or fabricating an integrated circuit die by a method of fabricating an integrated circuit die as defined herein;

ii) attaching the integrated circuit die to a package substrate, wherein the package substrate comprises electrical contacts, each of the electrical contacts being optionally connected or connectable to a corresponding pin;

iii) conductively connecting each of the external contact terminals of the integrated circuit die to corresponding electrical contacts of the package substrate;

iv) optionally (and if necessary) connecting the electrical contacts of the package substrate to corresponding pins;

v) encapsulating the integrated circuit die.

According to a further aspect of the invention, there is provided an integrated circuit package obtainable by, obtained by, or directly obtained by a method of manufacturing an integrated circuit package as defined herein.

According to a further aspect of the invention, there is provided a method of manufacturing a circuit board comprising an integrated circuit package (suitably as defined herein) comprising a plurality of pins, wherein the method comprises:

i) providing an integrated circuit package as defined herein or manufacturing an integrated circuit package by a method of manufacturing an integrated circuit package as defined herein;

ii) conductively connecting the integrated circuit package to a circuit board.

According to a further aspect of the invention, there is provided a circuit board obtainable by, obtained by, or directly obtained by a method of manufacturing a circuit board as defined herein.

According to a further aspect of the invention, there is provided a method of manufacturing an electronic device or system, the electronic device or system comprising or being connectable to a power source and comprising a circuit board conductively connected to or connectable to a power source, wherein the method comprises:

i) providing a circuit board as defined herein or manufacturing a circuit board by a method of manufacturing a circuit board as defined herein;

ii) incorporating the circuit board within the electronic device or system.

According to a further aspect of the invention, there is provided an electronic device or system obtainable by, obtained by, or directly obtained by a method of manufacturing an electronic device or system as defined herein According to a further aspect of the invention, there is provided a use of an eBeam resist composition for coating a substrate with an eBeam resist coating; for patterning a substrate; for imaging; as a resist coating in electron-beam lithography; for selectively modifying a surface of a substrate; for manufacturing a lithographic mask (such as those used in performing lithography or the production of integrated circuits etc.); for manufacturing a multi-layered substrate; for fabricating an integrated circuit die; for fabricating an integrated circuit wafer; for manufacturing an integrated circuit package; for manufacturing a circuit board; or for manufacturing an electronic device or system.

Any features, including optional, suitable, and preferred features, described in relation to any particular aspect of the invention may also be features, including optional, suitable and preferred features, of any other aspect of the present invention.

In addition to its use with electron beam technology, the present invention is also suitably applicable to other particulate radiation systems, for instance, systems which utilize ion beams such as focused ion beams (FIB) or proton beams (e.g. as in proton beam writing, PBW). As such, in any of the aforesaid aspects of the invention where electron beam radiation is used, an ion beam (such as a focused ion beam or proton beam) may be used instead. As such, all references herein to eBeam and electron beams may be taken, in alternative aspects of the invention, to relate to ion beams.

BRIEF DESCRIPTION OF THE DRAWINGS

For a better understanding of the invention, and to show how embodiments of the same are put into effect, reference is now made, by way of example, to the following diagrammatic drawings, in which.

DETAILED DESCRIPTION OF THE INVENTION

Definitions

Figure 1:
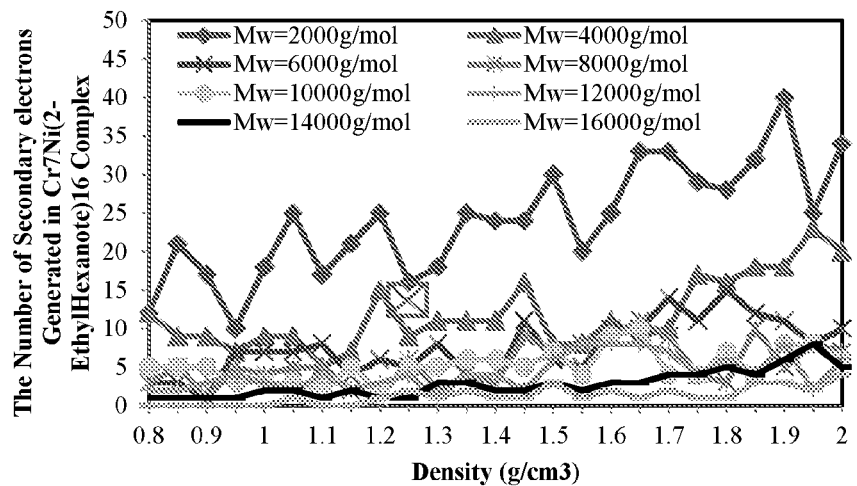
FIG. 1 is a chart showing the number of Secondary Electrons generated in a 100 nm thick films at 30 KeV eBeam exposure for compounds of molecular weights shown as a function of density.

Unless otherwise stated, the following terms used in the specification and claims have the following meanings set out below.

Herein, unless stated otherwise, the terms "radiation" and "irradiation" refer to the exposure of the resist composition, or coating thereof, to radiation that causes a physical or chemical change in the resist composition thereby allowing it to be "developed". The radiation in question may be any suitable radiation. Where electron-beam lithography is being performed, the radiation is electron beam radiation, but since the present invention allows multiple resist compositions to be used, for instance during the formation of multi-layered integrated circuits, some of the resist compositions may be other than eBeam resist compositions of the invention and may instead be visible/UV photoresists or such like where the relevant radiation is visible/ultraviolet radiation (e.g. suitably for use in photolithography).

Herein, a "base polymeric component", a "resist component", or a "resist polymer" in a resist composition is a component which undergoes a change upon exposure to the relevant radiation (e.g. electron beam radiation, ionizing radiation, ultraviolet radiation). The resist component of resist compositions of the invention (for use with eBeam lithography) comprises an anti-scattering compound, but may additionally comprise other resist components, such as a polymeric component (suitably a polymeric resin—e.g. PMMA). Where resist compositions excluded from the scope of the invention are used, such compositions may comprise such other resist components, including a polymeric component, and may optionally be (substantially) free of an anti-scattering compound.

Herein, unqualified references to a "resist composition", "resist coating", "resist material", "resist-coated material", etc. may relate to an eBeam resist composition, coating, material, or coated material of the invention, or may relate to an alternative resist composition, coating, material, or coated material, which may include eBeam resists excluded from the scope of the invention or non-eBeam resists (e.g. photoresists). Most preferably, an unqualified reference to a resist composition, coating, material, or coated material refers to an alternative resist, suitably a non-eBeam alternative resist, most suitably a photoresist. Such alternative resists are especially appropriate for pre-steps (i.e. before an eBeam resist composition of the invention is used or before a tool generated using an eBeam resist composition of the invention is used, e.g. a lithographic mask of the invention), repeat steps (e.g. when producing multi-layered substrate) where alternative resists may be used before or after using eBeam resists of the invention (lithographic masks obtained by using eBeam resists of the invention), or in lithographic steps involving lithographic masks (especially where said lithographic masks are themselves produced by the methods of the invention). In a particular embodiment a photomask, produced using the resists and electron beam exposure methods of the invention, may be employed in photolithography. Such use still takes advantage of the benefits afforded by the present invention since the photomasks may include ultra high-resolution detail not typically obtainable, thereby allowing for ultra high-resolution photolithography. Crucially, methods of the invention involve at least one step where an eBeam resist composition or coating of the invention is used or at least one step where a tool (e.g. lithographic mask) of the invention is used. However, such methods may involve a multiplicity of other steps which do not employ either the eBeam resist composition or coating of the invention nor a tool produced therefrom (e.g. integrated circuits may be produced using 100 s of steps, but such production will fall within the scope of the invention where resist compositions/coatings or tools of the invention are used in at least one step). It is well within the skilled person's common general knowledge to perform method steps using resists and lithographic masks outside the scope of the invention.

"Alternative resist compositions" and coatings may be produced and used in accordance with standard workshop techniques well known to those skilled in the art. They may also be used in the same manner as defined herein in relation to eBeam resist compositions and coatings of the invention (including methods of coating, exposing, developing, removing, etc.), though the skilled person could readily adapt the methods defined herein to suit the alternative resists in question.

Herein "an anti-scattering compound" (which may in some cases be a resist component in itself) within an eBeam resist composition suitably serves to temper and control the impact of incident radiation (and optionally also secondary electrons) on resist patterning. The anti-scattering compound is thought to help focus and direct incident radiation (and/or secondary electrons, where they are produced) to the desired exposure sites, to thereby minimize any undesired exposure. This in turn allows for a much sharper, higher resolution image to be patterned within the resists in question. Moreover, the anti-scattering compound can prevent or reduce over-exposure of certain vulnerable components within the resist, which may otherwise compromise subsequent developing of the exposed resist. The anti-scattering compound therefore allows reduced blurring; reduce proximity effects (i.e. spillage of energy to otherwise unexposed parts of the resist); increased resolution, and increased aspect ratio (where aspect ratio is the depth divided by the width of the relevant pattern lines, whether grooves or ridges). Where an anti-scattering compound is described as containing one or more complexes whose charges do not cancel (to give a neutral compound), the actual antiscattering compound is a suitable salt of the non-neutral combination of complexes (thus giving a neutral compound overall). The skilled person will well understand that any remaining charges will generally be neutralised by appropriate countercations or counteranions. As such, throughout this specification the antiscattering compounds, and indeed any complexes, may be defined without said counterions.

Herein, the term "developer-insoluble" is intended to denote that a given coating portion has a relatively lower solubility in a developer than corresponding "developer-soluble" coating portions. It does not necessarily exclude where "developer-insoluble" coating portions have partial or even full solubility (if development times were sufficiently long) in a developer. As will be appreciated by those skilled in the art, coating portions are differentially designated as "developer-soluble" and "developer-insoluble" to indicate that parts of the coating (e.g. radiation-exposed parts) have different solubility properties, and thus typically a different chemical nature, to other parts of the coating (e.g. non-radiation-exposed parts). The nature of the developer is immaterial since this can be judiciously selected, depending on which portions of coating are intended for removal, on the basis of the differential solubility properties of the respective coating portions. Generally speaking, the term "solubility", as used in the context of developing, relates to kinetic solubility rather than thermodynamic solubility, since the speed of solubilisation is key though thermodynamic solubility may correlate with kinetic solubility, as would be understood by the skilled person.

In general, use of the terms "(eBeam) resist coating" and "(electron beam) radiation" in methods of the invention denote that an eBeam resist coating of the invention and electron beam radiation is used in said method at least once, but that alternative resist coating(s) and alternative radiation may optionally be used instead in one, some, or all of any other steps (e.g. repeat steps and/or pre-steps). Where, as in some methods of the invention, reference is made to optional repeat steps or pre-steps that involve "performing steps (i) to (vi) of the method of performing electron beam lithography", in this context performance of the method of performing electron beam lithography may optionally exclusively involve alternative resist coatings and alternative radiation instead of eBeam resist coatings of the invention an electron beam radiation—i.e. in this context reference to the method of performing electron beam lithography is merely a shorthand for repeat or pre-steps that may involve either eBeam resists of the invention or alternative resists.

Unless stated otherwise, any reference herein to an "average" value is intended to relate to the mean value.

Herein, unless stated otherwise, the term "parts by weight" (pbw) when used in relation to multiple ingredients/components, refers to relative ratios between said multiple ingredients/components. Though in many embodiments the amounts of individual components within a composition may be given as a "wt %" value, in alternative embodiments any or all such wt % values may be converted to parts by weight to define a multi-component composition. This is so because the relative ratios between components is often more important than the absolute concentrations thereof. Where a composition comprising multiple ingredients is described in terms of parts by weight alone (i.e. to indicate only relative ratios of ingredients), it is not necessary to stipulate the absolute amounts or concentrations of said ingredients (whether in toto or individually) because the advantages of the invention stem from the relative ratios of the respective ingredients rather than their absolute quantities or concentrations. However, suitably, the resist composition comprises at least 1 wt % of all the stipulated ingredients combined (excluding any diluents/solvents), suitably at least 5 wt %, suitably at least 10 wt %, suitably at least 15 wt %. Suitably the resist composition comprises at most 50 wt % of all the stipulated ingredients combined (excluding any diluents/solvents), suitably at most 30 wt %, suitably at most 20 wt % thereof. The balance (i.e. the remainder of the resist composition not constituted by the stipulated ingredients, excluding diluents/solvents) may consist essentially of a diluent(s)/solvent(s).

Herein, references to a "complex", such as a metal complex (e.g. primary metal complex) or co-ordination complex, will be well understood by those skilled in the art (especially in inorganic chemistry). Herein, complexes generally involve one or more metal species (generally metal ions) co-ordinated to one or more ligands. Where a particular complex is defined by reference to a formula and/or a list of components, unless stated otherwise, suitably such a complex may include any salt, solvate, or hydrate thereof and may additionally or alternatively include one or more optional extra/terminal ligands, and/or one or more additional metal species. In most embodiments, any defined complex may suitably include a salt thereof (especially where the complex has a net charge). Suitably, however, such a complex may be (substantially) as specifically defined (notwithstanding the optional salt form), i.e. may exclude a solvate, hydrate, or complex with one or more optional extra/terminal ligands, and/or one or more additional metal species. Moreover, where a particular complex is defined by a formula and/or a list of components, and absolute or relative amounts of the individual species of the complex are given (e.g. whether by reference to stoichiometry or moles of a species per mole of complex), unless stated otherwise this may suitably include any variants in which the absolute or relative amounts of the individual species are within +/−10% of those stipulated, more suitably within +/−5%, more suitably within +/−1%, more suitably within +/−0.1%, though in preferred embodiments the complex, including any absolute or relative amounts of individual species of the complex, is (substantially) as defined.

Herein, an unspecified number of a plurality of species of type X (e.g. be it a metal species, a ligand species, etc.) may be referred to as $X_1, X_2, \ldots, X_n$, or in the context of a complex may be stipulated as $[X_1 X_2 \ldots X_n]$, where $X_1$ is the first species of type X, $X_2$ is the second species of type X, and $X_n$ is the nth species of type X (e.g. $X_3, X_4, \ldots$).

Herein, unless stated otherwise, all chemical nomenclature may be defined in accordance with IUPAC definitions.

In this specification the term "alkyl" includes both straight and branched chain alkyl groups. References to individual alkyl groups such as "propyl" are specific for the straight chain version only and references to individual branched chain alkyl groups such as "isopropyl" are specific for the branched chain version only. For example, "(1-6C)alkyl" includes (1-4C)alkyl, (1-3C)alkyl, propyl, isopropyl and t-butyl. A similar convention applies to other radicals, for example "phenyl(1-6C)alkyl" includes phenyl(1-4C)alkyl, benzyl, 1-phenylethyl and 2-phenylethyl.

The term "(m-nC)" or "(m-nC) group" used alone or as a prefix, refers to any group having m to n carbon atoms. In embodiments stipulating a value for n that is greater than or equal to 6, n may optionally be a smaller number, for instance n may be 2, 4, or 5.

An "alkylene," "alkenylene," or "alkynylene" group is an alkyl, alkenyl, or alkynyl group that is positioned between and serves to connect two other chemical groups. Thus, "(1-6C)alkylene" means a linear saturated divalent hydrocarbon radical of one to six carbon atoms or a branched saturated divalent hydrocarbon radical of three to six carbon atoms, for example, methylene, ethylene, propylene, 2-methylpropylene, pentylene, and the like.

"(2-6C)alkenylene" means a linear divalent hydrocarbon radical of two to six carbon atoms or a branched divalent hydrocarbon radical of three to six carbon atoms, containing at least one double bond, for example, as in ethenylene, 2,4-pentadienylene, and the like.

"(2-6C)alkynylene" means a linear divalent hydrocarbon radical of two to six carbon atoms or a branched divalent hydrocarbon radical of three to six carbon atoms, containing at least one triple bond, for example, as in ethynylene, propynylene, and butynylene and the like.

"(3-8C)cycloalkyl" means a hydrocarbon ring containing from 3 to 8 carbon atoms, for example, cyclopropyl, cyclobutyl, cyclopentyl, cyclohexyl, cycloheptyl or bicyclo[2.2.1]heptyl.

"(3-8C)cycloalkenyl" means a hydrocarbon ring containing at least one double bond, for example, cyclobutenyl, cyclopentenyl, cyclohexenyl or cycloheptenyl, such as 3-cyclohexen-1-yl, or cyclooctenyl.

"(3-8C)cycloalkyl-(1-6C)alkylene" means a (3-8C)cycloalkyl group covalently attached to a (1-6C)alkylene group, both of which are defined herein.

The term "halo" refers to fluoro, chloro, bromo and iodo.

The term "heterocyclyl", "heterocyclic" or "heterocycle" means a non-aromatic saturated or partially saturated monocyclic, fused, bridged, or Spiro bicyclic heterocyclic ring system(s). The term heterocyclyl includes both monovalent species and divalent species. Monocyclic heterocyclic rings contain from about 3 to 12 (suitably from 3 to 7) ring atoms, with from 1 to 5 (suitably 1, 2 or 3) heteroatoms selected from nitrogen, oxygen or sulfur in the ring. Bicyclic heterocycles contain from 7 to 17 member atoms, suitably 7 to 12 member atoms, in the ring. Bicyclic heterocycles contain from about 7 to about 17 ring atoms, suitably from 7 to 12 ring atoms. Bicyclic heterocyclic(s) rings may be fused, spiro, or bridged ring systems. Examples of heterocyclic groups include cyclic ethers such as oxiranyl, oxetanyl, tetrahydrofuranyl, dioxanyl, and substituted cyclic ethers. Heterocycles containing nitrogen include, for example, azetidinyl, pyrrolidinyl, piperidinyl, piperazinyl, tetrahydrotriazinyl, tetrahydropyrazolyl, and the like. Typical sulfur containing heterocycles include tetrahydrothienyl, dihydro-1,3-dithiol, tetrahydro-2H-thiopyran, and hexahydrothiepine. Other heterocycles include dihydro-oxathiolyl, tetrahydro-oxazolyl, tetrahydro-oxadiazolyl, tetrahydrodioxazolyl, tetrahydro-oxathiazolyl, hexahydrotriazinyl, tetrahydro-oxazinyl, morpholinyl, thiomorpholinyl, tetrahydropyrimidinyl, dioxolinyl, octahydrobenzofuranyl, octahydrobenzimidazolyl, and octahydrobenzothiazolyl. For heterocycles containing sulfur, the oxidized sulfur heterocycles containing SO or $SO_2$ groups are also included. Examples include the sulfoxide and sulfone forms of tetrahydrothienyl and thiomorpholinyl such as tetrahydrothiene 1,1-dioxide and thiomorpholinyl 1,1-dioxide. A suitable value for a heterocyclyl group which bears 1 or 2 oxo (=O) or thioxo (=S) substituents is, for example, 2-oxopyrrolidinyl, 2-thioxopyrrolidinyl, 2-oxoimidazolidinyl, 2-thioxoimidazolidinyl, 2-oxopiperidinyl, 2,5-dioxopyrrolidinyl, 2,5-dioxoimidazolidinyl or 2,6-dioxopiperidinyl. Particular heterocyclyl groups are saturated monocyclic 3 to 7 membered heterocyclyls containing 1, 2 or 3 heteroatoms selected from nitrogen, oxygen or sulfur, for example azetidinyl, tetrahydrofuranyl, tetrahydropyranyl, pyrrolidinyl, morpholinyl, tetrahydrothienyl, tetrahydrothienyl 1,1-dioxide, thiomorpholinyl, thiomorpholinyl 1,1-dioxide, piperidinyl, homopiperidinyl, piperazinyl or homopiperazinyl. As the skilled person would appreciate, any heterocycle may be linked to another group via any suitable atom, such as via a carbon or nitrogen atom. However, reference herein to piperidino or morpholino refers to a piperidin-1-yl or morpholin-4-yl ring that is linked via the ring nitrogen.

By "bridged ring systems" is meant ring systems in which two rings share more than two atoms, see for example *Advanced Organic Chemistry*, by Jerry March, 4th Edition, Wiley Interscience, pages 131-133, 1992. Examples of bridged heterocyclyl ring systems include, aza-bicyclo[2.2.1]heptane, 2-oxa-5-azabicyclo[2.2.1]heptane, aza-bicyclo[2.2.2]octane, aza-bicyclo[3.2.1]octane and quinuclidine.

"Heterocyclyl(1-6C)alkyl" means a heterocyclyl group covalently attached to a (1-6C)alkylene group, both of which are defined herein.

The term "heteroaryl" or "heteroaromatic" means an aromatic mono-, bi-, or polycyclic ring incorporating one or more (for example 1-4, particularly 1, 2 or 3) heteroatoms selected from nitrogen, oxygen or sulfur. The term heteroaryl includes both monovalent species and divalent species. Examples of heteroaryl groups are monocyclic and bicyclic groups containing from five to twelve ring members, and more usually from five to ten ring members. The heteroaryl group can be, for example, a 5- or 6-membered monocyclic ring or a 9- or 10-membered bicyclic ring, for example a bicyclic structure formed from fused five and six membered rings or two fused six membered rings. Each ring may contain up to about four heteroatoms typically selected from nitrogen, sulfur and oxygen. Typically the heteroaryl ring will contain up to 3 heteroatoms, more usually up to 2, for example a single heteroatom. In one embodiment, the heteroaryl ring contains at least one ring nitrogen atom. The nitrogen atoms in the heteroaryl rings can be basic, as in the case of an imidazole or pyridine, or essentially non-basic as in the case of an indole or pyrrole nitrogen. In general the number of basic nitrogen atoms present in the heteroaryl group, including any amino group substituents of the ring, will be less than five.

Examples of heteroaryl include furyl, pyrrolyl, thienyl, oxazolyl, isoxazolyl, imidazolyl, pyrazolyl, thiazolyl, isothiazolyl, oxadiazolyl, thiadiazolyl, triazolyl, tetrazolyl, pyridyl, pyridazinyl, pyrimidinyl, pyrazinyl, 1,3,5-triazenyl, benzofuranyl, indolyl, isoindolyl, benzothienyl, benzoxazolyl, benzimidazolyl, benzothiazolyl, benzothiazolyl, indazolyl, purinyl, benzofurazanyl, quinolyl, isoquinolyl, quinazolinyl, quinoxalinyl, cinnolinyl, pteridinyl, naphthyridinyl, carbazolyl, phenazinyl, benzisoquinolinyl, pyridopyrazinyl, thieno[2,3-b]furanyl, 2H-furo[3,2-b]-pyranyl, 5H-pyrido[2,3-d]-o-oxazinyl, 1H-pyrazolo[4,3-d]-oxazolyl, 4H-imidazo[4,5-d]thiazolyl, pyrazino[2,3-d]pyridazinyl, imidazo[2,1-b]thiazolyl, imidazo[1,2-b][1,2,4]triazinyl. "Heteroaryl" also covers partially aromatic bi- or polycyclic ring systems wherein at least one ring is an aromatic ring and one or more of the other ring(s) is a non-aromatic, saturated or partially saturated ring, provided at least one ring contains one or more heteroatoms selected from nitrogen, oxygen or sulfur. Examples of partially aromatic heteroaryl groups include for example, tetrahydroisoquinolinyl, tetrahydroquinolinyl, 2-oxo-1,2,3,4-tetrahydroquinolinyl, dihydrobenzthienyl, dihydrobenzfuranyl, 2,3-dihydro-benzo[1,4]dioxinyl, benzo[1,3]dioxolyl, 2,2-dioxo-1,3-dihydro-2-benzothienyl, 4,5,6,7-tetrahydrobenzofuranyl, indolinyl, 1,2,3,4-tetrahydro-1,8-naphthyridinyl, 1,2,3,4-tetrahydro-pyrido[2,3-b]pyrazinyl and 3,4-dihydro-2H-pyrido[3,2-b][1,4]oxazinyl Examples of five membered heteroaryl groups include but are not limited to pyrrolyl, furanyl, thienyl, imidazolyl, furazanyl, oxazolyl, oxadiazolyl, oxatriazolyl, isoxazolyl, thiazolyl, isothiazolyl, pyrazolyl, triazolyl and tetrazolyl groups.

Examples of six membered heteroaryl groups include but are not limited to pyridyl, pyrazinyl, pyridazinyl, pyrimidinyl and triazinyl.

A bicyclic heteroaryl group may be, for example, a group selected from:

a benzene ring fused to a 5- or 6-membered ring containing 1, 2 or 3 ring heteroatoms;

a pyridine ring fused to a 5- or 6-membered ring containing 1, 2 or 3 ring heteroatoms;

a pyrimidine ring fused to a 5- or 6-membered ring containing 1 or 2 ring heteroatoms;

a pyrrole ring fused to a 5- or 6-membered ring containing 1, 2 or 3 ring heteroatoms;

a pyrazole ring fused to a 5- or 6-membered ring containing 1 or 2 ring heteroatoms;

a pyrazine ring fused to a 5- or 6-membered ring containing 1 or 2 ring heteroatoms;

an imidazole ring fused to a 5- or 6-membered ring containing 1 or 2 ring heteroatoms;

an oxazole ring fused to a 5- or 6-membered ring containing 1 or 2 ring heteroatoms;

an isoxazole ring fused to a 5- or 6-membered ring containing 1 or 2 ring heteroatoms;

a thiazole ring fused to a 5- or 6-membered ring containing 1 or 2 ring heteroatoms;

an isothiazole ring fused to a 5- or 6-membered ring containing 1 or 2 ring heteroatoms;

a thiophene ring fused to a 5- or 6-membered ring containing 1, 2 or 3 ring heteroatoms;

a furan ring fused to a 5- or 6-membered ring containing 1, 2 or 3 ring heteroatoms;

a cyclohexyl ring fused to a 5- or 6-membered heteroaromatic ring containing 1, 2 or 3 ring heteroatoms; and a cyclopentyl ring fused to a 5- or 6-membered heteroaromatic ring containing 1, 2 or 3 ring heteroatoms.

Particular examples of bicyclic heteroaryl groups containing a six membered ring fused to a five membered ring include but are not limited to benzfuranyl, benzthiophenyl, benzimidazolyl, benzoxazolyl, benzisoxazolyl, benzthiazolyl, benzisothiazolyl, isobenzofuranyl, indolyl, isoindolyl, indolizinyl, indolinyl, isoindolinyl, purinyl (e.g., adeninyl, guaninyl), indazolyl, benzodioxolyl and pyrazolopyridinyl groups.

Particular examples of bicyclic heteroaryl groups containing two fused six membered rings include but are not limited to quinolinyl, isoquinolinyl, chromanyl, thiochromanyl, chromenyl, isochromenyl, chromanyl, isochromanyl, benzodioxanyl, quinolizinyl, benzoxazinyl, benzodiazinyl, pyridopyridinyl, quinoxalinyl, quinazolinyl, cinnolinyl, phthalazinyl, naphthyridinyl and pteridinyl groups.

"Heteroaryl(1-6C)alkyl" means a heteroaryl group covalently attached to a (1-6C)alkylene group, both of which are defined herein. Examples of heteroaralkyl groups include pyridin-3-ylmethyl, 3-(benzofuran-2-yl)propyl, and the like.

The term "aryl" means a cyclic or polycyclic aromatic ring having from 5 to 12 carbon atoms. The term aryl includes both monovalent species and divalent species. Examples of aryl groups include, but are not limited to, phenyl, biphenyl, naphthyl and the like. In particular embodiment, an aryl is phenyl.

The term "aryl(1-6C)alkyl" means an aryl group covalently attached to a (1-6C)alkylene group, both of which are defined herein. Examples of aryl-(1-6C)alkyl groups include benzyl, phenylethyl, and the like.

This specification also makes use of several composite terms to describe groups comprising more than one functionality. Such terms will be understood by a person skilled in the art. For example heterocyclyl(m-nC)alkyl comprises (m-nC)alkyl substituted by heterocyclyl.

The term "optionally substituted" refers to either groups, structures, or molecules that are substituted and those that are not substituted.

Where optional substituents are chosen from "one or more" groups it is to be understood that this definition includes all substituents being chosen from one of the specified groups or the substituents being chosen from two or more of the specified groups. Suitably examples for optional substituents include, though are not necessarily limited to, halide, amino, cyano, imino, enamino, (1-6C)alkylamino, di-[(1-6C)alkyl]amino, tri-[(1-6C)alkyl]amino, oxo, oxide, hydroxide (OH⁻), (1-6C)alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C)alkylthio, (2-6C)alkenylthio, (2-6C)alkynylthio, thiocarbonyl, heterocyclyl containing at least one internal heteroatom selected from nitrogen, oxygen or sulphur, heteroaryl containing at least one internal hetero atom selected from nitrogen, oxygen or sulphur (e.g. pyridyl), or (where appropriate); wherein any CH, $CH_2$, or $CH_3$ is optionally substituted.

Unless stated otherwise, references herein to a "pKa" should be construed as a pKa value in water at standard ambient temperature and pressure (SATP), suitably of the conjugate acid of the relevant species.

Herein, the term "carbocyclyl", "carbocycle" or "carbocyclic" refers to a radical of a non-aromatic cyclic hydrocarbon group, generally having from 3 to 10 ring carbon atoms (i.e. (3-10C)carbocyclyl) and zero heteroatoms in the non-aromatic ring system. Suitably, carbocyclyl groups include (3-nC)cycloalkyl and (3-nC)cycloalkenyl. Exemplary embodiments include: cyclobutyl, cyclobutenyl, cyclopentyl, cyclopentenyl, cyclohexyl, cyclohexenyl, cyclohexadienyl, cycloheptyl, cycloheptenyl, cycloheptadienyl, cycloheptatrienyl, cyclooctyl, cyclooctenyl, bicyclo [2.2.1]heptanyl, bicyclo[2.2.2]octanyl, and the like.

Herein, the term "macrocyclyl", "macrocycle" or "macrocyclic" refers to macrocyclic rings, which are well known in the art. Such macrocycicic rings are suitably cyclic macromolecules or a macromolecular cyclic portions of a molecule. Suitably a macrocyclic ring has nine or more atoms within the ring. Suitably a macrocyclic ring has three or more internal electron-pair donating atoms. A macrocyclic ring is suitably a cyclic molecule able to co-ordinate to a central metal species (e.g. $Mg^{2+}$). Examples include porphyrins.

Herein, the term "hydrocarbyl" general refers any aliphatic, acyclic, or cyclic (including aryl) hydrocarbon group, suitably with no heteroatoms.

Herein, a "co-ordinating moiety" is suitably an atom or moiety which is capable of co-ordinating, suitably through dative bonding, with an otherwise separate atom, molecule, ion, or complex. Suitably a co-ordinating moiety is capable of accepting or donating one or more lone pair of electrons, though suitably a co-ordinating moiety is not capable of both accepting and donating.

Herein, a "polymetallic" system (e.g. a polymetallic cage) simply means a system (or complex) having more than one metal atom/ion therein, which may be the same or different (in terms of metal element, oxidation state, etc.). For instance, a metal complex comprising eight Cr(III) ions is polymetallic, as is a metal complex comprising seven Cr(III) ions and one Ni(II) ion. Polymetallic systems, such as a polymetallic cages, may be either homometallic (e.g. where all metal species are derived of the same metal element, even if some metal species have a different oxidation state to another) or heterometallic (e.g. where the metal species are a mixture of different metal species derived from a different metal element, whether or not the different metal species have the same or a different oxidation state). Most suitably, all the metal species of a homometallic complex are of the same oxidation state, though they may also have different oxidation states. Most suitably, different metal species within a heterometallic complex have a different oxidation state, though they may also have the same oxidation state.

Herein, a "secondary electron generator" is a component which releases secondary electrons following irradiation, suitably with ionizing radiation. In a particular embodiment, the secondary electron generator releases electrons when exposed to an electron beam.

Herein, the "effective atomic number ($Z_{eff}$)" of a compound is the average atomic number obtained from a weighted summation of the atomic constituents of a compound.

Though the skilled person will be aware of a variety of ways to calculate and/or measure $Z_{eff}$ (e.g. F. W. Spiers, *Effective Atomic Number and Energy Absorption in Tissues*, Br. J. radiol., 19, 52, 1946), for the purpose of the present invention "effective atomic number ($Z_{eff}$)" is suitably calculated as a simple mass-weighted average, suitably using the formula:

$$Z_{eff} = \Sigma \alpha_i Z_i$$

where $Z_i$ is the atomic number of the ith element in the compound, and $\alpha_i$ is the fraction of the sum total of the atomic numbers of all atoms in the compound (i.e. the total number of protons in the compound) constituted by said ith element. This formula may otherwise be expressed as:

$$Z_{eff} = \alpha_1 Z_1 + \alpha_2 Z_2 + \ldots (+\alpha_n Z_n)$$

for a compound comprising n elements.

This is similar to the Spiers equation (F. W. Spiers, *Effective Atomic Number and Energy Absorption in Tissues*, Br. J. radiol., 19, 52, 1946) but without the exponents used by Spiers. The Spiers equation states $Z_{eff}$ as follows:

$$Z_{eff}{}^p = \Sigma a_i Z_i{}^p$$

where the exponent p is suitably approximately 3 (e.g. p=2.94). Though in certain embodiments, this Spiers definition (especially with p=2.94) of $Z_{eff}$ may be used, and any preferred, optional, and suitable values of $Z_{eff}$ disclosed herein may equally apply to the Spiers definition, preferably the above mentioned simple mass-weighted average definition of $Z_{eff}$ should be used.

The anti-scattering compound may suitably be or comprise a compound having an effective atomic number ($Z_{eff}$) less than or equal to 10 (optionally when the effective atomic number calculation excludes any solvates having a boiling point less than or equal to 150° C. at 100 kPa pressure). By way of example, the $Z_{eff}$ of PMMA (or methylmethacrylate) is approximately ~5.85. Likewise, though not generally relevant to the present invention, the effective atomic number of compound mixtures or compositions may also be calculated by including weighted averages of the respective components thereof. The skilled person is perfectly capable of calculating the effective atomic number ($Z_{eff}$) for all compounds and compositions.

Co-pending application PCT/GB2015/050884 (filed on 24 Mar. 2015 by the same Applicants as the present application), which is hereby incorporated by reference, describes in detail how $Z_{eff}$ may be calculated. For the purpose of the present invention, wherever an anti-scattering agent/compound/complex is associated with a secondary electron generator, whether as part of the same composition or event as part of the same complex, suitably their respective $Z_{eff}$ values are treated separately. Suitably the anti-scattering agent has very different $Z_{eff}$ and indeed density properties to any corresponding secondary electron generator, though the combination can be mutually complementary. However, for the purposes of definitions, it may be important to segregate parameters such as $Z_{eff}$, density, and such like, especially where ideal values and trends run in opposing directions.

Wherever groups with large carbon chains are disclosed (e.g. (1-12C)alkyl, (1-8C)alkenyl, etc.), such groups may optionally be shorted, for instance containing a between 1 and 5 carbons (e.g. (1-5C)alkyl or (1-5C)alkenyl), or contain between 1 and 3 carbons (e.g. (1-3C)alkyl or (1-3C)alkenyl instead of (1-12C)alkyl or (1-8C)alkenyl).

Herein, unless stated otherwise, the weight percentage (wt %) of any given component within a composition suitably means the percentage by weight of said component based on the overall weight of the composition.

Herein, the term "consist essentially of", when used to describe the proportion of a given ingredient within a material, suitably means the material comprises at least 70 wt % of the given ingredient, more suitably at least 80 wt %, more suitably at least 90 wt %, more suitably at least 95 wt %, and most suitably at least 99 wt %.

Herein, the term "hydrocarbyl" refers to any hydrocarbon radical, including but not limited to alkyl, alkenyl, alkynyl, aryl.

When stipulated herein (usually in relation to Lewis acidic species), references to a metal atom, species, complex, or compound may include a boron and/or silicon metal atom, species, complex, or compound, even though boron and silicon are not strictly metal species as such. However, such metal atoms, species, complexes, or compounds may exclude corresponding boron and/or silicon atoms, species, complexes, or compounds.

General Methodology and Advantages of the Invention

The present invention provides resist compositions, such as eBeam resist compositions (whether positive or negative tone resist), which provide access to enhanced quality resist patterns deployable in the production of high-precision, high-specification electronic components (e.g. as per those present in integrated circuits). In particular, the quality and resolution of the imaged resist patterns facilitates production of extremely high quality, high resolution electronic components and integrated circuits, which in turn allows the size of integrated circuits to be reduced yet further. This in turn paves the way to even faster microprocessors and microprocessors that can operate within low-power mobile devices.

The deliberate inclusion of an anti-scattering compound within an eBeam resist composition prevents, inhibits, or reduces the generation of secondary electrons. In so doing, proximity effects and blurring are minimised, thus allowing for higher resolution patterning. It also permits the use of very thin resist film layers.

This disclosure equips the skilled person to judiciously select appropriate resist compositions and methodologies to optimise the ultimate product. The examples and data provided herein, in conjunction with the validated predictive models, provide a highly credible demonstration of the broad applicability of the invention to a range of resist compositions.

The technology of the present invention may be adapted for use with either positive or negative tone resists since, generally speaking, a positive resist can be modified to produce a negative resist by techniques well known in the art (e.g. adding a cross-linking agent).

eBeam Resist Composition

The present invention provides an eBeam resist composition as defined herein, which suitably comprises an anti-scattering compound (suitably as defined herein). The eBeam resist composition may comprise one or more anti-scattering compounds as defined herein, in various ratios.

The eBeam resist composition is an electron beam resist composition (i.e. "eBeam resist").

The anti-scattering compound suitably functions as an electron control agent, which focuses primary electrons (from electron beams) towards their target, suitably whilst minimising proximity effects and/or blurring, suitably whilst minimising generation of secondary electrons.

Suitably the anti-scattering compound causes minimal forward- or back-scattering of electrons when exposed to electron beam radiation.

The eBeam resist composition may optionally comprise a base polymeric component (or a resist polymer) as defined herein. Such a base polymeric component may be any suitable resist polymer, especially a resist polymer suitable for use in electron beam lithography (e.g. poly(methylmethacrylate—PMMA). In such embodiments, the eBeam resist composition suitably comprises at least 1 pbw (parts by weight) anti-scattering compound per 100 pbw of any base polymeric component (i.e. greater than or equal to 1 pbw anti-scattering compound per 100 pbw resist polymer), suitably at least 2 pbw, suitably at least 10 pbw, suitably at least 20 pbw, suitably at least 50 pbw. However, suitably the anti-scattering compound may itself serve as a resist material, especially where the exposure radiation is an electron beam. As such, the eBeam resist composition may comprise the anti-scattering agent as the sole resist material, the predominant resist material (i.e. greater than 50 wt % of the overall eBeam resist composition excluding any diluents).

Suitably the eBeam resist composition (e.g. pre-coating) comprises a diluent or solvent. Suitably the eBeam resist composition comprises between 20 and 99 wt % solvent, suitably between 50 and 97 wt %, more suitably between 80 and 95 wt % solvent. As such, the eBeam resist composition suitably comprises between 1 and 80 wt % non-solvent components, suitably between 3 and 50 wt % non-solvent components, more suitably between 5 and 20 wt % non-solvent components. Suitably the eBeam resist composition is a solution, suitably which is free of any dispersed or suspended particulate matter. Suitably the eBeam resist composition is suitable for spinning onto a surface, suitably to provide a (substantially) homogeneous coating on said surface. Suitably the eBeam resist composition is (substantially) free of any particulate matter. Suitably the eBeam resist composition is (substantially) free of any nanoparticles, especially free of any metal(0) nanoparticles or metal-containing nanoparticles.

The eBeam resist composition may comprise a secondary electron generator. Such a secondary electron generator is described hereinbelow, and also in co-pending application PCT/GB2015/050884 (filed on 24 Mar. 2015 by the same Applicants as the present application), which is hereby incorporated by reference. Suitably any such secondary electron generator is bonded (whether datively, covalently, or ionically) to the antiscattering compound/complex or to a part thereof.

The eBeam resist composition may comprise a scattering compound, which is capable of scattering secondary electrons following irradiation with an incident eBeam but which does not (to any significant extent) amplify secondary electrons. Suitably any such scattering compound is bonded (whether datively, covalently, or ionically) to the antiscattering compound/complex or to a part thereof.

In an embodiment, the eBeam resist composition comprises both a secondary electron generator and a scattering compound, and suitably both are bonded to the antiscattering compound or to a part thereof.

The eBeam resist composition may comprise one or more optional additional components.

In a particular embodiment, the eBeam resist composition comprises:
100 pbw anti-scattering compound; and
0-10000 pbw base polymeric component.
(This can also be expressed as a weight ratio of 100:0-10000 of the respective compounds, or otherwise 100:0 to 1:100 and all intermediate compositions).

The eBeam resist composition may be a negative tone eBeam resist composition or a positive tone eBeam resist composition. Where an eBeam resist composition comprises a resist polymer, a negative eBeam resist composition will generally further comprise a negative resist agent, such as a cross-linking agent, suitably to facilitate effective curing of radiation-exposed part(s) of the negative eBeam resist composition, or a coating thereof (e.g. suitably to render the radiation-exposed part(s) (substantially) insoluble in a developing medium, i.e. developer-insoluble). Where an eBeam resist composition comprises a resist polymer, a positive eBeam resist composition, on the other hand, may suitably lack a negative resist agent, suitably so that radiation-exposed portions of the positive eBeam resist composition, or a coating thereof, are (substantially) soluble in a developing medium (i.e. developer-soluble). However, since the anti-scattering compound may itself serve as a resist material (optionally in place of some or all of any resist polymer(s)), the eBeam resist composition may be a negative tone eBeam resist composition. The above references to negative or positive tone resist suitable specifically relate to their behaviour in electron beam lithography.

In a particular embodiment, the eBeam resist composition is a negative eBeam resist composition, which may comprise a cross-linking agent (especially where a resist polymer is additionally present) or may be free of cross-linking agent (especially where there is little or substantially no resist polymer present). Suitably radiation-exposed part(s) of the negative eBeam resist composition, or a coating thereof, become relatively insoluble in a developing medium (i.e. developer-insoluble), as compared to radiation-unexposed part(s) thereof (i.e. which are developer-soluble).

In a particular embodiment, the eBeam resist composition is a positive eBeam resist composition, suitably which is (substantially) free of a cross-linking agent (especially where a sufficient amount of resist polymer is present), suitably (substantially) free of any cross-linking agent(s) defined in relation to a negative eBeam resist composition. Suitably radiation-exposed part(s) of the positive eBeam resist composition, or a coating thereof, become relatively soluble (i.e. developer-soluble) in a developing medium, as compared to radiation-unexposed part(s) thereof (i.e. which are developer-insoluble). In a particular embodiment, the resist composition is a positive resist composition where the composition comprises greater than or equal to 70 wt % of a positive tone resist polymer.

Anti-Scattering Compound

The anti-scattering compound suitably controls the flow and/or scattering of electrons, especially secondary electrons (but also suitably primary electrons, especially where eBeam radiation is used), when an eBeam resist composition or coating thereof is exposed to radiation. Such control can advantageously limit deleterious effects caused by uncontrolled flow and/or scattering of electrons. Suitably scattering of primary electrons is almost zero for incident electron beams of 2 KeV and above.

Though not wishing to be bound by theory, it is thought that the anti-scattering compound of the invention may serve to channel or otherwise guide electrons to maximize the transformative impact (i.e. transformation of the resist component and optionally other relevant ingredients, e.g. cross-linker) at irradiated part(s) of an eBeam resist composition (or a coating thereof) and minimize the transformative impact at neighbouring non-irradiated part(s)—i.e. making exposure more selective. This serves to increase the resolution and consistency of the patterning process. The anti-scattering compound may also dampen or quench (partially or completely) primary and/or secondary electrons so as to inhibit over-reaction or deleterious damage to the resist or the underlying substrate.

Suitably, one or more components (especially complex(es), for example, polymetallic cages and/or polymetallic ring systems) of the anti-scattering compound has a molecular structure with a significant amount of free internal space. Suitably the anti-scattering compound as a whole (in view of the arrangement of the individual components thereof—e.g. an association of a plurality of metal cages or rings optionally arranged around a common hub or one or more linker components) has a structure with a significant amount of internal free internal space. Without wishing to be bound by theory, it is thought that such free empty space is a key contributor to the advantageous properties of the anti-scattering compound, and helps to minimise primary electron scattering and/or secondary electron generation. As such, the anti-scattering compound suitably has a high mean free path (λ)—i.e. the distance between successive electron collisions is high. Suitably the anti-scattering compound has a low scattering cross-section (σ)—i.e. the chances of a collision are low.

Though metal organic frameworks (MOFs), well known in the art for their porous open (suitably 3-dimensional) crystal structures, can provide compounds and complexes with a significant amount of free empty space (typically used in practice for the absorption of gases), the anti-scattering compound, especially when a part of an eBeam resist coating (i.e. pre-exposed), is most suitably (substantially) non-crystalline and/or does not form 3-dimensional crystal/lattice structures. Such a lack of propensity to form 3-dimensional crystalline structures may indicate that the anti-scattering compound has more suitable solubility properties thereby enabling more uniform coating (e.g. spin-coating) of the eBeam resist composition. As such, most suitably the anti-scattering compound is not a metal-organic framework (MOF). Suitably, the anti-scattering compound is (substantially) non-porous.

The anti-scattering compound is suitably self-sacrificial, thereby selectively absorbing the impact of electrons. In this manner, the anti-scattering compound may sacrificially absorb the impact, optionally instead of another resist component (e.g. polymeric component). The anti-scattering compound may itself serve as a resist component (optionally the sole resist component), for example, whose developer-solubility properties change following exposure to radiation (especially eBeam radiation).

Suitably, the anti-scattering compound has a density less than or equal to 1.5 g/cm$^3$, suitably less than 1.3 g/cm$^3$, suitably less than or equal to 1.2 g/cm$^3$, suitably less than or equal to 0.95 g/cm$^3$, suitably less than or equal to 0.9 g/cm$^3$, suitably less than or equal to 0.85 g/cm$^3$, suitably less than or equal to 0.8 g/cm$^3$, suitably less than or equal to 0.7 g/cm$^3$. Suitably the anti-scattering compound has a density greater than or equal to 0.4 g/cm$^3$, suitably greater than or equal to 0.5 g/cm$^3$, suitably greater than or equal to 0.55 g/cm$^3$, suitably greater than or equal to 0.6 g/cm$^3$. In a particular embodiment, the anti-scattering compound has a density between 0.6 g/cm$^3$ and 0.85 g/cm$^3$. In a particular embodiment, the anti-scattering compound has a density less than or equal to 1.2 g/cm$^3$.

Suitably, the anti-scattering compound has a molecular weight greater than or equal to 2000 g/mol, suitably greater than or equal to 5000 g/mol, suitably greater than or equal to 10,000 g/mol, suitably greater than or equal to 15,000 g/mol. Suitably, the anti-scattering compound has a molecular weight less than or equal to 300,000 g/mol, suitably less than or equal to 200,000 g/mol, suitably less than or equal to 100,000 g/mol, suitably less than or equal to 50,000 g/mol, suitably less than or equal to 20,000 g/mol.

Suitably, the anti-scattering compound (substantially) does not generate secondary electrons, as ionization products, in response to exposure to primary radiation. The primary radiation is suitably an electron beam or electromagnetic radiation.

The anti-scattering compound is suitably a metal-organic complex. Suitably the anti-scattering compound is a polymetallic compound. The anti-scattering compound suitably does not comprise an elemental metal (i.e. metal(0)). Suitably any metal species of the anti-scattering compound are metal ions.

The anti-scattering compound suitably comprises a primary metal complex (PMC). Suitably the primary metal complex is defined as set forth herein, and is suitably a metal cage, most suitably a polymetallic cage (suitably with at least one trivalent metal species and at least one divalent metal species, though in certain embodiments all metal species may be trivalent, whether all trivalent metal species are derived from the same or a different metal element). Metal cages may include those disclosed in or similar to those disclosed in G. F. S. Whitehead, F. Moro, G. A. Timco, W. Wernsdorfer, S. J. Teat and R. E. P. Winpenny, "A Ring of Rings and Other Multicomponent Assemblies of Clusters", Angew. Chem. Int. Ed., 2013, 52, 9932-9935. In some embodiments, the polymetallic cage is homometallic. In preferred embodiments, the polymetallic cage is heterometallic (i.e. having two or more, most suitably exactly two, different metal elements).

The primary metal complex may be neutral or charged (whether positively or negatively). The anti-scattering compound may, especially where the primary metal complex is charged, comprise one or more counterions (e.g. $C^1$, $C^2$, ... $C^c$), suitably as defined herein, suitably associated with the primary metal complex as part of a primary metal complex salt. As such, the anti-scattering compound may be defined by, or may comprise units defined by, a primary metal complex salt of Formula A:

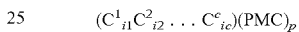

wherein PMC is a primary metal complex, suitably as defined herein, and p is the relative stoichiometry of PMC in Formula A or p is the number of moles of PMC per mole of Formula A; and wherein $C^1$ is a first counterion, $C^2$ is a second counterion, and $C^c$ is a cth counterion, suitably as defined herein, wherein i1, i2, and ic, is the relative respective stoichiometry of each of $C^1$, $C^2$, ..., and $C^c$ in Formula A or i1, i2, and ic, are the respective number of moles of each of $C^1$, $C^2$, ..., and $C^c$ per mole of Formula A.

p may have any suitable value, and is preferably a non-zero integer. p may suitably be a value (suitably an integer) between 1 and 6.

In preferred embodiments, there are either no counterion species (i.e. i1, i2, and ic, are all zero) associated with the primary metal complex or the primary metal complex is associated with (i.e. the primary metal complex salt comprises) only a single (type of) counterion species (i.e. i1 is non-zero but i2, and ic are zero). Suitably the stoichiometry or relative number of moles of PMC and counterion(s) is such that the resulting primary metal complex salt is neutral. However, the presence of additional charged components (e.g. linker components—see below) within the anti-scattering compound may mean the primary metal complex salt need not be neutral.

The anti-scattering compound suitably comprises a linker component (or one or more linker components), suitably associated with (e.g. electrostatically and/or covalently, most suitably at least partially covalently) one or more, preferably two or more primary metal complexes. Suitably the linker component(s) is defined as set forth herein, and is suitably a complex or compound capable of co-ordinating with (i.e. forming dative bonds with) one or more (preferably two or more) primary metal complexes. The complex resulting from one or more linker component(s) being associated with one or more primary metal complex(es) may be termed a "hybrid complex".

The anti-scattering compound may be defined by, or may comprise units defined by, a hybrid complex of Formula B:

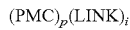

wherein PMC is a primary metal complex, suitably as defined herein, and p is the relative stoichiometry of PMC in Formula B or p is the number of moles of PMC per mole of Formula B; and wherein LINK is a linker component, suitably as defined herein, and l is the relative stoichiometry of LINK in Formula B or l is the number of moles of LINK per mole of Formula B.

p may have any suitable value, and is preferably a non-zero integer. p may suitably be a value (suitably an integer) between 1 and 120 (where 120 is the theoretical limit), suitably between 1 and 48. p may suitably be a value (suitably an integer) between 1 and 30, suitably between 2 and 24, more suitably between 2 and 8, suitably between 4 and 6. Most suitably p is an even integer (especially 2, 4, or 6).

l may have any suitable value (including 0), and is suitably zero or a non-zero integer, most suitably a non-zero integer. l may suitably be a value (suitably an integer) between 0 and 10, suitably between 0 and 2, more suitably 0 or 1, most suitably 1.

The primary metal complex (e.g. PMC) and/or the linker component (e.g. LINK) may be neutral or charged (whether positively or negatively). Where both are present, both the primary metal complex and the linker component may be charged and, in some embodiments, each may have charges of opposing polarity (i.e. one being negatively charged, the other being positively charged, and potentially thereby electrostatically associated with one another in addition to any dative/covalent interactions therebetween). If the primary metal complex(es) have charges of opposing polarities to the linker component(s), the overall charges of these species within the anti-scattering compound may be zero (i.e. the charges may neutralise one another to give a compound or unit of Formula A having no net charge). Alternatively, the anti-scattering compound may, especially where a hybrid complex has a net charge (i.e. is non-neutral), comprise one or more counterions (e.g. $C^1, C^2, \ldots C^c$), suitably as defined herein, suitably associated with the hybrid complex (and/or associated with either or both of the primary metal complex or/and linker component) as part of a hybrid complex salt. As such, the anti-scattering compound may be defined by, or may comprise units defined by, a hybrid complex salt of Formula C:

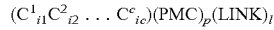

$(C^1_{i1}C^2_{i2} \ldots C^c_{ic})(PMC)_p(LINK)_l$ wherein PMC is a primary metal complex, suitably as defined herein, and p is the relative stoichiometry of PMC in Formula C or p is the number of moles of PMC per mole of Formula C;

wherein LINK is a linker component, suitably as defined herein, and l is the relative stoichiometry of LINK in Formula C or l is the number of moles of LINK per mole of Formula C; and wherein $C^1$ is a first counterion, $C^2$ is a second counterion, and $C^c$ is a cth counterion, suitably as defined herein, wherein i1, i2, and ic, is the relative respective stoichiometry of each of $C^1, C^2, \ldots$, and $C^c$ in Formula C or i1, i2, and ic, are the respective number of moles of each of $C^1, C^2, \ldots$, and $C^c$ per mole of Formula C.

p may have any suitable value, and is preferably a non-zero integer. p may suitably be a value (suitably an integer) between 1 and 120 (where 120 is the theoretical limit), suitably between 1 and 48. p may suitably be a value (suitably an integer) between 1 and 30, suitably between 2 and 24, more suitably between 2 and 8, suitably between 4 and 6. Most suitably p is an even integer (especially 2, 4, or 6).

l may have any suitable value (including 0), and is suitably zero or a non-zero integer, most suitably a non-zero integer. l may suitably be a value (suitably an integer) between 0 and 10, suitably between 0 and 2, more suitably 0 or 1, most suitably 1.

Either or both of the primary metal complex and linker component within a hybrid complex (or salt thereof) may be each independently associated with any of the counterions, and/or the counterions may be associated with the hybrid complex as a whole.

Suitably the hybrid complex salt is neutral overall.

The anti-scattering agent may comprise one or more additional metal complexes (AMC) (or salt(s) thereof), optionally associated with one or more counterions and/or one or more linker components as defined herein in relation to the primary metal complex. Any additional metal complex(es) are different from the primary metal complex (e.g. be it in terms of the metal species and/or ligands or the relative stoichiometries thereof). However, though different from the primary metal complex, any, some, or all of the additional metal complex(es) may be defined as set forth herein in relation to any primary metal complex. As such, any additional metal complex(es) may be a metal cage, such as a polymetallic cage, suitably wherein all metal species are divalent or where the metal sites are in different oxidation states. This polymetallic cage may be homometallic. However, the metal cage of the AMC may be as per any of those defined herein in relation to a primary metal complex. Where one or more additional metal complex(es) are present in addition to a primary metal complex, suitably at least one, preferably two, metal species of the addition metal complex(es) are different to those of the primary metal complex.

The anti-scattering agent may therefore be defined by, or may comprise units defined by, a hybrid complex or hybrid complex salt of Formula D:

$(C^1_{i1}C^2_{i2} \ldots C^c_{ic})(PMC)_{p-a}(AMC)_a(LINK)_l$ wherein PMC is a primary metal complex, suitably as defined herein, and p-a is the relative stoichiometry of PMC in Formula D or p-a is the number of moles of PMC per mole of Formula D;

wherein AMC is one or more additional metal complex(es), suitably as defined herein (optionally in the same manner as PMC so long as the AMC(s) differ from PMC), and a is the relative stoichiometry of AMC in Formula D or a is the number of moles of AMC per mole of Formula D;

wherein LINK is a linker component, suitably as defined herein, and l is the relative stoichiometry of LINK in Formula C or l is the number of moles of LINK per mole of Formula C; and wherein $C^1$ is a first counterion, $C^2$ is a second counterion, and $C^c$ is a cth counterion, suitably as defined herein, wherein i1, i2, and ic, is the relative respective stoichiometry of each of $C^1, C^2, \ldots$, and $C^c$ in Formula C or i1, i2, and ic, are the respective number of moles of each of $C^1, C^2, \ldots$, and $C^c$ per mole of Formula C.

p may have any suitable value, and is preferably a non-zero integer. p may suitably be a value (suitably an integer) between 1 and 120 (where 120 is the theoretical limit), suitably between 1 and 48. p may suitably be a value (suitably an integer) between 1 and 30, suitably between 2 and 24, more suitably between 2 and 8, suitably between 4 and 6. Most suitably p is an even integer (especially 2, 4, or 6).

a may have any suitable value, and is preferably zero or a non-zero integer. a may suitably be a value (suitably an integer) between 1 and 30, suitably between 2 and 24, more suitably between 2 and 8, suitably between 4 and 6. Most suitably a is an even integer (especially 2, 4, or 6). However, suitably p-a is greater than zero.

l may have any suitable value (including 0), and is suitably zero or a non-zero integer, most suitably a non-zero integer. l may suitably be a value (suitably an integer) between 0 and 10, suitably between 0 and 2, more suitably 0 or 1, most suitably 1.

Optionally the hybrid complex of Formula D may be free of counterions—i.e. all of i1, i2, . . . , is are zero.

Suitably the antiscattering agent comprises a primary metal complex but is (substantially) free of any additional metal complex(es). However, where additional metal complex(es) are present, they may be considered a substitute for a portion of the primary metal complex, and parameters and values may optionally be as defined herein as if the additional metal complex(es) were in fact the substituted primary metal complex.

References to any metal salts and/or complexes of the anti-scattering compound generally relate to the pre-mixed (i.e. prior to mixing with other components of the eBeam resist composition) form of such salts/complexes (i.e. in terms of cationic-anionic associations), and suitably also relate to the pre-coated, pre-cured, pre-exposed, pre-baked, pre-developed form thereof. It will be appreciated by those skilled in the art that, upon mixing with other components of the eBeam resist composition (and/or after coating, curing, exposing, baking and/or developing), the relevant cations, anions, and ligands of the metal salts and/or complexes of the anti-scattering compound may, in some embodiments (though not all), dissociate and possibly become associated with other counterions and/or ligands. Therefore, references to an eBeam resist composition (or indeed a coating, or a cured-, exposed-, or developed-product thereof) suitably indicates an eBeam resist composition (or a coating, or a cured-, exposed-, or developed-product thereof) "formed by" (or derived from) mixing said anti-scattering compound with any other ingredients of the eBeam resist composition. It is straightforward for those skilled in the art, using standard techniques, to determine the input in respect of the anti-scattering compound from an eBeam resist composition or a coated, cured-, exposed-, baked- or developed-product thereof.

Suitably, any metal salts and/or complexes of the anti-scattering compound comprise a two or more metal species.

The anti-scattering compound is suitably soluble in any diluent(s) or solvent(s) or diluent/solvent system of the eBeam resist composition (i.e. is soluble in a coating solvent system, which may be considered the diluents/solvents within the pre-coated eBeam resist composition). Suitably, at standard ambient temperature and pressure (SATP) the anti-scattering compound has a solubility of at least 1 mg/g in the coating solvent system, suitably at least 2 mg/g, suitably at least 10 mg/g, suitably at least 20 mg/g. Suitably the coating solvent system in question to which these solubility limits apply comprises or consists essentially of a (1-10C)hydrocarbyl solvent system, most preferably hexane.

The anti-scattering compound is suitably soluble in any diluent(s) or solvent(s) or diluent/solvent system of the pre-determined developing medium (especially where the eBeam resist composition is a negative tone eBeam resist composition). Suitably, at standard ambient temperature and pressure (SATP) the anti-scattering compound has a solubility of at least 1 mg/g in the developing medium, suitably at least 2 mg/g, suitably at least 10 mg/g, suitably at least 20 mg/g. Suitably the developing medium in question to which these solubility limits apply comprises or consists essentially of a (1-10C)hydrocarbyl solvent system, most preferably hexane.

Most suitably, the antiscattering agent is soluble, suitably within at least the limits defined herein, both a coating solvent system and a pre-determined developing medium.

Primary Metal Complex (and/or Additional Metal Complex)

The anti-scattering compound suitably comprises a primary metal complex. Suitably the primary metal complex is a metal cage, suitably a metal cage with no metal-metal bonds.

The primary metal complex is suitably a polymetallic complex. The polymetallic complex may be homometallic (e.g. composed of metal species derived from the same element, whether or not they are of the same oxidation state, though most suitably all the metal species of a homometallic PMC are of the same oxidation state, suitably metal (III)). Alternatively, and most suitably, the polymetallic complex is heterometallic (e.g. composed of metal species derived from different metal elements, whether or not are of the same oxidation state, though most suitably the relevant metal species of a heterometallic PMC are of different oxidation states, most suitably metal (II) and metal (III).

The primary metal complex suitably comprises one or more metal species, each of which may be suitably denoted $M^1, M^2, \ldots, M^n$ (see below). As such, the primary metal compound suitably comprises at least one metal species $M^1$. Suitably, where there is only one metal species $M^1$ within a PMC, said metal species has an oxidation state of III (i.e. +3) (though for an AMC preferably II-+2). In a particular embodiment, the primary metal complex comprises Cr(III) as the only metal species, with each complex most suitably comprising 8 Cr(III) units each.

Suitably the primary metal complex comprises two or more (different/different types of) metal species, each of which may be suitably denoted $M^1, M^2, \ldots, M^n$. As such, suitably the primary metal complex comprises a metal species $M^1$, a metal species $M^2$, and optionally one or more additional metal species (e.g. $M^3, \ldots,$ May Suitably the two or more (different) metal species (suitably at least $M^1$ and $M^2$) of the primary metal complex are two or more (different) metal ions. $M^1$ and $M^2$ are suitably derived from the same metal element and have a different valency, or are suitably derived from a different metal element and have the same or a different valency. Suitably two or more of the (different) metal ions (suitably at least $M^1$ and $M^2$) have a different oxidation state, suitably an oxidation state which differs by one, most suitably one of the metal ions (suitably $M^1$) being trivalent (i.e. an oxidation state of III, or +3) and another of the metal ions (suitably $M^2$) being divalent (i.e. an oxidation state of II, or +2). Where there are two or more metal species, both or all may be derived of the same metal element but be of a different oxidation state. This may, for instance, include a PMC having both Fe(II) and Fe(III) species.

Suitably the two or more (different) metal species (suitably at least $M^1$ and $M^2$) are derived from two or more different metals. As such, suitably the anti-scattering compound is a heterometallic polymetallic compound (i.e. containing two or more different metal species). Suitably at least one of the two or more (different) metal species (or at least one of $M^1$ and $M^2$) is a transition metal (d-block) species, more suitably at least two of the two or more (different) metal species (or both of $M^1$ and $M^2$) are transition metal (d-block) species. In an embodiment, both $M^1$ and $M^2$ are transition metal ions such that the primary metal complex is a transition metal complex. Suitably at least one of the two or more (different) metal species (or at least one of $M^1$ and $M^2$) is a transition metal species of the 3d-block of the periodic table of elements, more suitably at least two of the two or more (different) metal species (or both of $M^1$ and $M^2$) are transition metal species of the 3d-block of the periodic table of element.

Suitably at least one of the two or more (different) metal species (or at least one of $M^1$ and $M^2$, most suitably $M^1$) is a trivalent metal species, suitably selected from the group including $Cr^{III}$, $Fe^{III}$, $V^{III}$, $Ga^{III}$, $Al^{III}$, or $In^{III}$, though most suitably the trivalent metal species (suitably $M^1$) is $Cr^{III}$. Suitably at least one (preferably one other than the aforementioned trivalent metal species) of the two or more (different) metal species (or at least one of $M^1$ and $M^2$, most suitably $M^2$) is a divalent metal species, suitably selected from the group including $Co^{II}$, $Zn^{II}$, $Cd^{II}$, $Mn^{II}$, $Mg^{II}$, $Ca^{II}$, $Sr^{II}$, $Ba^{II}$, $Cu^{II}$, or $Fe^{II}$, though most suitably the divalent metal species (suitably $M^2$) is $Ni^{II}$.

In a particular embodiment, the primary metal complex (and hence the anti-scattering compound) comprises at least one trivalent metal species (suitably $M^1$, suitably selected from the group including $Cr^{III}$, $Fe^{III}$, $V^{III}$, $Ga^{III}$, $Al^{III}$, or $In^{III}$; most suitably $Cr^{III}$) and at least one divalent metal species (suitably $M^2$, suitably selected from the group including $Ni^{II}$, $Co^{II}$, $Zn^{II}$, $Cd^{II}$, $Mg^{II}$, $Ca^{II}$, $Sr^{II}$, $Ba^{II}$, $Cu^{II}$, or $Fe^{II}$; most suitably $Ni^{II}$).

Suitably the primary metal complex comprises two or more moles of the metal species (i.e. combined) per mole of primary metal complex (e.g. two or more moles of $M^1$ and/or $M^2$, suitably two or more moles of $M^1$ and $M^2$ combined—e.g. $[M^1_x M^2_y]$ where x+y≥2), suitably three or more moles of the metal species per mole of primary metal complex, suitably four or more, suitably five or more, suitably six or more, suitably seven or more, most suitably about eight moles of the metal species per mole of primary metal complex. Suitably the primary metal complex comprises twelve or fewer moles of the metal species (i.e. combined) per mole of primary metal complex, suitably ten or fewer.

Suitably, at least one of the metal species of the primary metal complex(es) is magnetic, suitably paramagnetic, suitably two or more metal species thereof.

Suitably the primary metal complex comprises more (suitably by moles or stoichiometry ratio) trivalent metal species (e.g. M') than divalent metal species (e.g. $M^2$), suitably at least two times more, suitably at least three times more, suitably at least four times more, suitably at least seven times more. Suitably the molar ratio of $M^1$ (which is suitably trivalent) to $M^2$ (which is suitably divalent) within the primary metal complex is between 12:1 and 1:1, suitably between 10:1 and 2:1, suitably between 9:1 and 3:1, more suitably between 8:1 and 6:1, most suitably about 7:1.

The primary metal complex suitably comprises one or more ligands, suitably one or more ligands co-ordinated to one, more, or all (or both) of the metal species (e.g. $M^1$ and/or $M^2$) of the primary metal complex. The primary metal complex suitably comprises ligands (including mixtures of ligands) of a sufficient type and in sufficient numbers to bind together (suitably indirectly, suitably via dative bonds) all of the metal species within the primary metal complex, suitably to form a metal cage, suitably without any metal-metal bonds. As such, the primary metal complex suitably comprises one or more bridging ligands, suitably which are capable of providing a bridge between two or more metal species—such bridging ligands may be poly-dentate, such as bidentate, but may also be monodentate where they are capable of donating more than one lone pair if electrons, such as with fluoro or oxygen-based ligands). Most suitably the primary metal complex comprises a mixture of two or more different types of ligand, wherein suitably one of the types of ligand is bidentate and another is monodentate. Most suitably, all of the ligands within the primary metal complex have co-ordinating atoms capable of donating more than one lone pair of electrons. Suitably, the primary metal complex comprises ligands of sufficient types and numbers (may be a mixture of monodentate ligands such as fluoro, and bidentate ligands such as carboxylate) to afford an average of at least 3 dative bonds per individual metal species within the complex (e.g. each individual $M^1$ and $M^2$ species within a complex forms an average of at least 3 dative bonds with ligands associated with the complex), suitably at least 4 dative bonds, most suitably about 6 dative bonds. Suitably the co-ordination sites of all the metal species may be completely filled/saturated (e.g. especially where the primary metal complex is intended to serve as a lewis basis within the overall anti-scattering compound) by the ligands within the complex, or there may be one or more vacant co-ordination sites amongst the metal species (e.g. especially where the primary metal complex is intended to serve as a lewis acid within the overall anti-scattering compound).

Suitably at least some, suitably all, ligands are negatively charged, most suitably bearing a single negative charge. Suitably the conjugate acid of the ligand(s) of the primary metal complex have a $pK_a$ value (in water at standard ambient temperature and pressure) greater than or equal to 2, suitably greater than or equal to 3.

Suitably, the ligand(s) of the primary metal complex are selected from monodentate ligands, bidentate ligands, or mixture(s) thereof. Most suitably, the ligand(s) of the primary metal complex comprise a mixture of monodentate ligands and bidentate ligands.

The monodentate ligand(s) suitably have a co-ordinating atom(s) (the atoms to and/or from which dative bonds are formed with metal species) bearing more than one lone pair of electrons, most suitably fluoride.

The bidentate ligands suitably have at least one, more suitably two, co-ordinating atoms bearing more than one lone pair of electrons, most suitably carboxylate (e.g. an optionally substituted organic carboxylate, e.g. optionally substituted hydrocarbyl carboxylates, such as acetate, pivalate, 3,3-dimethylbutanoate, benzoate, 4-tert-butylbenzoate, isonicotinate). In some embodiments (especially where the primary metal complex is intended to serve as a Lewis base), the ligands of the primary metal complex comprise at least two different types of bidentate ligand (e.g. comprise a first and second bidentate ligand) or carboxylate ligand. In such embodiments, suitably at least one of the bidentate ligands (e.g. the second) comprises a co-ordinating atom(s) capable of forming an internal dative bond(s) with metal species within the primary metal complex and one or more additional co-ordinating atoms capable of forming external dative bonds with metal species of another (different) complex or cage. Suitably such bifunctional ligands (e.g. the second bidentate ligand) may include a carboxylate group and an additional oxygen- or nitrogen-containing moiety, preferably a nitrogen-containing moiety, examples of which include iso-nicotinate and 4-aminobenzoate. However, in some embodiments (especially where the primary metal complex is intended to serve as a Lewis acid), the ligands of the primary metal complex are free of any additional co-ordinating atoms capable of forming external dative bonds with metal species of another (different) complex or cage, and may suitably comprise one type of bidentate ligand or carboxylate ligand.

In a particular embodiment, the primary metal complex is defined by Formula I or comprises units defined by Formula I:

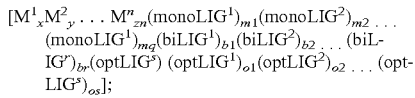

OR is defined as comprising, consisting essentially of, or being formed by mixing together, reacting, or otherwise combining (per each mole of primary metal complex):
x moles of a first metal species ($M^1$)
y moles of a second metal species ($M^2$);
optionally zn moles of each additional nth metal species ($M^n$);
m1 moles of a first monodentate ligand ($monoLIG^1$)
optionally m2 moles of a second monodentate ligand ($monoLIG^2$)
optionally mq moles of each additional qth monodentate ligand ($monoLIG^q$)
b1 moles of a first bidentate ligand ($biLIG^1$)
optionally b2 moles of a second bidentate ligand ($biLIG^2$)
optionally br moles of each additional rth bidentate ligand ($biLIG^r$)
o1 moles of a first optional extra/terminal ligand ($optLIG^1$)
o2 moles of a second optional extra/terminal ligand ($optLIG^2$)
os moles of each additional optional sth extra/terminal ligand ($optLIG^s$)
wherein:
  $M^1$ is a first metal species, suitably as defined herein (most suitably a trivalent metal ion, e.g. $Cr^{3+}$);
  $M^2$ is a second metal species, suitably as defined herein (most suitably a divalent metal ion, e.g. $Ni^{2+}$);
  $M^n$ is an nth metal species, suitably as defined herein (most suitably is absent);
  $monoLIG^1$ is a first monodentate ligand, suitably as defined herein (most suitably a monoanion whose conjugate acid has a pKa ≥2, suitably fluoride);
  $monoLIG^2$ is a second monodentate ligand, suitably as defined herein (most suitably absent);
  $monoLIG^q$ is a qth monodentate ligand, suitably as defined herein (most suitably absent);
  $biLIG^1$ is a first bidentate ligand, suitably as defined herein (most suitably carboxyate, suitably without any additional heteroatoms);
  $biLIG^2$ is a second bidentate ligand, suitably as defined herein (most suitably absent or a carboxylate bearing an additional oxygen- or nitrogen-containing moiety, most preferably an additional nitrogen-containing moiety);
  $biLIG^r$ is a rth bidentate ligand, suitably as defined herein (most suitably absent);
  $optLIG^1$ is a first optional extra ligand (suitably having a denticity of d), suitably as defined herein (most suitably absent, or is a polydentate ligand of denticity d, such as N-methyl-D-glucamine where d=6, a solvent or carboxylic acid);
  $optLIG^2$ is a second optional extra/terminal ligand, suitably as defined herein (most suitably absent or a solvent or carboxylic acid);
  $optLIG^s$ is a sth optional extra/terminal ligand, suitably as defined herein (most suitably absent or a solvent or carboxylic acid);

Most suitably x, y, zn, m1, m2, mq, b1, b2, br, o1, o2, os, are zero or integers, though in some examples any, some, or all of these may have an intermediate value between 0 and 1 or between any two integers.

x is suitably a number (most suitably an integer) between 1 and 16, suitably between 4 and 10; more suitably between 2 and 8; suitably 7.

y is suitably a number (most suitably an integer) between 0 and 15, suitably between 0 and 7; suitably between 0 and 2, suitably 0 or 1, most suitably 1.

zn is suitably a number (most suitably an integer) between 0 and 14, suitably between 0 and 6; suitably between 0 and 2; suitably 0.

m1 is suitably a number (most suitably an integer) between 0 and 40; suitably between 0 and 20 or between 0 and 10; suitably between 1 and 20; suitably between 2 and 12; suitably between 4 and 10; suitably 8.

m2 is suitably a number (most suitably an integer) between 0 and 39; suitably between 0 and 18; suitably between 0 and 10; suitably between 0 and 2; suitably 0.

mq is suitably a number (most suitably an integer) between 0 and 38; suitably between 0 and 17; suitably between 0 and 9; suitably between 0 and 2; suitably 0.

b1 is suitably a number (most suitably an integer) between 0 and 20; suitably between 1 and 20; suitably between 1 and 16; suitably between 12 and 16; suitably between 12 and 15; suitably 15 or 16.

b2 is suitably a number (most suitably an integer) between 0 and 20; suitably between 0 and 16; suitably between 0 and 8; suitably between 0 and 3; suitably between 1 and 4; suitably 0 or 1.

br is suitably a number (most suitably an integer) between 0 and 19; suitably between 0 and 15; suitably between 0 and 7; suitably between 0 and 2; suitably 0.

o1 is suitably a number (most suitably an integer) between 0 and 8, suitably between 0 and 4, suitably 0 or 1, most suitably 0.

o2 is suitably a number (most suitably an integer) between 0 and 7, suitably between 0 and 3, suitably 0 or 1, most suitably 0.

os is suitably a number (most suitably an integer) between 0 and 6, suitably between 0 and 2, suitably 0 or 1, most suitably 0.

In an embodiment, the primary metal complex is defined by Formula I or comprises units defined by Formula I:

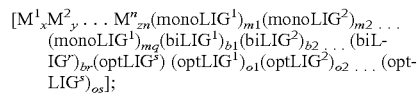

wherein:
  $M^1$ is a first metal species and x is the number of moles of $M^1$ per mole of primary metal complex, wherein x is a number between 1 and 16;
  $M^2$ is a second metal species and y is the number of moles of $M^2$ per mole of primary metal complex, wherein y is a number between 0 and 7;
  $M^n$ is an nth metal species and zn is the number of moles of each $M^n$ per mole of primary metal complex, wherein zn is a number between 0 and 6; suitably between 0 and 2; suitably 0;
  $monoLIG^1$ is a first monodentate ligand and m1 is the number of moles of $monoLIG^1$ per mole of primary metal complex, wherein m1 is a number between 0 and 20;

monoLIG$^2$ is a second monodentate ligand and m2 is the number of moles of monoLIG$^2$ per mole of primary metal complex, wherein m2 is a number between 0 and 10;

monoLIG$^q$ is a qth monodentate ligand and mq is the number of moles of each monoLIG$^q$ per mole of primary metal complex, wherein mq is a number between 0 and 2;

biLIG$^1$ is a first bidentate ligand and b1 is the number of moles of biLIG$^1$ per mole of primary metal complex, wherein b1 is a number between 1 and 20;

biLIG$^2$ is a second bidentate ligand and b2 is the number of moles of biLIG$^2$ per mole of primary metal complex, wherein b2 is a number between 0 and 16;

biLIG$^r$ is a rth bidentate ligand and br is the number of moles of each additional biLIG$^r$ per mole of primary metal complex, wherein br is a number between 0 and 2;

optLIG$^1$ is a first optional extra ligand and o1 is the number of moles of optLIG$^1$ per mole of primary metal complex, wherein o1 is a number between 0 and 4;

optLIG$^2$ is a second optional extra/terminal ligand and o2 is the number of moles of optLIG$^2$ per mole of primary metal complex, wherein o2 is a number between 0 and 3;

optLIG$^s$ is a sth optional extra/terminal ligand and os is the number of moles of each additional optional optLIG$^s$ per mole of primary metal complex; wherein os is a number between 0 and 2.

In an embodiment, the primary metal complex is defined by Formula Ia or comprises units defined by Formula I:

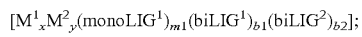

wherein:
M$^1$ is a first metal species and x is the number of moles of M$^1$ per mole of primary metal complex, wherein x is a number between 4 and 10;

M$^2$ is a second metal species and y is the number of moles of M$^2$ per mole of primary metal complex, wherein y is a number between 0 and 2;

monoLIG$^1$ is a first monodentate ligand and m1 is the number of moles of monoLIG$^1$ per mole of primary metal complex, wherein m1 is a number between 4 and 10;

biLIG$^1$ is a first bidentate ligand and b1 is the number of moles of biLIG$^1$ per mole of primary metal complex, wherein b1 is a number between 12 and 16;

biLIG$^2$ is a second bidentate ligand and b2 is the number of moles of biLIG$^2$ per mole of primary metal complex, wherein b2 is a number between 0 and 3.

Suitably, the sum of x and y is at least 2, more suitably at least 3, suitably at least 4, suitably at least 5, suitably at least 6, suitably at least 7, suitably about 8. Suitably, the sum of x and y is at most 16, suitably at most 12, suitably at most 10. Suitably x is at least 4, suitably at least 6, suitably at most 10, and is most suitably about 7. In a particular embodiment y is 0 (i.e. there is no second metal species at all), but preferably y is non-zero, suitably at least 1, and is most suitably about 1. Most suitably, x is 7+/−δ (i.e. δ=at most 10% of x, suitably at most 1% of x) and y is 1−/+δ. In a particular embodiment, M$_1$ is Cr$^{3+}$, M$_2$ is Ni$^{2+}$, the sum of x and y is between 7 and 10; and x is between 6 and 10. In a particular embodiment, M$_1$ is Cr$^{3+}$, M$_2$ is Ni$^{2+}$, x is about 7 and y is about 1.

Most suitably the primary metal complex comprises no further metal species beyond the first metal species (M$^1$) and optionally the second metal species (M$^2$), and thus zn is zero. However, in some examples, the primary metal complex may be doped, for instance, with small quantities of alternative metal species to judiciously vary the properties of the anti-scattering compound. In such embodiments, the sum of any or all zn values (z3+z4+ . . . +zn) is suitably less than the sum of x and y, suitably at least 5 times less (i.e. at most a fifth of the sum of x+y), suitably at least 10 times less, suitably at least 100 times less.

Suitably, the sum of:
(m1+m2+ . . . +mq); (i.e. the sum of moles of monodentate ligand(s) per mole of complex)
2×(b1+b2+ . . . +bq); (i.e. twice the sum of moles of bidentate ligand(s) per mole of complex)
o1×d (i.e. d times the moles of optional extra ligand(s) per mole of complex)

is less than or equal to 50, suitably less than or equal to 42, suitably less than or equal to 40, suitably more than or equal to 30, suitably more than or equal to 38, suitably about 40.

Suitably, the sum of m1, m2, . . . , and mq is at least 1, suitably at least 2, suitably at least 3, suitably at least 6, suitably at most 7, suitably at most 16, suitably at most 12, suitably at most 10, most suitably about 8. In preferred embodiments, there are no monodentate ligands beyond a first monodentate ligand (i.e. m2 and mq are both 0). In a particular embodiment, monoLIG$^1$ is fluoride (F). In a particular embodiment, monoLIG$^1$ is fluoride (F), m1 is between 2 and 9, and all of m2 and mq are 0, wherein suitably M$_1$ is Cr$^{3+}$, M$_2$ is Ni$^{2+}$, the sum of x and y is between 7 and 10; and x is between 6 and 10. In a particular embodiment, monoLIG$^1$ is fluoride (F), m1 is 3, and all of m2 and mq are 0 (i.e. no other monodentate ligands). In a particular embodiment, monoLIG$^1$ is fluoride (F), m1 is 8, and all of m2 and mq are 0 (i.e. no other monodentate ligands).

Suitably, the sum of b1, b2, . . . , and br is at least 6, suitably at least 10, suitably at least 14, suitably at most 22, suitably at most 20, suitably at most 18, most suitably about 16. In some embodiments, there are no bidentate ligands beyond a first and second bidentate ligand (i.e. all br are 0), and in some embodiments there are no bidentate ligands beyond a first bidentate ligand (i.e. b2 and br are both 0). In an embodiment, biLIG$^1$ is a carboxylate defined by the formula —O$_2$CR$_{B1}$ (or R$_{B1}$CO$_2$$^-$), wherein R$_{B1}$ is suitably a group (e.g. hydrocarbyl moiety) devoid of basic or chelating groups, and is suitably selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, aryl(1-3C)alkyl. Most suitably R$_{B1}$ is (1-5C)alkyl, most suitably biLIG$^1$ is pivalate. In an embodiment, biLIG$^2$ is a carboxylate defined by the formula —O$_2$CR$_{B2}$ (or R$_{B2}$CO$_2$), wherein R$_{B2}$ is suitably a group comprising a basic or chelating group (e.g. a moiety with a lone pair of electrons that is free to co-ordinate to form a dative bond), and is suitably selected from optionally substituted heterocyclyl, heteroaryl, heterocyclyl(1-6C)alkyl, heteroaryl(1-6C)alkyl, or is selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, or aryl(1-3C)alkyl, substituted with one or more basic or chelating groups, for example, amino, alkylamino, dialkylamino, hydroxyl, (1-6C)alkoxy, carbonyl, immino, thio, thiocarbonyl, etc. Most suitably R$_{B2}$ is pyridyl, aminophenyl, N-(1-3C)alkylaminophenyl, N,N-di(1-3C)alkylaminophenyl, most suitably pyridyl, most suitably 4-pyridyl, most suitably biLIG$^2$ is isonicotinate. In a particular embodiment, biLIG$^1$ is an optionally substituted hydrocarbyl carboxylate (e.g.

(1-6C)alkylcarboxylate, such as pivalate), biLIG² is an organic or optionally substituted hydrocarbyl carboxylate bearing at least one additional heteroatom (e.g. one capable of acting as a lewis base or ligand for chelating metal species external to the complex, e.g. isonicotinate), b1 is between 12 and 20 (most suitably 14-18, most suitably 15-16), b2 is between 0 and 4 (most suitably 0 or 1-3), wherein suitably $M_1$ is $Cr^{3+}$, $M_2$ is $Ni^{2+}$, the sum of x and y is between 7 and 10; and x is between 6 and 10, and wherein suitably monoLIG¹ is fluoride (F), m1 is between 2 and 9, and all of m2 and mq are 0.

Suitably, the sum of o1, o2, . . . , and os is between 0 and 4, suitably between 0 and 2, most suitably between 0 and 1. In some embodiments, there are no optional extra/terminal ligands beyond a first optional extra/terminal ligand (i.e. all o2 and os are 0), In a particular embodiment, the sum of o1, o2, . . . , and os is zero (i.e. there are substantially no optional extra/terminal ligands). Where one or more optional extra/terminal ligands are present, these may include a solvent molecule (be it monodentate, bidentate, or otherwise polydentate), such as $H_2O$, tetrahydrofuran, pyridine, etc. In certain embodiments, the primary metal complex comprises at least one extra/terminal ligands that is a polydentate ligand having a denticity greater than or equal to 3, suitably greater than or equal to 4, though suitably at most 6. Such polydentates may, for example, include N-(1-6C)alkyl-D-glucamine (e.g. N-methyl-D-glucamine). In a particular embodiment, optLIG¹ is defined by the formula Gluc-NH—$R_{O1}$, wherein Gluc-NH—$R_{O1}$ is N-(1-8C)alkyl-D-glucamine or a deprotonated form thereof, and wherein suitably $R_{O1}$ is (1-8C)alkyl, more suitably (1-2C)alkyl (e.g. methyl or ethyl). In such embodiments, suitably o1 is 1 whilst o2 and all os are zero.

In a particular embodiment, the primary metal complex is defined by or comprises units defined by the Formula II:

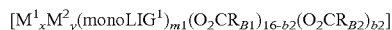

wherein:

M¹ is a trivalent metal ion as defined herein, most suitably $Cr^{3+}$;

M² is a divalent metal ion as defined herein, most suitably $Ni^{2+}$;

x is as defined herein (suitably x is 6, 7, 8, or 9, most suitably x is 7);

y is as defined herein (suitably y is 1 or 2, most suitably y is 1, though it may be 0 form homometallic polymetallic complexes have a metal of the same oxidation state, e.g. Cr(III));

monoLIG¹ is as defined herein (most suitably monoLIG¹ is fluoride, F);

m1 is as defined herein (most suitably m1 is 8);

$R_{B1}$ is as defined herein, though $R_{B1}$ is suitably a group devoid of basic or chelating groups, and is suitably selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, aryl(1-3C)alkyl;

$R_{B2}$ is as defined herein, though $R_{B2}$ is suitably a group comprising a basic or chelating group (e.g. a moiety with a lone pair of electrons that is free to co-ordinate to form a dative bond), and is suitably selected from optionally substituted heterocyclyl, heteroaryl, heterocyclyl(1-6C)alkyl, heteroaryl(1-6C)alkyl, or is selected from (1-12C)alkyl, (1-12C)alkenyl, (1-12C)alkynyl, (3-8C)cycloalkyl, (1-12C)alkenyl, (3-8C)cycloalkenyl, (1-3C)alkyl(3-8C)cycloalkyl, (1-3C)alkyl(3-8C)cycloalkenyl, aryl, (1-3C)alkylaryl, or aryl(1-3C)alkyl, substituted with one or more basic or chelating groups, for example, amino, alkylamino, dialkylamino, hydroxyl, (1-6C)alkoxy, carbonyl, immino, thio, thiocarbonyl, etc.;

b2 is as defined herein, though b2 is suitably 0, 1, 2, or 3; wherein suitably the sum of x and y is as defined herein, though most suitably the sum of x and y is 7, 8, 9, or 10 (most suitably 8).

In a particular embodiment, the primary metal complex is defined by or comprises units defined by the Formula IIa:

wherein:

M¹ is a trivalent metal ion as defined herein, most suitably $Cr^{3+}$;

M² is a divalent metal ion as defined herein, most suitably $Ni^{2+}$;

y is 0 or 1;

$R_{B1}$ is a group devoid of basic or chelating group, and is suitably selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, aryl(1-3C)alkyl;

$R_{B2}$ is a group comprising a basic or chelating group (e.g. a moiety with a lone pair of electrons that is free to co-ordinate to form a dative bond), and is suitably selected from optionally substituted heterocyclyl, heteroaryl, heterocyclyl(1-6C)alkyl, heteroaryl(1-6C)alkyl, or is selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, or aryl(1-3C)alkyl, substituted with one or more basic or chelating groups, for example, amino, alkylamino, dialkylamino, hydroxyl, (1-6C)alkoxy, carbonyl, immino, thio, thiocarbonyl, etc.;

b2 is 0, 1, 2, or 3.

In a particular embodiment, the primary metal complex is defined by or comprises units defined by the Formula IIb:

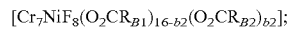

wherein $R_{B1}$, $R_{B2}$, and b2 are as defined herein, though most suitably $R_{B1}$ is t-butyl and $R_{B2}$ if present is 4-pyridyl.

In a particular embodiment, the primary metal complex is defined by or comprises units defined by the Formula IIc:

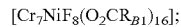

wherein $R_{B1}$ is as defined herein, though most suitably $R_{B1}$ is t-butyl.

In a particular embodiment, the primary metal complex is defined by or comprises units defined by the Formula IId:

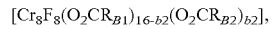

wherein $R_{B1}$, $R_{B2}$, and b2 are as defined herein, though most suitably $R_{B1}$ is t-butyl and $R_{B2}$ if present is 4-pyridyl.

In a particular embodiment, the primary metal complex is defined by or comprises units defined by the Formula IIe:

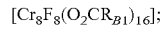

wherein $R_{B1}$ is as defined herein, though most suitably $R_{B1}$ is t-butyl.

In another embodiment, the primary metal complex is defined by or comprises units defined by the Formula III:

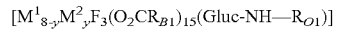

wherein:

M¹ is a trivalent metal ion as defined herein, most suitably $Cr^{3+}$;

M² is a divalent metal ion as defined herein, most suitably $Ni^{2+}$;

y is 0 or 1;

$R_{B1}$ is a group devoid of basic or chelating group, and is suitably selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, aryl(1-3C)alkyl;

Gluc-NH—$R_{O1}$ is N-(1-8C)alkyl-D-glucamine (i.e. $R_{O1}$ is (1-8C)alkyl, more suitably (1-2C)alkyl) or a deprotonated form thereof.

In another embodiment, the primary metal complex is defined by or comprises units defined by the Formula IIIa:

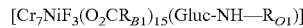

$[Cr_7NiF_3(O_2CR_{B1})_{15}(\text{Gluc-NH}-R_{O1})]$ wherein $R_{B1}$ and Gluc-NH—$R_{O1}$ are as defined herein, though most suitably $R_{B1}$ is t-butyl and $R_{O1}$ is methyl.

Counterions

The primary metal complex may be neutral or charged (whether positively or negatively), depending on the balance and type of metal species and associated ligands within the complex. This is likewise the case for any additional metal complex(es) and any linker component(s). Moreover, the combination of primary metal complex(es), any linker component(s), and/or any additional metal complex(es), in their relevant stoichiometries may yield a net charge. As such, the anti-scattering compound may comprise one or more counterions (e.g. $C^1, C^2, \ldots, C^c$), suitably as defined herein. Such counterion(s) are suitably associated with the primary metal complex, one or more additional metal complex(es), a linker component, and/or a hybrid complex as a whole. A hybrid complex may be defined by or comprise units defined by Formula E:

$(\text{PMC})_{p-a}(\text{AMC})_a(\text{LINK})_l$ wherein PMC, AMC, LINK, p, a, and l are as defined herein, suitably with respect to Formula D;

and a corresponding hybrid complex salt, with which the aforementioned counterions are associated, is suitably defined by or comprise units defined by Formula D:

$(C^1_{i1}C^2_{i2}\ldots C^2_{ic})(\text{PMC})_{p-a}(\text{AMC})_a(\text{LINK})_l$ wherein Formula D and the constituent parts thereof are as defined herein.

In the event that the hybrid complex of Formula E (or indeed of Formula B) is neutral, the anti-scattering compound may be free from counterions as defined herein, though this need not exclude instances where complexes or components of the hybrid complex act as counterions to each other.

The counterion(s) may be any suitable counterion(s), and may be either positively (countercations) or negatively (counteranions) charged depending on the polarity of the charge borne on species to which the counterions are intended to neutralise.

In preferred embodiments, the net charge of the primary metal complex is negative (i.e. producing an anionic complex), most suitably having a negative charge of about −1. Moreover, in preferred embodiments, the net charge of the hybrid complex (whether of Formula B or E) is negative. As such, the anti-scattering compound suitably additionally comprises one or more countercations, suitably a single countercation (i.e. just $C^1$ but no $C^2 \ldots C^c$), to neutralise the negative charge of the relevant complex(es).

The countercation(s) may be any suitable cation(s). However, in preferred embodiments, the countercation(s) comprise (and preferably consist essentially of) a monovalent cation (i.e. +1 charged), suitably selected from an alkali metal cation or an ammonium-based cation (including any ammonium, primary ammonium, secondary ammonium, tertiary ammonium, quaternary ammonium cation, imidazolium), most suitably a cation selected from the group including $NH_3R_{cat1}^+$, $NH_2R_{cat1}R_{cat2}^+$, $Cs^+$, $Rb^+$, wherein $R_{cat1}$ and $R_{cat2}$ are each independently selected from (1-12C)alkyl (most suitably (1-4C)alkyl, especially ethyl or propyl). Dipropylammonium salts are particularly useful.

Linker Component (or Central Complex)

The anti-scattering compound suitably comprises a linker component. Suitably the linker component indirectly links (or associates) together two or more primary metal complexes and/or indirectly links (or associates) together one or more primary metal complexes with one or more additional metal complexes, suitably via the linker component. Suitably the linker component is capable of forming electrostatic and/or covalent bonds with two or more primary metal complexes and/or with one or more primary metal complexes and with one or more additional metal complexes.

Suitably, where a linker component is defined by reference to a radical species (e.g. halo) it may instead refer to an ionic form thereof (e.g. halide).

The linker component may comprise one or more, suitably two or more, Lewis basic moieties and/or one or more Lewis acidic moieties. As such, the linker component may comprise one or more, suitably two or more, electron pair donars and/or one or more, suitably two or more, electron pair acceptors. In preferred embodiments the linker component forms a bridge (or hub) between two or more primary metal complexes and/or between one or more primary metal complexes and one or more additional metal complexes, and as such the linker component suitably comprises at least one Lewis acid or base moiety which binds (suitably via a dative bond) one complex and at least one other Lewis acid or base moiety which binds (suitably via a dative bond) another complex.

The anti-scattering compound or hybrid complex (or salt thereof) may comprise one or more moles of linker component(s) (whether the same or different linker components, suitably the same) per mole of compound or hybrid complex, but most suitably the anti-scattering compound or hybrid complex (or salt thereof) comprises only one mole of linker component per mole of compound or hybrid complex. As such, the linker component most suitably serves, within a hybrid complex, as a common central hub to which (or with which) primary metal complex(es) and/or additional metal complex(es) (though most suitably just primary metal complexes) are connected (or associated). Suitably, this common central hub is surrounded by two or more primary metal complex(es) and/or additional metal complex(es), more suitably by four or more primary metal complex(es) and/or additional metal complex(es). As such, suitably the linker component comprises an appropriate number of lewis acid or base moieties to enable the linker component to bond (preferably via dative bonds) to all of its surrounding primary metal complex(es) and/or additional metal complex(es), suitably via dative bonds. However, in circumstances where the linker moiety is only associated with a single primary metal complex and no additional metal complexes, the linker component may be simply a terminal ligand, such as those selected from $optLIG^2$, such as a solvent molecule (e.g. water, THF, pyridine, or substitute pyridine).

The anti-scattering compound suitably comprises a hybrid complex defined by or comprises units defined by Formula E:

$(\text{PMC})_{p-a}(\text{AMC})_a(\text{LINK})_l$ wherein l is 1; p is ≥2 (suitably between 2 and 8, more suitably 2, 4, or 6, though p may be between 23 and 49); and a is between 0 and 7 (suitably 0).

The linker component, or LINK group/molecule, suitably provides one or more, preferably two or more, electron pair-donating and/or electron-pair accepting co-ordinating groups. Though in some embodiments, the linker component may comprise a mixture of electron pair-donating and electron pair-accepting co-ordinating groups, most preferably the linker component comprises either exclusively electron pair-donating or electron pair-accepting co-ordinating groups. Whether the linker component comprises electron pair-donating or electron pair-accepting co-ordinating groups suitably depends on the electron pair-donating or electron-pair accepting capacity of corresponding primary metal complexes and optional additional metal complexes (in particular the ligands thereof).

The or each linker component, especially where two or more PMCs or two or more PMCs/AMCs combined are associated with said linker component, may be or comprise units independently selected from:

i) a single atom, molecule, ion, or complex containing a single co-ordinating moiety capable of accepting or donating two or more lone pairs of electrons;

ii) a single molecule, ion, or complex (e.g. a multiple heteroatom-containing optionally substituted acyclic, cyclic, polycyclic, or macrocyclic molecule; or a Lewis acidic metal-centered compound or complex; or a metal-centered compound or complex attached to a leaving group or substitutable ligand) comprising two or more co-ordinating moieties (e.g. internal heteroatoms, such as nitrogen, oxygen, or sulphur, or external heteroatoms borne by optional substituents; or electron-deficient metal centers; or metal centers attached to a leaving group or substitutable ligand), each co-ordinating moiety being capable of accepting or donating one or more lone pairs of electrons;

iii) a molecule, ion, or complex defined by Formula IV:

Q-[CORE]-[W]$_w$ wherein:

[CORE] is absent or is the core of the linker component and comprises one or optionally more than one core groups;

Q is a group directly attached to [CORE] or to one or more core group(s) thereof, wherein Q comprises a co-ordinating moiety (suitably a co-ordinating moiety that co-ordinates to a primary metal complex);

each W is a group independently directly attached to [CORE] or to one or more core group(s) thereof, and optionally further attached to one or more other W groups or to Q, each of which W independently comprises a co-ordinating moiety (suitably a co-ordinating moiety that co-ordinates to a primary metal complex different to that associated with Q, or an additional metal complex);

wherein w is an integer greater than zero.

The Q and one, more, or all of the W groups may be the same or different. However, even if the Q and one, more, or all of the W groups are different, they are suitably selected from the same pool of acceptable groups.

Where a linker component is a single atom, molecule, ion, or complex containing a single co-ordinating moiety capable of donating two or more lone pairs of electrons, suitably the single co-ordinating moiety comprises or consists of an oxygen, sulphur, or halo (particularly fluoro or chloro, especially fluoro) atom. For example, the linker component(s) may be or comprise a group selected from halide (preferably fluoro), oxo, oxide, hydroxide (OH$^-$), (1-6C) alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C) alkylthio, (2-6C)alkenylthio, (2-6C)alkynylthio, thiocarbonyl, heterocyclyl containing at least one internal heteroatom selected from oxygen or sulphur, or (where appropriate) a deprotonated form or salt thereof; wherein any CH, CH$_2$, or CH$_3$ is optionally substituted.

Where a linker component is a single atom, molecule, ion, or complex containing a single co-ordinating moiety capable of accepting two or more lone pairs of electrons, suitably the single co-ordinating moiety comprises or consists of a Lewis acidic metal atom (which may include boron or silicon), or a metal atom attached to a leaving group or substitutable ligand. For example, the linker component(s) may be or comprise a group selected from a metal cation (e.g. a divalent metal cation), a Lewis acidic metal compound (suitably a Lewis acid metal compound, such as AlCl$_3$, FeCl$_3$, ZnCl$_2$, etc.), a Lewis acidic metal complex (suitably a Lewis acid or a complex with one or more free co-ordination sites, such as where the metal center has fewer than 18 electrons in its valence shell), and/or a metal compound or complex comprising a leaving group or substitutable ligand (suitably where the conjugate acid of said leaving group or substitutable ligand has a pKa in water at standard ambient temperature and pressure less than or equal to 1, suitably less than or equal to 0, suitably less than or equal to −1, more suitably less than or equal to −5). Suitable metal cations may include divalent (e.g. alkaline earth metal, transition metal (II), or Sn$^{2+}$ cations), trivalent (e.g. Al$^{3+}$, transition metal(III) or f-block metal(III) cations), or tetravalent (Se, Pb$^{4+}$, transition metal(IV) or f-block metal(IV) cations) cations, most suitably divalent cations. Suitably Lewis acidic metal compounds may include boron compounds (e.g. boron halides, alkoxides, etc.), silicon compounds (e.g. silane, silioxane, silicon halides, etc.), Lewis acidic metal compounds (e.g. AlCl$_3$, FeCl$_3$, ZnCl$_2$, etc.). Suitable Lewis acidic metal complexes or complexes comprising a leaving group or substitutable ligand may include carboxylate complexes such as dimetallic carboxylate complexes (e.g. [M$_2$(O$_2$C—R)$_4$], where M may be Cu$^{2+}$, Ru$^{2+}$, Rh$^{2+}$), trimetallic carboxylate complexes (e.g. [M$_2$M'O (O$_2$CR)$_6$], where M may be a trivalent metal ion, and M' may be a divalent metal ion), hexametallic carboxylate complexes (e.g. [M'$_4$M$_2$O$_2$(O2CR)$_{12}$] where M may be a trivalent metal ion, and M' may be a divalent metal ion), a dodecametallic complex (e.g. [Ni$_{12}$(chp)$_{12}$(O$_2$CMe)$_6$(H$_2$O)$_6$] where chp=6-chloro-2-pyridonate), metal compounds whose metal center is bonded to a leaving group (e.g. a halide such as chloride, e.g. AlCl$_3$), metal complexes whose metal centre(s) are co-ordinated with a substitutable ligand such as halide, water, a solvent such as THF, pyridine, or even carboxylate.

Where a linker component is a single molecule, ion, or complex comprising two or more co-ordinating moieties, each being capable of donating one or more lone pairs of electrons, suitably each of the two or more co-ordinating moieties comprises or consists of an oxygen, nitrogen, sulphur, or halo (particularly fluoro or chloro, especially fluoro) atom. For example, the linker component(s) may be or comprise one or more, suitably two or more, groups selected from halide (preferably fluoro), amino, cyano, imino, enamino, (1-6C)alkylamino, di-[(1-6C)alkyl]amino, tri-[(1-6C)alkyl]amino, oxo, oxide, hydroxide (OH$^-$), (1-6C)alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C)alkylthio, (2-6C)alkenylthio, (2-6C)alkynylthio, thiocarbonyl, heterocyclyl containing at least one internal heteroatom selected from nitrogen, oxygen or sulphur, heteroaryl containing at least one internal hetero atom selected from nitrogen, oxygen or sulphur (e.g. pyridyl), or (where appropriate) a deprotonated form or salt thereof; wherein any CH, $CH_2$, or $CH_3$ is optionally substituted. Any of the aforementioned groups may be linked directly to each other or indirectly linked via a [CORE] as defined herein to form a linker component.

Where a linker component is a single molecule, ion, or complex comprising two or more co-ordinating moieties, each being capable of accepting one or more lone pairs of electrons, suitably each of the two or more co-ordinating moieties comprises or consists of a Lewis acidic metal atom (which may include boron or silicon), or a metal atom attached to a leaving group or substitutable ligand. For example, the linker component(s) may be or comprise one or more, suitably two or more, groups selected from a metal cation (e.g. a divalent metal cation), a Lewis acidic metal compound (suitably a Lewis acid metal compound, such as $AlCl_3$, $FeCl_3$, $ZnCl_2$, etc., or a complexed derivative thereof), a Lewis acidic metal complex (suitably a Lewis acid or a complex with one or more free co-ordination sites, such as where the metal center has fewer than 18 electrons in its valence shell), and/or a metal compound or complex comprising a leaving group or substitutable ligand (suitably where the conjugate acid of said leaving group or substitutable ligand has a pKa in water at standard ambient temperature and pressure less than or equal to 1, suitably less than or equal to 0, suitably less than or equal to −1, more suitably less than or equal to −5). Suitable metal cations may include divalent (e.g. alkaline earth metal, transition metal (II), or $Sn^{2+}$ cations), trivalent (e.g. $Al^{3+}$, transition metal(III) or f-block metal(III) cations), or tetravalent ($Sn^{4+}$, $Pb^{4+}$, transition metal(IV) or f-block metal(IV) cations) cations, most suitably divalent cations. Suitably Lewis acidic compounds may include boron compounds (e.g. boron halides, alkoxides, etc.), silicon compounds (e.g. silane, silioxane, silicon halides, etc.), Lewis acidic metal compounds (e.g. $AlCl_3$, $FeCl_3$, $ZnCl_2$, etc.). Suitable Lewis acidic metal complexes or complexes comprising a leaving group or substitutable ligand may include carboxylate complexes such as dimetallic carboxylate complexes (e.g. $[M_2(O_2C-R)_4]$, where M may be $Cu^{2+}$, $Ru^{2+}$, $Rh^{2+}$), trimetallic carboxylate complexes (e.g. $[M_2M'O(O_2CR)_6]$, where M may be a trivalent metal ion, and M' may be a divalent metal ion), hexametallic carboxylate complexes (e.g. $[M'_4M_2O_2(O_2CR)_{12}]$ where M may be a trivalent metal ion, and M' may be a divalent metal ion), a dodecametallic complex (e.g. $[Ni_{12}(chp)_{12}(O_2CMe)_6(H_2O)_6]$ where chp=6-chloro-2-pyridonate), metal compounds whose metal center is bonded to a leaving group (e.g. a halide such as chloride, e.g. $AlCl_3$), metal complexes whose metal centre(s) are co-ordinated with a substitutable ligand such as halide, water, a solvent such as THF, pyridine, or even carboxylate. Any of the aforementioned groups may be linked directly to each other or indirectly linked via a [CORE] as defined herein to form a linker component.

Suitably the two or more co-ordinating moieties are capable of co-ordinating with two different electron donating or electron accepting species or complexes—for instance, the co-ordinating moieties are suitably sufficiently distal to allow each to independently bond to a separate species or complex. Co-ordinating moieties may be capable of co-ordinating directly with (one of) the metal center(s) of the primary and/or additional metal complex(es) and/or may be capable of co-ordinating with (one of) the ligands associated with the primary and/or additional metal complex(es).

Where a linker component is a molecule, ion, or complex defined by Formula IV, the [CORE] may comprise one or more co-ordinating groups, but suitably any co-ordinating group present within the [CORE] are (substantially) unavailable for co-ordination with any species or complexes external to the linker component. In some embodiments, the [CORE] may be absent altogether and Q and the one or more W groups are directly linked to each other.

The [CORE] may be any suitable core allowing the Q group to co-ordinate with a primary metal complex whilst simultaneously allowing the or each W group to co-ordinate with either another primary metal complex or with an additional metal complex.

The [CORE] may comprise a single core group to which the Q group and the or each of the W group(s) are commonly attached. As such, the [CORE] may be a divalent or multivalent core group (the valency of which depends on the value of w). Such a single core group (particularly applicable to linker component(s) with electron pair-donating capability) may be selected from:

a) a divalent or multivalent optionally substituted acyclic core group (e.g. optionally substituted (1-nC)alkylene, (1-nC)alkenylene, (1-nC)alkynylene optionally comprising one or more intervening heteroatoms or intervening heteroatom-containing moieties, i.e. where heteroroatoms or heteroatom-containing moieties are interspersed within the carbon chain);

b) a divalent or multivalent cyclic or polycyclic core group, for example, an optionally substituted cyclocarbon (e.g. cycloalkane), heterocycle (e.g. morpholine), arene (benzene, naphthalene), or heteroarene (pyridine, imidazole, indole);

c) a divalent or multivalent core group comprising at least one cyclic or polycyclic group (e.g. optionally substituted cyclocarbon, heterocycle, arene, or heteroarene) linked to one or more acyclic moieties and/or cyclic or polycyclic moieties;

d) a divalent or multivalent macrocyclic core group (which macrocyclic group may itself comprise one or more optionally substituted cyclocarbyl, heterocyclyl, aryl, and/or heteroaryl groups) (e.g. porphyrin or phthalocyanine).

A single core group may itself be or comprise a core metal complex or core cation-centred complex. Where a single core group is or comprises a core metal complex, suitably said core metal complex comprises a core ligand and at least one core metal species (suitably a central metal ion, such as $Mg^{2+}$). Suitably the core ligand comprises one or more atoms or groups (especially electron pair-donating atoms, such as nitrogen, oxygen, and/or sulphur) which are co-ordinated to one or more metal ions, for instance a central metal ion (e.g. $Mg^{2+}$). For example, a macrocyclic single core group may be or comprise a divalent or multivalent:

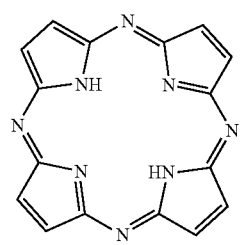 [SMILES: C1=Cc2nc1nc1ccc(nc3nc(nc4ccc(n2)[nH]4)C=C3)[nH]1]

or a salt thereof;

or may be a divalent or multivalent complex or salt thereof, such as:

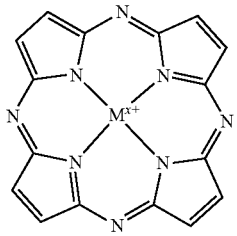

wherein $M^{x+}$ may be any suitable metal cation, especially a divalent metal cation, such as $Mg^{2+}$.

The linker component may comprise a single core, and may be selected from the group including a bridging di-imine (e.g. 4, 4'-bipyridyl, 1,2-dipyridylethene, 1,4-dipyridyltetrazine), a macrocycle (e.g. porphyrin or phthalocyanine) substituted with two or more pyridyl groups (i.e. a poly-pyridyl compound).

Where the [CORE] comprises a single core group, such as that defined above, the linker component suitably comprises Q and W groups with electron pair-donating co-ordinating moieties, such as those containing one or more heteroatoms, such as nitrogen, oxygen, and/or sulphur. However, it will be understood by the skilled person that a single core group may itself comprise one or more, suitably two or more, co-ordinating moieties (e.g. such as those containing one or more heteroatoms, such as nitrogen, oxygen, and/or sulphur) which may themselves be connected to Q and/or W groups which comprise electron pair-accepting moieties.

Suitably, each electron pair-donating Q and/or W group is selected from any suitable group comprising an internal or external heteroatom bearing a lone pair of electrons. Most suitably, the or each electron pair-donating Q and/or W group is independently selected from optionally substituted heterocyclyl, heteroaryl, heterocyclyl(1-6C)alkyl, heteroaryl(1-6C)alkyl, or is selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, or aryl(1-3C)alkyl, substituted with one or more basic or chelating groups, for example, amino, alkylamino, dialkylamino, hydroxyl, (1-6C)alkoxy, carbonyl, immino, thio, thiocarbonyl, etc. In an embodiment, the or each electron pair-donating Q and/or W group is independently selected from pyridyl, aminophenyl, N-(1-3C)alkylaminophenyl, N,N-di(1-3C)alkylaminophenyl, most suitably pyridyl, most suitably 4-pyridyl. For instance, in a particular embodiment, the linker is:

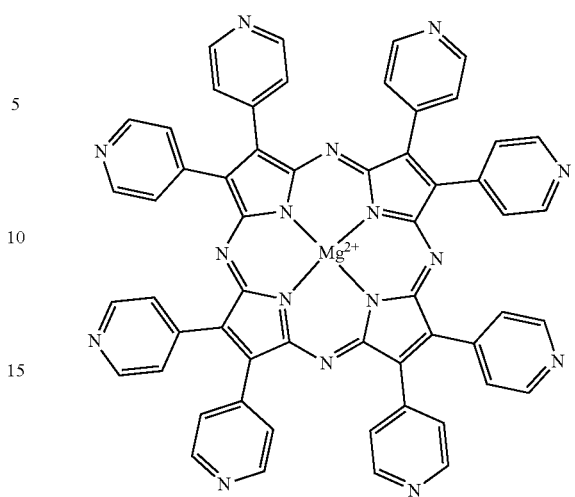

Suitably each pyridyl moiety is capable of co-ordinating with a primary metal complex.

The [CORE] may comprise a plurality of core groups which are indirectly linked together to form the [CORE] via the Q group and/or one or more of the or each of the W group(s). Such a [CORE] is especially relevant where one or more of the Q and/or W groups are metal-centered (which in this case includes boron- and silicon-centered as well as standard metal-centered; e.g. to provide a lewis acid/electron pair-accepting co-ordinating group). Each of such core groups may be independently selected from:

a) a single atom, molecule, ion, or complex containing a single co-ordinating moiety capable of donating two or more lone pairs of electrons (e.g. $O^{2-}$, oxo);

b) a single molecule, ion, or complex (e.g. a multiple heteroatom-containing optionally substituted acyclic, cyclic, polycyclic, or macrocyclic molecule) comprising two or more co-ordinating moieties each capable of independently donating an electron lone pair (e.g. internal heteroatoms, such as nitrogen, oxygen, or sulphur, or external heteroatoms borne by optional substituents) (e.g. carboxylate).

For instance, each core group may be independently selected from a single atom, molecule, ion, or complex that comprises or consists of an oxygen, sulphur, or halo (particularly fluoro or chloro, especially fluoro) atom; most suitably halide (preferably fluoro), oxo, oxide, hydroxide ($OH^-$), (1-6C)alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C)alkylthio, (2-6C)alkenylthio, (2-6C)alkynylthio, thiocarbonyl, heterocyclyl containing at least one internal heteroatom selected from oxygen or sulphur, or (where appropriate) a deprotonated form or salt thereof; wherein any CH, $CH_2$, or $CH_3$ is optionally substituted.

For instance, each core group may be independently selected from a single molecule, ion, or complex comprising two or more co-ordinating moieties that comprise or consist of an oxygen, nitrogen, sulphur, or halo (particularly fluoro or chloro, especially fluoro) atom; most suitably that comprise or consist of two or more groups selected from halide (preferably fluoro), amino, cyano, imino, enamino, (1-6C) alkylamino, di-[(1-6C)alkyl]amino, tri-[(1-6C)alkyl]amino, oxo, oxide, hydroxide ($OH^-$), (1-6C)alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C)alkylthio, (2-6C)alkenylthio, (2-6C)alkynylthio, thiocarbonyl, heterocyclyl containing at least one internal heteroatom selected from nitrogen, oxygen or sulphur, heteroaryl containing at least one internal hetero atom selected from nitrogen, oxygen or sulphur (e.g. pyridyl), or (where appropriate) a deprotonated form or salt thereof; wherein any CH, CH$_2$, or CH$_3$ is optionally substituted.

In a particular embodiment, each core group may be independently selected from a biLIG$^1$ group as defined herein, a biLIG$^2$ group as defined herein, or an optLIG$^1$ group as defined herein. In a particular embodiment, each core group is independently selected from a biLIG$^1$ group as defined herein or a biLIG$^2$ group as defined herein, most suitably a biLIG$^1$ group. Most suitably, the, each, or all of the core groups are a carboxylate or carboxylic acid, most suitably a carboxylate or carboxylic acid defined by the formula —O$_2$CR$_{B1}$ or defined by the formula —O$_2$CR$_{B2}$ (or R$_{B2}$CO$_2^-$), wherein R$_{B1}$ and R$_{B2}$ are suitably as defined herein, though most suitably R$_{B1}$ is (1-5C)alkyl most suitably R$_{B2}$ is pyridyl, aminophenyl, N-(1-3C)alkylaminophenyl, N,N-di(1-3C)alkylaminophenyl, Suitably, where [CORE] comprises a plurality of core groups, the core groups are the same.

By way of example, a linker whose [CORE] comprises a plurality of core groups may be defined by:

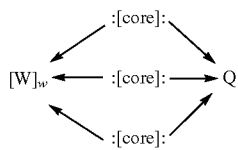

wherein each [core] is a core group independently defined as herein; and W and Q are electron pair-accepting Q and/or W groups as defined herein, and w is as defined herein.

Suitably, the or each electron pair-accepting Q and/or W group is a single atom, molecule, ion, or complex containing a co-ordinating moiety capable of accepting one or more, suitably two or more lone pairs of electrons. Suitably the relevant co-ordinating moiety comprises or consists of a Lewis acidic metal atom (which may include boron or silicon), or a metal atom attached to a leaving group or substitutable ligand. For example, the co-ordinating moiety may be or comprise a group selected from a metal cation (e.g. a divalent metal cation), a Lewis acidic metal compound (suitably a Lewis acid metal compound, such as AlCl$_3$, FeCl$_3$, ZnCl$_2$, etc.), a Lewis acidic metal complex (suitably a Lewis acid or a complex with one or more free co-ordination sites, such as where the metal center has fewer than 18 electrons in its valence shell), and/or a metal compound or complex comprising a leaving group or substitutable ligand (suitably where the conjugate acid of said leaving group or substitutable ligand has a pKa in water at standard ambient temperature and pressure less than or equal to 1, suitably less than or equal to 0, suitably less than or equal to −1, more suitably less than or equal to −5). Suitable metal cations may include divalent (e.g. alkaline earth metal, transition metal (II), or Sn$^{2+}$ cations), trivalent (e.g. Al$^{3+}$, transition metal(III) or f-block metal(III) cations), or tetravalent (Sn$^{4+}$, Pb$^{4+}$, transition metal(IV) or f-block metal (IV) cations), most suitably divalent metal cations. Suitably Lewis acidic metal compounds may include boron compounds (e.g. boron halides, alkoxides, etc.), silicon compounds (e.g. silane, silioxane, silicon halides, etc.), Lewis acidic metal compounds (e.g. AlCl$_3$, FeCl$_3$, ZnCl$_2$, etc.). Suitable Lewis acidic metal complexes or complexes comprising a leaving group or substitutable ligand may include carboxylate complexes such as dimetallic carboxylate complexes (e.g. [M$_2$(O$_2$C—R)$_4$], where M may be Cu$^{2+}$, Ru$^{2+}$, Rh$^{2+}$), trimetallic carboxylate complexes (e.g. [M$_2$M'O(O$_2$CR)$_6$], where M may be a trivalent metal ion, and M' may be a divalent metal ion), hexametallic carboxylate complexes (e.g. [M'$_4$M$_2$O$_2$(O$_2$CR)$_{12}$] where M may be a trivalent metal ion, and M' may be a divalent metal ion), a dodecametallic complex (e.g. [Ni$_{12}$(chp)$_{12}$(O$_2$CMe)$_6$ (H$_2$O)$_6$] where chp=6-chloro-2-pyridonate), metal compounds whose metal center is bonded to a leaving group (e.g. a halide such as chloride, e.g. AlCl$_3$), metal complexes whose metal centre(s) are co-ordinated with a substitutable ligand such as halide, water, a solvent such as THF, pyridine, or even carboxylate. However, in preferred embodiments, the or each electron pair-accepting Q and/or W group is independently a metal cation, suitably independently a divalent or trivalent metal cation, suitably as defined herein. Suitably Q may be different from at least one W group. Suitably, all Q and W groups may be the same.

In a particular embodiment, the linker is selected from:
dimetallic carboxylate complexes (e.g. [M$_2$(O$_2$C$^R$)$_4$] where M=Cu, Ru, Rh);
trimetallic carboxylate complexes (e.g. [M$_2$M'O(O$_2$CR)$_6$] where M=a trivalent metal ion, M'=a divalent metal ion;
hexametallic carboxylate complexes (e.g. [M'$_4$M$_2$O$_2$ (O$_2$CR)$_{12}$] where M=a trivalent metal ion, M' a divalent metal ion);
a dodecametallic complex such as [Ni$_{12}$(chp)$_{12}$(O$_2$C Me)$_6$(H$_2$O)$_6$] where chp=6-chloro-2-pyridonate.

The linker component(s) may be independently selected from:
A monoLIG$^1$ group as defined herein;
a biLIG$^2$ group as defined herein;
an optLIG$^1$ group as defined herein;
a metal complex;
a macrocycle optionally co-ordinate to a metal;
dimetallic carboxylate complexes (e.g. [M$_2$(O$_2$C$^R$)$_4$] where M=Cu, Ru, Rh);
trimetallic carboxylate complexes (e.g. [M$_2$M'O(O$_2$CR)$_6$] where M=a trivalent metal ion, M'=a divalent metal ion;
hexametallic carboxylate complexes (e.g. [M'$_4$M$_2$O$_2$ (O$_2$CR)$_{12}$] where M=a trivalent metal ion, M' a divalent metal ion);
a dodecametallic complex such as [Ni$_{12}$(chp)$_{12}$(O$_2$C Me)$_6$(H$_2$O)$_6$] where chp=6-chloro-2-pyridonate.
a terminal ligand, e.g. H$_2$O, pyridine or a substituted pyridine, where n=1.
bridging di-imine, e.g. 4,4'-bipyridyl, 1,2-dipyridylethene, 1,4-dipyridyltetrazine
other poly-pyridyl ligands, including pyridyls substituted around macrocycles such as porphyrins or phthalocyanines.

Linker may have other solvates or ligands (suitably inert) associated therewith, or may be a salt.

Optional Base Polymeric Component

The eBeam resist composition may comprise a base polymeric component, which is suitably a resist material (e.g. a resist polymer), and thus suitably a radiation-sensitive material which undergoes transformation upon exposure to the relevant radiation (e.g. Ebeam). Suitably base polymeric component that is radiation-exposed (and thus "transformed") has different solubility properties to base polymeric component that is unexposed (and thus "untransformed"), suitably such that selective exposure of the base polymeric component provides a solubility differential allowing for subsequent "development" and selective removal of the exposed or unexposed part(s) of the base polymeric component (depending on whether the resist is positive or negative tone).

The base polymeric component may be any suitable base polymeric component. A variety of base polymeric components are known to those skilled in the art for use in eBeam resist compositions, and any of these may be suitably used (optionally tuned accordingly) depending on the desired properties of the eBeam resist composition. In a particular embodiment, the base polymeric component is an Ebeam resist base polymeric component.

The base polymeric component suitably has a density greater than or equal to 0.8 g/cm$^3$, suitably greater than or equal to 0.9 g/cm$^3$, suitably greater than or equal to 0.95 g/cm$^3$, suitably greater than or equal to 1.0 g/cm$^3$. The base polymeric component suitably has a density less than or equal to 2 g/cm$^3$, suitably less than or equal to 1.5 g/cm$^3$, suitably less than or equal to 1.3 g/cm$^3$, suitably less than or equal to 1.2 g/cm$^3$. Suitably the base polymeric component has a lower density than the secondary electron generator, suitably at least 1.0 g/cm$^3$ lower, suitably at least 2.0 g/cm$^3$ lower.

Suitably the base polymeric component may be selected from the group including: poly(methylmethacrylate), poly (1-naphthyl methacrylate), poly(1-vinylnaphthalene), poly(2,6-napthalenevinylene), poly(2-chlorostyrene), poly(2,6-dichlorostyrene), poly(2-vinylthiophene), poly(N-vinylphthalimide), poly(vinyl phenyl sulphide), polyhydroxystyrene or any suitable mixture or copolymer thereof.

In a particular embodiment, the base polymeric component is poly (methylmethacrylate) (PMMA), suitably with a weight average molecular weight between 10-1500 kDalton (kDa), suitably between 50-1200, suitably 100-1100. Suitably PMMA or any other suitable base polymeric component is used in conjunction with an appropriate cross-linking agent (e.g. dipentaerythriolpentaacrylate DPEPA or pentaerythritoltetraacrylate (PET)), suitably to form a particularly advantageous negative eBeam resist composition.

Suitably the base polymeric component constitutes at least 1 wt % of the eBeam resist composition, suitably at least 5 wt %, suitably at least 10 wt %, suitably at most 70 wt %, suitably at most 55 wt %.

Secondary Electron Generator

The eBeam resist composition may suitably further comprise of a secondary electron generator, suitably one or more secondary electron generators.

Co-pending application PCT/GB2015/050884 (filed on 24 Mar. 2015 by the same Applicants as the present application), which is hereby incorporated by reference, describes eBeam resist compositions comprising such secondary electron generators, and provides extensive experimental data, models (e.g. Monte-Carlo models), and explanations illustrating the salient points and key parameters (such as comparatively high $Z_{eff}$, comparatively high densities, etc.) identified by the inventors as suitably important for viable secondary electron generators. As such, the secondary electron generator in the context of the present invention may be any secondary electron generator described in this co-pending application for use in eBeam resist compositions. Furthermore, relationships between the secondary electron generator and other components that may also be present within the eBeam resist compositions of the present invention (e.g. base polymeric component) also apply to such components of the invention.

For the avoidance of doubt or ambiguity, some key passages of the aforementioned co-pending application are hereby substantially replicated.

The inclusion of a secondary electron generator within an eBeam resist composition allows the generation (and/or amplification) of secondary electrons (something those skilled in the art historically tried to avoid) to be thoroughly exploited during exposure of a resist. Instead of viewing the production of secondary electrons as problematic, and trying to quell them, some resist compositions of the present invention deliberately include a secondary electron generator to promote secondary electron generation. The energy of the secondary electrons is harnessed to allow for increased exposure sensitivity of a resist composition or coating thereof; decreased energy and/or intensity of incident exposure radiation (which in itself reduces damage to the resist from primary radiation); increased write-speed during electron beam exposure; decreased resist-coating thickness; increased aspect ratio; and/or increased resolution in the patterning of the resists.

An additional advantage of the present invention is that any potentially adverse effects of extra secondary electron generation can be mitigated or controlled by the anti-scattering compounds/complexes. As such, the anti-scattering compound/complex and secondary electron generator can synergistically balance one another to allow for optimization of eBeam resist compositions.

This disclosure, in conjunction with the aforementioned co-pending application, equips the skilled person to judiciously select appropriate secondary electron generators, with sufficient secondary electron generating potential, for any particular resist system. The examples and data provided herein and in the aforementioned co-pending application (especially the validated predictive models described therein), provide a highly credible demonstration of the broad applicability of the invention to a range of secondary electron generators. Typically, the secondary electron generators of the invention have one or more desirable characteristics (e.g. sufficient Z or $Z_{eff}$, sufficient density, sufficient "stopping power"/innovation potential, solubility in custody solvent(s) etc).

The technology of the present invention may be adapted for use with either positive or negative tone resists since, generally speaking, a positive resist can be modified to produce a negative resist by techniques well known in the art (e.g. adding a cross-linking agent). Such systems are also described in the aforementioned co-pending application.

Suitably the "effective atomic number ($Z_{eff}$)" is calculated as:

$$Z_{eff} = \Sigma \alpha_i Z_i$$

Where $Z_i$ is the atomic number of the ith element in the compound, and $\alpha_i$ is the fraction of the sum total of the atomic numbers of all atoms in the compound (i.e. the total number of protons in the compound) constituted by said ith element.

The secondary electron generator suitably yields secondary electrons, suitably upon impact with primary electrons from an electron beam.

The secondary electron generator suitably generates secondary electrons, as ionization products, in response to exposure to primary electrons from an electron beam.

The secondary electron generator and/or compound(s) thereof by definition yield more secondary electrons (i.e.

have a higher secondary electron omission yield) than any antiscattering component/complex and/or any base polymeric component, suitably at least by a factor of 2, suitably at least by a factor of 3, suitably at least by a factor of 4.

The secondary electron generator suitably is or comprises a compound having an effective atomic number ($Z_{eff}$) greater than or equal to 15 (where optionally the $Z_{eff}$ calculation excludes any solvates, having a boiling point less than or equal to 150° C. at 100 kPa pressure, associated with said compound, suitably any solvates having a boiling point less than or equal to 120° C. at said pressure, suitably ≤105° C. at said pressure). Suitably this $Z_{eff}$ is greater than or equal to 18, suitably greater than or equal to 23, suitably greater than or equal to 25, suitably greater than or equal to 30, suitably greater than or equal to 32, suitably greater than or equal to 40. Suitably this $Z_{eff}$ is less than or equal to 70, suitably less than or equal to 66, suitably less than or equal to 61, suitably less than or equal to 60, suitably less than or equal to 55. The secondary electron generator or compound(s) thereof suitably has a higher $Z_{eff}$ than the base polymeric component, suitably at least 10 units higher, suitably at least 20 units higher, suitably at least 30 units higher.

Suitably, the secondary electron generator is or comprises a compound having a molecular weight less than or equal to 500 g/mol.

The secondary electron generator suitably is or comprises a metal compound. It cannot be or comprise an elemental metal (i.e. metal(0)). In fact, the resist composition is suitable (substantially) free of any metal (0)). Suitably any metal species of the metal compound are metal ions.

References to the secondary electron generator or compound(s) thereof generally relate to the pre-mixed (i.e. prior to mixing with other components of the resist composition) form thereof (e.g. in terms of any cationic-anionic associations in relevant metal compound(s)), and suitably also relate to the pre-coated, pre-cured, pre-exposed, pre-developed form thereof. It will be appreciated by those skilled in the art that, upon mixing with other components of the resist composition (and/or after coating, curing, exposing, and/or developing), any relevant cations and anions of metal compound(s) may, in some embodiments (though not all), dissociate and possibly become associated with other counterions and/or ligands. Therefore, references to an eBeam resist composition (or indeed a coating, or a cured-, exposed-, or developed-product thereof) suitably indicates an eBeam resist composition (or a coating, or a cured-, exposed-, or developed-product thereof) "formed by" (or derived from) mixing the relevant compound(s) with any other ingredients of the eBeam resist composition or "formed by" curing, exposing, and/or developing the relevant product. It is straightforward for those skilled in the art, using standard techniques, to determine the input compound(s) from a eBeam resist composition or a coated, cured-, exposed-, or developed-product thereof.

The compound(s) of the secondary electron generator suitably has a density greater than that of the base polymeric component. The compound(s) of the secondary electron generator suitably has a density greater than or equal to 1.7 g/cm$^3$, suitably greater than or equal to 2 g/cm$^3$, suitably greater than or equal to 2.5 g/cm$^3$, suitably greater than or equal to 3 g/cm$^3$, suitably greater than or equal to 4 g/cm$^3$, more suitably greater than or equal to 4.1 g/cm$^3$, suitably greater than or equal to 4.5 g/cm$^3$, more suitably greater than or equal to 4.7 g/cm$^3$, most suitably greater than or equal to 5 g/cm$^3$. The compound(s) of the secondary electron generator suitably has a density less than or equal to 9 g/cm$^3$, suitably less than or equal to 8.5 g/cm$^3$, suitably less than or equal to 8 g/cm$^3$. In a particular embodiment, the compound(s) of the secondary electron generator suitably has a density between 3.5 and 8.3 g/cm$^3$. Suitably the density is at least 2 times higher than the density of the antiscattering compound/complex and/or any base polymeric component, suitably at least 3 times higher.

Suitably, the compound(s) of the secondary electron generator have a mean ionization potential (i.e. employing the "stopping power" meaning, suitably as provided by the well-known Bethe equation and the Monte Carlo model described in the aforementioned co-pending application) of ≥200 eV, suitably ≥500 eV.

Suitably the compound(s) has a low mean free path ($\lambda$)—i.e. the distance between successive electron collisions is low. Suitably the compound(s) has a lower mean free path ($\lambda$) than the base polymeric component. Suitably the compound(s) of the secondary electron generator has an elastic mean free path of less than or equal to 900 nm, suitably less than or equal to 100 nm, suitably less than or equal to 50 nm, suitably less than or equal to 825 nm. Suitably the compound(s) of the secondary electron generator has an inelastic mean free path of less than or equal to 825 nm.

Suitably the compound(s) has a high elastic scattering cross-section ($\sigma$)—i.e. the chance of a collision is high. Suitably the compound(s) has a higher elastic scattering cross-section ($\sigma$) than the base polymeric component. Suitably the compound(s) of the secondary electron generator has an elastic scattering cross-section ($\sigma$) of greater than or equal to $7 \times 10^{-19}$ cm/atom, suitably greater than or equal to $1 \times 10^{-18}$, suitably greater than or equal to $2 \times 10^{-17}$, suitably greater than or equal to $4 \times 10^{-18}$, suitably greater than or equal to $7 \times 10^{-18}$. Suitably the antiscattering compound/complex and/or any base polymeric component (or the primary component thereof) has an elastic scattering cross-section ($\sigma$) of less than or equal to $1 \times 10^{-18}$ cm/atom, suitably less than or equal to $7 \times 10^{-19}$ cm/atom. In a particular embodiment, the compound(s) of the secondary electron generator has an elastic scattering cross-section ($\sigma$) of greater than or equal to $7 \times 10^{-19}$ cm/atom whereas the antiscattering compound/complex and/or any base polymeric component (or the primary component thereof) has an elastic scattering cross-section ($\sigma$) of less than or equal to $7 \times 10^{-19}$ cm/atom. In a particular embodiment, the compound(s) of the secondary electron generator has an elastic scattering cross-section ($\sigma$) of greater than or equal to $2 \times 10^{-18}$ cm/atom whereas the antiscattering compound/complex and/or any base polymeric component (or the primary component thereof) has an elastic scattering cross-section ($\sigma$) of less than or equal to $7 \times 10^{-19}$ cm/atom.

Any, some, or all of the definitions relating to any of the aforesaid parameters (e.g. $Z_{eff}$, density, mean free path, scattering cross-sectioning, mean ionization potential/stopping power, electron emission yield) may suitably relate to a form of the compound(s) which excludes any solvates having a bp≤515° C. at 100 kPa pressure, suitably ≤120° C., suitably ≤105° C., e.g. excluding hydrates. This is reasonable since such solvates may be removed during processing.

Suitably any metal compound(s) of the secondary electron generator comprises a metal species which has an oxidation state of +1 or higher, suitably +2 or higher, suitably +3 or higher. Suitably any metal compound(s) of the secondary electron generator comprises a metal species which has an oxidation state of +4 or lower. Suitably any metal compound(s) of the secondary electron generator comprises a metal species which has an oxidation state of +3.

Suitably any metal compound(s) of the secondary electron generator comprises a single metal species or otherwise a predominant metal species (i.e. metal species constituting at least 50 wt % of the total metal species, suitably at least 80 wt %, suitably at least 90 wt %, suitably at least 95 wt %). The metal species or metal ions (whether single or predominant) of such metal compound(s) of the secondary electron generator suitably have an oxidation state of +1 or higher, suitably +2 or higher, suitably +3 or higher. The metal species or metal ions (whether single or predominant) of such metal compound(s) of the secondary electron generator suitably have an oxidation state of +4 or lower. The metal species or metal ions (whether single or predominant) of such metal compound(s) of the secondary electron generator suitably have an oxidation state of +3. In an embodiment, the metal species or metal ions of such metal compound(s) of the secondary electron generator have an oxidation state of +2.

Any metal compound(s) of the secondary electron generator suitably comprises a metal species (or a single or predominant metal species) having an atomic number (Z) greater than or equal to 21 (i.e. scandium or heavier). Any metal compound(s) of the secondary electron generator suitably comprises a metal species (or a single or predominant metal species) having an atomic number (Z) greater than or equal to 22 (i.e. titanium or heavier). Any metal compound(s) of the secondary electron generator suitably comprises a metal species (or a single or predominant metal species) having an atomic number (Z) greater than or equal to 39 (i.e. yttrium or heavier). Any metal compound(s) of the secondary electron generator suitably comprises a metal species (or a single or predominant metal species) having an atomic number (Z) greater than or equal to 49 (i.e. indium or heavier). Any metal compound(s) of the secondary electron generator suitably comprises a metal species (or a single or predominant metal species) having an atomic number (Z) greater than or equal to 57 (i.e. lanthanum or heavier). Any metal compound(s) of the secondary electron generator suitably comprises only metal species (or a single or predominant metal species) having an atomic number (Z) less than or equal to 82 (i.e. lead or lighter). Any metal compound(s) of the secondary electron generator suitably comprises only metal species (or a single or predominant metal species) having an atomic number (Z) less than or equal to 80 (i.e. mercury or lighter). The metal species of the metal compound(s) may suitably be a d-block, p-block, or f-block metal species, or a mixture thereof. Suitably the metal compound(s) is non-radioactive.

Suitably the secondary electron generator is or comprises a metal halide, or a complex thereof (e.g. $HAuCl_4$). Suitably the secondary electron generator is a metal (I), metal (II), metal (III), or metal (IV) halide, or a complex thereof. Suitably the secondary electron generator is a metal (III) halide or a metal(I) halide, or a complex thereof. Suitably the secondary electron generator is a metal chloride, suitably a metal (I), metal (II), metal (III), or metal (IV) chloride. Suitably the secondary electron generator is a metal chloride, suitably a metal (I) or a metal (III) chloride.

The secondary electron generator may be a metal(II) halide (e.g. $HgCl_2$), or a complex thereof. In a particular embodiment, the secondary electron generator is a metal(II) chloride.

The secondary electron generator may suitably be selected from the group including, $AlCl_3$, $TiCl_3$, $TiCl_4$, $CrCl_3$, $GaCl_3$, $YCl_3$, $MoCl_3$, $AgCl$, $InCl_3$, $SbCl_3HfCl_3TaCl_3$, $WCl_3$, $OsC_{13}$, $IrCl_3$, $AuCl$, $AuCl_3$, $HAuCl_4$, $HgCl_2$, $CeCl_3$, $NdCl_3ErCl_3$, $OsO_4$ or any suitable complex (including any suitable salt or salt complex) thereof. In a particular embodiment, the metal compound is chloroauric acid (hydrogen chloroaurate, $HAuCl_4$) or the hydrate thereof ($HAuCl_4.4H_2O$). In another embodiment, the metal compound is sodium chloroaurate ($NaAuCl_4$) or a hydrate thereof (e.g. $NaAuCl_4.2H_2O$). In a particular embodiment, the metal compound is a mercury dichloride.

In a particular embodiment, the secondary electron generator is a gold-based compound (preferably a compound comprising gold(III) species). In a particular embodiment, the secondary electron generator is a mercury-based compound (preferably a compound comprising mercury(II) species). In a particular embodiment, the secondary electron generator is an indium-based compound (preferably a compound comprising indium(III) species). In a particular embodiment, the secondary electron generator is an yttrium-based compound (preferably a compound comprising yttrium (III) species). In a particular embodiment, the secondary electron generator is a titanium-based compound (suitably a compound comprising titanium (IV) species).

The secondary electron generator is suitably an anhydrous metal compound. Suitably the metal compound of the secondary electron generator has a water content of less than or equal to 0.1 wt %, suitably less than or equal to 0.05 wt %, suitably less than or equal to 0.01 wt %, suitably less than or equal to 0.001 wt %. It is thought that higher water content can have an adverse effect on the secondary electron generation capacity, possible by virtue of a density effect. However, in some embodiments, a secondary electron generator metal compound may be a solvate, e.g. a hydrate.

The secondary electron generator is suitably non-particulate, especially within the eBeam resist composition where it is suitably dissolved within the solvent. The secondary electron generator is suitably soluble in the eBeam resist composition. This enables its uniform distribution in the ultimately applied resist coating, and may facilitate metal-organic nanocomposite coating formation.

Any of the aforementioned metal compound(s) may be a complex thereof.

Suitably the secondary electron generator constitutes at least 1 wt % of the resist composition, suitably at least 5 wt %, suitably at least 10 wt %, suitably at most 70 wt %, suitably at most 55 wt %.

The secondary electron generator may be a single compound (or complex) or a mixture of compounds (and/or complexes). References herein to "a secondary electron generator" may refer to a single compound, which is thus designated as the secondary electron generator.

Though the one or more secondary electron generators may be considered a constituent part (or ingredient of) the eBeam resist composition and be defined by reference to the "secondary electron ingredient" used (i.e. added as an ingredient) in the formation of the overall resist composition, the skilled person will understand that chemical reactions and/or molecular associations (e.g. co-ordination/dative bonds) may mean that the secondary electron generator exists in a different form within the resist composition (e.g. co-ordinated within a complex) than prior to its inclusion therein. In fact, in many preferred embodiments, within the resist composition itself the secondary electron generator exists in a co-ordinated form and forms a complex with one or more other ingredients of the resist composition. For instance, mercury dichloride may become associated and/or co-ordinate with the antiscattering compound/complex.

Most suitably, the antiscattering compound/complex forms one or more dative bonds with the secondary electron generator. Suitably, one or more of the ligands, in particularly one or more lone-pair-bearing heteroatoms thereof, co-ordinates with the secondary electron generator (preferably to a central metal ion thereof). In particular embodiments, the secondary electron generator is co-ordinated to the primary metal complex (and/or additional metal complex), suitably attached to the outside thereof. Where there are a plurality of primary metal complexes (or additional metal complexes) within the antiscattering compound/complex, suitably each primary metal complex is co-ordinated to one or more secondary electron generator(s).

Such an intimate association between a secondary electron generator and an anti-scattering compound can radically improve the overall performance and balance of an eBeam resist composition. In this manner, the antiscattering compound/complex may serve its function, including localizing of the incident eBeam, whilst local secondary electron generator(s) can improve overall write speeds without unduly compromising resolution.

Suitably, a molar ratio of secondary electron generator to anti-scattering compound is a function of the stoichiometry of the primary metal complex within the anti-scattering compound, especially where the secondary electron generator becomes bonded to the primary metal complex or a ligand thereof. As such, the molar ratio of the secondary electron generator to primary metal complex(es) is suitably between 0.01:1 and 12:1, more suitably between 0.5:1 and 8:1, most suitably between 1:1 and 4:1.

Scattering Compound

The eBeam resist composition may suitably further comprise of a scattering compound, suitably one or more scattering compounds.

The inclusion of a scattering compound within an eBeam resist composition allows electrons to be scattered but in a controlled manner by virtue of the antiscattering compound. Suitably, the eBeam focusing effect of the antiscattering compound acts synergistically with the scattering compound to optimize the balance between focusing and scattering to thereby achieve high resolution imaging at reasonable write-speeds.

The scattering compound suitably is or comprises a compound having an effective atomic number ($Z_{eff}$) less than or equal to 15 (where optionally the $Z_{eff}$ calculation excludes any solvates, having a boiling point less than or equal to 150° C. at 100 kPa pressure, associated with said compound, suitably any solvates having a boiling point less than or equal to 120° C. at said pressure, suitably ≤105° C. at said pressure). Suitably this $Z_{eff}$ is less than or equal to 10, suitably less than or equal to 7.

The scattering compound m suitably has a density greater than or equal to 0.8 g/cm³, suitably greater than or equal to 0.9 g/cm³, suitably greater than or equal to 0.95 g/cm³, suitably greater than or equal to 1.0 g/cm³. The base polymeric component suitably has a density less than or equal to 2 g/cm³, suitably less than or equal to 1.5 g/cm³, suitably less than or equal to 1.3 g/cm³, suitably less than or equal to 1.2 g/cm³. Suitably the base polymeric component has a lower density than the secondary electron generator, suitably at least 1.0 g/cm³ lower, suitably at least 2.0 g/cm³ lower.

Suitably the scattering compound is an organic compound. Suitably the scattering compound comprises carbon and hydrogen atoms.

Most suitably, the scattering compound comprises one or more atoms capable of datively co-ordinating with the anti-scattering compound/complex, suitably with a metal centre of the anti-scattering compound, most suitably with a metal centre of a primary metal complex and/or additional metal complex. Suitably, the scattering compound comprises one or more lone-pair bearing heteroatoms, for instance, one or more heteroatoms selected from oxygen or nitrogen. The scattering compound may additional comprise one or more halogen atoms.

Most suitably, the scattering compound comprises one or more electron-containing π- and/or p-orbitals, suitably two or more, more suitably three or more thereof. Suitable electron-containing p-orbitals, may include electron lone pair(s), for instance, such as those localized on heteroatoms such as oxygen and/or nitrogen. Electron-containing π-orbitals may, for example, include π-bonds or π-systems (whether aromatic or non-aromatic). Such π-bonds may include those of alkene and/or alkyne moieties. Such π-systems may include those of optionally-substituted phenyl moieties and such like. Such π-bonds and π-systems are particularly appropriate for scattering electrons from an eBeam.

The combination of lone-pair-bearing heteroatoms alongside one or more electron containing π-bonds or π-systems (especially π-bonds, most suitably terminal π-bonds) is particular potent in the context of the invention, since the combination increases the effective scattering cross-section (essentially rendering them better attenae for primary electrons) and propensity for scattering whilst also increasing the ability of the scattering compound to effectively co-ordinate to the antiscattering compound to thereby enable synergistic action between the two.

Suitably, the scattering compound comprises one or more alkene and/or alkyne moieties, suitably two or more thereof. Suitably, the scattering compound comprises one or more alkene moieties, suitably two or more thereof. Suitably, the scattering compound comprises one or more terminal alkene moieties (i.e. at a chain terminus), suitably two or more thereof.

Suitably, the scattering compound comprises one or more internal (i.e. non-terminal) lone-pair-bearing heteroatoms.

Suitably the scattering compound is an organic compound comprising two or more alkene moieties, suitably two or more terminal alkene moieties.

In a particular embodiment the scattering compound is selected from the group consisting of: diallylamine, diallylamine, triallylamine, trans trans farnesyl bromide, Pentraerythritol tetraacrylate (PET). In a particular embodiment, the scattering compound is selected from the group consisting of:

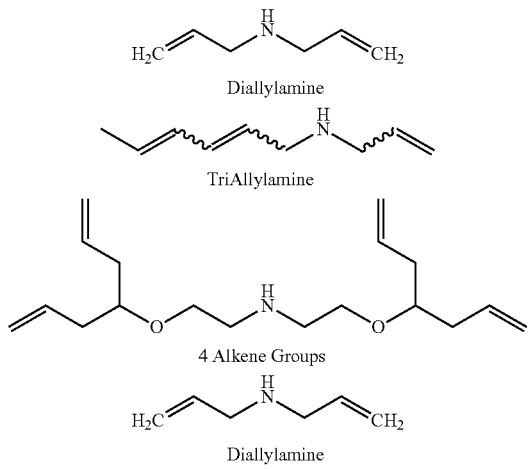

-continued

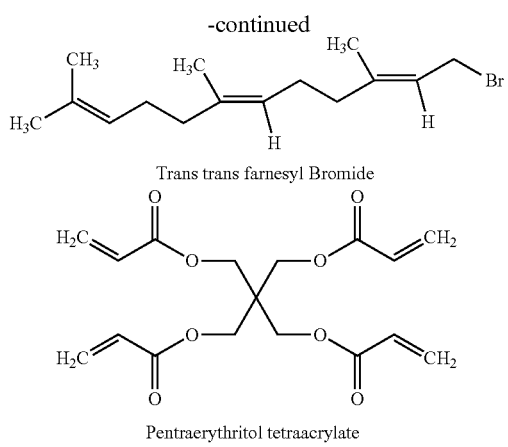

Trans trans farnesyl Bromide

Pentaerythritol tetraacrylate

Though the one or more scattering compounds may be considered a constituent part (or ingredient of) the eBeam resist composition and be defined by reference to the "scattering compound ingredient" used (i.e. added as an ingredient) in the formation of the overall resist composition, the skilled person will understand that chemical reactions and/or molecular associations (e.g. co-ordination/dative bonds) may mean that the scattering compound exists in a different form within the resist composition (e.g. co-ordinated within a complex) than prior to its inclusion therein. In fact, in many preferred embodiments, within the resist composition itself the scattering compound exists in a co-ordinated form and forms a complex with one or more other ingredients of the resist composition.

Most suitably, the antiscattering compound/complex forms one or more dative bonds with the scattering compound. Suitably, the scattering compound co-ordinates (suitably via electron lone pairs, for instance residing on a hetero atom thereof, and/or one or more pi-systems thereof) with one or more of the metal centres, in particularly one or more metal centres of a primary metal complex, of the antiscattering compound/complex. As such, suitably the scattering compound may be co-ordinated within a metal cage of the primary metal complex. Such binding within a primary metal complex is particularly useful in achieving an optimal balance between scattering, antiscattering, and focusing. In particular embodiments, the scattering compound is co-ordinated to the primary metal complex (and/or additional metal complex), suitably attached to the inside thereof. Where there are a plurality of primary metal complexes (or additional metal complexes) within the antiscattering compound/complex, suitably each primary metal complex may be co-ordinated with one or more scattering compounds.

Such an intimate association between a secondary electron generator and an anti-scattering compound can dramatically improve the overall performance and balance of an eBeam resist composition. In this manner, the antiscattering compound/complex may serve its function, including localizing of the incident eBeam, whilst localized/harnessed scattering compound(s) can improve overall write speeds without unduly compromising resolution.

Suitably, a molar ratio of scattering compound to antiscattering compound is a function of the stoichiometry of the primary metal complex within the anti-scattering compound, especially where the scattering compound becomes bonded within the primary metal complex. As such, the molar ratio of the scattering compound to primary metal complex(es) is suitably between 0.01:1 and 2:1, more suitably between 0.5:1 and 1.5:1, most suitably about 1:1.

Suitably, any scattering compound is present within an eBeam resist composition (whether or not attached to the antiscattering agent) at a weight concentration of 0.5 to 40 wt %, more suitably 5 to 30 wt %, more suitably 10 to 25 wt %, more suitably 15 to 20 wt %. Suitably, the weight ratio of any scattering compound to antiscattering compound (with or without an associated secondary electron generator) is between 10:1 to 1:100, more suitably between 1:1 and 1:10, most suitably about 1:5.

Optional Additional Components

A cross-linking agent may be present in negative eBeam resist compositions, or coatings or pattern layers derived therefrom, especially where a base polymeric component is present in addition to the anti-scattering compound.

A cross-linking agent suitably facilitates formation of a developer-insoluble resist following radiation exposure. It is thought that though the base polymeric component and/or the anti-scattering compound may undergo initial scission upon exposure to radiation, subsequent reaction(s) with the cross-linking agent may reconstitute the base polymeric component and/or anti-scattering compound (at least to a degree) into a transformed component which is developer-insoluble, whilst the unexposed base polymeric component and/or anti-scattering compound may remain developer-soluble.

Any suitably cross-linking agent may be used, though most advantageously the cross-linking agent is judiciously selected for maximum compatibility with the radiation source and the resist composition and the components thereof.

In preferred embodiments, especially where eBeam radiation is used exposing, the cross-linking agent is dipentaerythriolpentaacrylate (DPEPA) or pentaerythritoltetraacrylate (PET), or any other suitable miscible multi-functional acrylate and/or mixtures thereof. Other crosslinking agents include epoxies (SU8) or if the copolymer used is for example polyhydroxystyrene a suitable photacid generator maybe employed to bring about a solubility change.

Any suitable solvent system may be employed as a diluent for the eBeam resist composition. The solvent may, in fact, be a combination of one or more solvents. As such, references herein to a solvent may, unless stated otherwise, optionally include a mixture of solvents. Suitably the solvent dissolves the (combination of) solute components of the eBeam resist composition to thereby form a solution. Suitably the solvent is used within the eBeam resist composition in a proportion which dissolves the (combination of) non-solvent components therein to thereby form a solution. The eBeam resist composition is suitably a solution.

The dilution level can be varied to suit the system, and will depend entirely on the combination of ingredients, any solubility constraints, and the desired dilution level (e.g. for optimal casting of the resist). Suitably, however, the weight ratio of solvent(s) to base polymeric component is between 10:1 and 100:1.

Suitably solvents include hexane, heptane, pentane, anisole, toluene, xylene, n-propanol, iso-propanol, acetone, dichloromethane, butyl acetate, tetrahydrofuran, dimethylformamide, ethyl acetate, diethyl ether, or a combination thereof. In a particular embodiment, the solvent includes a non-polar organic solvent (suitably one that is substantially immiscible with water, for example, hexane, toluene, heptanes), suitably in a weight ratio of 1:1 to 1:100.

Specific Embodiments

Suitably, the anti-scattering compound comprises one or more, suitably two or more, polymetallic cages co-ordinated to a central linker. In preferred embodiments, the polymetallic cage(s) comprise two or more different types of metal species, suitably two or more different metals. Suitably, the polymetallic cage(s) comprise at least one trivalent metal species (e.g. $M^1$ as above) and at least one divalent metal species (e.g. $M^2$ above). Suitably the trivalent metal species is or comprises $Cr^{3+}$ and suitably the divalent species is or comprises $Ni^{2+}$. Suitably the ratio of $Cr^{3+}$ to $Ni^{2+}$ in the or each polymetallic cage is between 10:1 and 2:1, more suitably between 9:1 and 6:1, most suitably about 7:1. The polymetallic cage(s) suitably comprise one or more bridging ligands which form a covalent bridge between two or more metal species within the cage(s)—most suitably the bridging ligands include carboxylate (or carboxylic acid) ligands. Suitably the or each polymetallic cage is co-ordinated to a central linker via one or more metal species (suitably via just one metal species) of the polymetallic cage(s) (e.g. where the polymetallic cage acts as a Lewis acid or electron-pair acceptor, and the linker acts as a Lewis base or electron-pair donator); or the or each polymetallic cage is co-ordinated to a central linker via one or more of the ligand(s) of the polymetallic cage(s) (e.g. where the polymetallic cage acts as a Lewis base or electron-pair donator, and the linker acts as a Lewis acid or electron-pair acceptor).

In a particular embodiment, the anti-scattering compound comprises units defined by a hybrid complex of Formula B:

$(PMC)_p(LINK)_l$ wherein:
PMC is a polymetallic cage comprising a trivalent metal species $M^1$ and a divalent metal species $M^2$ in an $M^1:M^2$ molar ratio of between 10:1 and 2:1 (suitably about 7:1), p is an even integer between 2 and 8; and wherein LINK is a linker component, suitably as defined herein, and l is 1.

In a particular embodiment, PMC is selected from $[M^1_xM^2_y(monoLIG^1)_{m1}(O_2CR_{B1})_{16-b2}(O_2CR_{B2})_{b2}]$, $[M^1_{8-y}M^2_yF_8(O_2CR_{B1})_{16-b2}(O_2CR_{B2})_{b2}]$, or $[Cr_7NiF_8(O_2CR_{B1})_{16-b2}(O_2CR_{B2})_{b2}]$; and LINK is defined by Q-[CORE]-[W]$_w$; wherein [CORE] comprises a plurality of core groups which are indirectly linked together to form the [CORE] via the Q group and/or one or more of the or each of the W group(s), wherein one or more of the Q and/or W groups are metal-centered to provide a lewis acid/electron pair-accepting co-ordinating group capable of co-ordinating with lewis base/electron pair-donating co-ordinating group(s) of the PMC. In a particular embodiment, LINK is selected from any of the following:
dimetallic carboxylate complexes (e.g. $[M_2(O_2C^R)_4]$ where M=Cu, Ru, Rh);
trimetallic carboxylate complexes (e.g. $[M_2M'O(O_2CR)_6]$ where M=a trivalent metal ion, M'=a divalent metal ion;
hexametallic carboxylate complexes (e.g. $[M'_4M_2O_2(O_2CR)_{12}]$ where M=a trivalent metal ion, M' a divalent metal ion);
a dodecametallic complex such as $[Ni_{12}(chp)_{12}(O_2CMe)_6(H_2O)_6]$ where chp=6-chloro-2-pyridonate.

In a particular embodiment, the anti-scattering compound is as defined in the specific embodiments above, wherein the primary metal complex is defined by or comprise units defined by the Formula IIb:

$[Cr_7NiF_8(O_2CR_{B1})_{16-b2}(O_2CR_{B2})_{b2}]$;

wherein $R_{B1}$, $R_{B2}$, and b2 are as defined herein, though most suitably $R_{B1}$ is t-butyl and $R_{B2}$ if present is 4-pyridyl; and LINK is selected from the group including:
A dimetallic carboxylate complex (e.g. $[M_2(O_2C^R)_4]$ where M=a divalent metal ion;
A dimetallic carboxylate complex (e.g. $[MM'(O_2C^R)_4]^+$ where M=a divalent metal ion; M'=a trivalent metal ion;
A trimetallic carboxylate complex (e.g. $[M_3O(O_2CR)_6]^+$ where M=a trivalent metal ion;
A trimetallic carboxylate complex (e.g. $[M_2M'O(O_2CR)_6]$ where M=a trivalent metal ion, M'=a divalent metal ion;
A hexametallic carboxylate complex (e.g. $[M'_4M_2O_2(O_2CR)_{12}]$ where M=a trivalent metal ion, M' a divalent metal ion);
a dodecametallic complex such as $[M_{12}(chp)_{12}(O_2CMe)_6(H_2O)_6]$ where chp=6-chloro-2-pyridonate, where M=Ni or Co.

In a particular embodiment, PMC is selected from $[M^1_xM^2_y(monoLIG^1)_{m1}(O_2CR_{B1})_{16}]$ or $[Cr_7NiF_8(O_2CR_{B1})_{16}]$; and LINK is defined by Q-[CORE]-[W]w; wherein [CORE] comprises a single core group to which the Q group and the or each of the W group(s) are commonly attached; each Q and/or W group is independently selected from electron pair-donating co-ordinating moieties, such as those containing one or more heteroatoms, such as nitrogen, oxygen, and/or sulphur. In a particular embodiment, [CORE] is a macrocycle and each Q and W group is as defined herein.

In a particular embodiment, the anti-scattering compound is as defined in the specific embodiments above, wherein the primary metal complex is defined by or comprise units defined by the Formula IIc:

$[Cr_7NiF_8(O_2CR_{B1})_{16}]$;

wherein $R_{B1}$ is as defined herein, though most suitably $R_{B1}$ is t-butyl; and
LINK is a single molecule, ion, or complex comprising two or more co-ordinating moieties, each co-ordinating moiety being capable of accepting or donating one or more lone pairs of electrons, though most suitably LINK is:

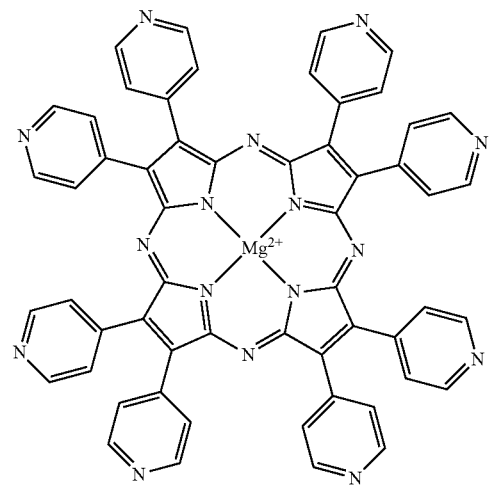

In a particular embodiment, PMC is selected from [M8-yM2yF3(O2CRB1)15(Gluc-NH—RO1)], [Cr7NiF3(O2CRB1)15(Gluc-NH—RO1)]; and LINK is defined by Q-[CORE]-[W]w; wherein [CORE] comprises one or more core group to which the Q group and the or each of the W group(s) are commonly attached; each Q and/or W group is independently selected from electron pair-donating co-ordinating moieties, such as those containing one or more heteroatoms, such as nitrogen, oxygen, and/or sulphur. In a particular embodiment, [CORE] is a macrocycle and each Q and W group is as defined herein.

In a particular embodiment, the anti-scattering compound is as defined in the specific embodiments above, wherein the primary metal complex is defined by or comprise units defined by the Formula IIIa:

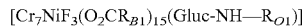

[Cr$_7$NiF$_3$(O$_2$CR$_{B1}$)$_{15}$(Gluc-NH—R$_{O1}$)]

wherein $R_{B1}$ and Gluc-NH—$R_{O1}$ are as defined herein, though most suitably $R_{B1}$ is t-butyl and $R_{O1}$ is methyl; and LINK is selected from the group including:
- a terminal ligand, e.g. H$_2$O, pyridine or a substituted pyridine, where n=1.
- A bridging di-imine, e.g. 4,4'-bipyridyl, 1,2-dipyridylethene, 1,4-dipyridyltetrazine
- another poly-pyridyl ligand, e.g. including pyridyls substituted around macrocycles such as porphyrins or phthalocyanines;

though most suitably LINK is:

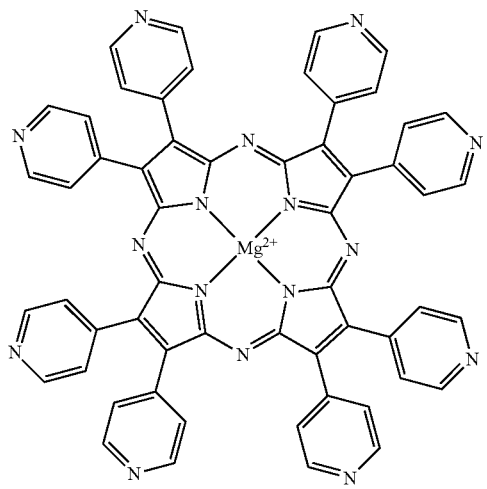

Suitably in such embodiments, the antiscattering compound has a density less than or equal to 1.2 g/cm$^3$, a molecular weight greater than or equal to 10,000, and also suitably a solubility in hexane (at SATP) of at least 10 mg/g.

In a particular embodiment, an eBeam resist coating (formed from the eBeam resist composition) of the invention consists essentially of the antiscattering compound. However, the skilled person may judiciously adjust the balance of components within the eBeam resist composition depending on the required performance.

In preferred embodiments, an eBeam resist coating (formed from the eBeam resist composition) of the invention may have any one or more of the properties (e.g. mean free path, scattering cross-section, density, molecular weight) defined herein in relation to the antiscattering compound itself. As such, in some embodiments where an eBeam resist coating (and its corresponding eBeam resist composition) comprises one or more components in addition to the antiscattering compound, the presence of said one or more components does not compromise these properties.

Electron-Beam Lithography Using eBeam Resist Compositions of the Invention

The present invention provides a method of performing electron-beam lithography, the method comprising:
  i) providing an (eBeam) resist-coated substrate as defined herein or applying an (eBeam) resist coating to a substrate;
  ii) exposing part(s) of the (eBeam) resist coating to (electron beam) radiation to provide an exposed (eBeam) resist coating;
  iii) developing the exposed (eBeam) resist coating to generate an (eBeam) resist pattern layer, the (eBeam) resist pattern layer comprising: developer-insoluble coating portions of the (eBeam) resist coating (i.e. ridges); and an array of grooves extending through the (eBeam) resist pattern layer;
  iv) optionally modifying the substrate, substrate surface, or part(s) thereof, underlying the (eBeam) resist pattern layer;
  v) optionally removing the (eBeam) resist pattern layer to provide a modified substrate;
  vi) optionally repeating, one or more times, step iv) and/or steps i)-v) (optionally with an alternative resist coating, such as a photoresist, instead of the eBeam resist coating; and optionally using alternative radiation during exposure, such as visible or ultraviolet light, instead of electron beam radiation) upon the modified substrate.

Step (i) of the method is optionally preceded by performing steps (i) to (vi) (i.e. pre-steps (i)-(vi)), optionally repeated one or more times, using either an eBeam resist coating or an alternative resist coating and using either electron beam radiation or alternative radiation during exposure;

The eBeam resist coating suitably comprises or consists essentially of an optionally dried and/or cured eBeam resist composition; wherein the eBeam resist composition comprises an anti-scattering compound.

The invention further provides an imaged substrate obtainable by, obtained by, or directly obtained by this method.

Such methods may be used for imaging, for preparing patterned substrates, for selectively modifying a surface of a substrate, and for manufacturing a multi-layered substrate (e.g. integrated circuit), suitably as defined herein.

In a particular embodiment, the above method is used in the production of an integrated circuit (which is an example of a multi-layered substrate) or plurality thereof (e.g. on a wafer). The skilled person is well aware of standard manufacturing processes used in the production of integrated circuits. The method of the invention may be used to produce one or more layers of an integrated circuit, and in some embodiments may be used to produce all layers. However, since high resolution may only be required for one or some resolution-critical layers (e.g. if resolution is not important for every layer), alternative lithographic methods may be involved in the production of other layers (e.g. photolithography). In this manner, electron beam lithography may complement other forms of lithography (e.g. photolithography) in the fabrication of integrated circuits.

Substrate

The substrate upon which electron-beam lithography is performed may be any suitable substrate.

The substrate is suitably a single solid body, or a portion thereof. The substrate is suitably in the form of a (substantially rigid) plate, wafer, or sheet, most suitably a wafer.

Since, in accordance with the methods of the invention, certain processing steps may be "repeated" (including steps which refer to a "substrate"), the "substrate" may refer to the initial "input substrate" (i.e. before any method steps of the invention are performed) or a "modified substrate" (following certain method steps). As such, in principle the "substrate" may be any substrate (including partially fabricated products or integrated circuits) which is suitable for processing via electron-beam lithography.

The substrate (whether the input substrate or modified substrate) is suitably either part of a pre-formed resist-coated substrate or is a substrate to which a resist coating is applied (e.g. in step i) of many of the methods disclosed herein). As such, the substrate may be defined (whether in terms of its nature, parameters, material form, etc.) without reference to the resist coating itself. The substrate or modified substrate may be planarized prior to coating with a resist coating.

In some embodiments, the substrate (or part thereof) to which the method(s) of the invention is applied is incorporated into a final (printed) product (e.g. integrated circuit), though this may itself be incorporated into products (e.g. circuit boards and/or electronic devices). In other words, the "imaged substrate" may be or become a consumable product or may otherwise be or become incorporated into a consumable product. Such consumable products include an integrated circuit, integrated circuit die or wafer, integrated circuit package, a circuit board, or an electronic device or system.

In some embodiments, however, the substrate (or part thereof) to which the method(s) of the invention is applied is not incorporated into a final (printed) product (e.g. integrated circuit) but is rather incorporated into a tool, for example a lithographic mask (whether positive or negative) such as a photomask for use in photolithography, used to produce such a final (printed) product. In other words, the "imaged substrate" may be a tool for producing a consumable product. As such, the advantages of the invention (e.g. high resolution) may be imparted to a lithographic tool (e.g. a lithographic mask with high-resolution detail), which may thereafter be imparted to a final (printed) product made using said tool. As such, ultra high-resolution electron beam lithography (as per the invention) may be used to produce a corresponding ultra high-resolution lithographic mask (e.g. photomask) which may in turn be used in ultra high-resolution lithography, such as photolithography, to produce ultra high-resolution integrated circuits (or one or more ultra high-resolution layers thereof). As such, the invention provides a method of manufacturing a lithographic mask and a lithographic mask (e.g. photomask) as defined herein; as well as a use of such a lithographic mask in the production of an integrated circuit, integrated circuit die or wafer, integrated circuit package, a circuit board, or an electronic device or system).

The substrate suitably comprises or consists essentially of a substrate base material.

The substrate base material may comprise or consist essentially of any suitable material for use in the method(s) of the invention. The substrate base material (and suitably also the substrate base layer as a whole) is suitably a single substance (element or compound) or a single composite material (mixture of two or more elements and/or compounds). However the substrate base material may be a multi-layered composite material.

Where the substrate (or part thereof) is not incorporated into a final (printed) product (e.g. integrated circuit) but is rather incorporated into a tool (e.g. lithographic mask), suitably the substrate base material is a material appropriate for the tool in question. Suitably, the substrate base material is a lithographic plate (potentially comprising one or more layers of one or more materials). Where the tool is a lithographic mask (e.g. a photomask), the substrate base material may be (substantially) transparent or (substantially) non-transparent to the relevant radiation (e.g. UV or visible light, if a photomask), depending on the ultimate nature of the mask. For instance, a substrate base material that is (substantially) transparent to the relevant radiation may be used where a lithographic mask is formed through generating opaque regions on the substrate base material during the mask manufacturing process (e.g. non-removed resist coating may provide opaque regions, or opaque regions may be generated by judicious surface modifications). Alternatively, a substrate base material that is (substantially) opaque or non-transparent to the relevant radiation may be used where a lithographic mask is formed through generating transparent regions on the substrate base material during the mask manufacturing process (e.g. where the process involves surface modifications which remove portions of substrate base material—e.g. via etching). In other embodiments, the substrate base material may be a laminated composite, comprising at least one layer of material which is (substantially) transparent to the relevant radiation (e.g. glass, transparent plastics) and at least one layer of material which is (substantially) opaque to the relevant radiation—under such circumstances, the process of manufacturing a lithographic mask may involve removal or regions of opaque material to leave transparent portions.

Lithographic masks, such as photomasks may comprise a layer of transparent fused silica covered by a pattern defined with a chrome metal-absorbing film, the pattern having been generated in accordance with methods of the invention to thereby afford high resolution patterns. Such masks may then be used in lithographical methods of the invention to produce high-resolution products, such as integrated circuits.

Where the substrate (or part thereof) is to be incorporated into a final (printed) product, suitably the substrate base material is a material appropriate for the product in question. In a particular embodiment, the base substrate is an electronic component substrate. A suitable electronic component substrate may include a substrate comprising or be (substantially) made of silicon (e.g. a silicon wafer), copper, chromium, iron, aluminium, or glass. The base substrate may itself comprise a surface coating, e.g. as an undercoat to the resist coating to be applied thereto. In a particular embodiment the base substrate is a silicon substrate. The substrate base material may comprise or consist essentially of a semiconductor material, most suitably silicon, most suitably a single monolithic silicon crystal. Most suitably, the substrate base layer is a silicon wafer. Suitably, where the resist coatings and compositions of the invention are used in the fabrication of integrated circuits, the input substrate may be a partially-fabricated integrated circuit, wherein some layers of the integrated circuit have already been formed (optionally with or without using the resist coating or composition of the invention—other layers may be formed using traditional IC fabrication techniques, such as standard photolithography). Furthermore, after the eBeam resist coatings of the invention have been used (and suitably removed) during the fabrication of part of an integrated circuit, further layers of the integrated circuit may be formed (optionally with or without using the eBeam resist coating or composition of the invention—again other layers may be formed using traditional IC fabrication techniques, such as standard photolithography)

The substrate may consist essentially of a substrate base material (e.g. where the input substrate is yet to be modified, for example, via surface oxidation, lithography and/or other substrate modification step(s)).

However, alternatively the substrate (which may include the input substrate) suitably comprises a substrate base material (suitably consisting essentially of substrate base material) that has been subject to modification (e.g. a modified substrate). Such a modified substrate may include a substrate base material that has been modified by a pre-processing or pre-coating step (e.g. thermal oxidation of a surface, e.g. to produce a silicon oxide insulation layer prior to coating with a resist coating) before being subjected to the method(s) of the invention; otherwise modified prior to being subjected to the method(s) of the invention (e.g. a partially formed integrated circuit formed using alternative technologies, e.g. using photolithography); or else modified during or after the substrate has been subjected to the method(s) (or some of the step(s) thereof) of the invention. Each further substrate layer suitably comprises or consists essentially of a further substrate material, which may be the same as or different from the substrate base material. In a particular embodiment, one nor more of the further substrate layers comprises or consists essentially of the substrate base material, albeit not necessarily part of the substrate base layer.

Suitably the substrate base layer is disposed towards (or at) the base of the substrate, suitably relative to an exposure surface thereof (i.e. the surface whose resist coating is to be exposed to radiation—this may be considered a top of the substrate, regardless of the ultimate orientation of the resist-coated substrate during processing).

Suitably the method(s) of the invention involve generating additional layer(s) (including partial layer(s)) upon the substrate base layer and optionally thereafter upon each other; incorporating additional layer(s) within either the substrate base layer or any further substrate layer(s) (e.g. via doping); and/or removing part(s) of the substrate base layer and/or part(s) of further substrate layer(s) (e.g. via etching). Suitably the method(s) of the invention produce a multi-layered substrate comprising a substrate base material towards (or at) the bottom thereof. The substrate base layer is suitably the foundation upon which the other layers are built.

In preferred embodiments, the input substrate comprises a substrate base layer underlying a layer of oxidised (preferably thermally oxidised) substrate base material. In a particular embodiment, the input substrate comprises a wafer of silicon (suitably a single crystal of silicon) underlying a silicon oxide (or silicon dioxide) layer.

As will be appreciated by the skilled person, where a lithographic mask (e.g. photomask) formed by the method(s) of the invention (i.e. using eBeam and the relevant eBeam resist coating of the invention) is used in subsequent lithography (e.g. to form an alternative imaged substrate, multi-layered substrate, integrated circuit, etc.), the same substrate base material (e.g. silicon wafer) may be used. Moreover the same lithographic methods defined herein may be used, though alternative resist coating(s), lithographic methods (e.g. exposure and development methods) may be used with the lithographic mask instead of or in addition to (e.g. in repeated steps) the eBeam resist coating(s) and eBeam-specific method steps of the invention.

Although the methods of the invention are especially applicable for the production of silicon-based integrated circuits, and products derived therefrom, the present invention will be equally applicable to future materials used in the construction of electronic components—for instance graphene based materials.

EBeam Resist-Coated Material and its Formation

The present invention provides an eBeam resist-coated material, and a method of forming an eBeam resist-coated material, as defined herein. An eBeam resist-coated material or substrate is a "substrate" as defined herein with an eBeam resist coating on a surface (or part of a surface) thereof.

The eBeam resist-coated material suitably involves coating the input substrate with an eBeam resist composition as defined herein, and optionally thereafter curing and/or drying the coating, to form a coating of eBeam resist composition upon the substrate.

Coating the input substrate, which suitably involves applying the resist composition (whether an eBeam resist or alternative resist) to a surface(s) of the input substrate, may be performed by any number of methods well known to the person skilled in the art. Applying a resist coating to a substrate (be it a single body of substrate base material, a multilayered substrate, an input substrate, or a modified substrate) suitably involves applying a resist composition (suitably as defined herein, though alternative resist compositions outside the scope of the invention may be used in addition, so long as the resist composition of the invention is used at least once in the method(s) of the invention) to a surface (or part of a surface) thereof and optionally thereafter curing and/or drying the applied resist composition to form the resist coating. The resist composition may be applied in any suitable manner though most suitably the resist composition is applied via dipping, spraying, brushing, roller coating, and/or spin coating. Most preferably the resist composition is applied to the substrate via spin coating, which is especially suitable during the fabrication of integrated circuits. In a particular embodiment, the eBeam resist composition is applied to the base substrate or input substrate via spin-coating (e.g. using a spinner), suitably to thereby form a resist spin-coated input substrate. Most suitably the applied resist composition is cured and/or dried (suitably through baking). The resist coating suitably has a (substantially) uniform thickness. The skilled person is well versed in how to apply a resist coating to a substrate prior to lithography.

Where a substrate is said to comprise or be coated by a coating, such as a resist coating, said coating suitably covers a surface (or part thereof) of said substrate.

After coating the base substrate or input substrate with the resist composition, the coating is preferably cured and/or dried. Suitably, the coating is dried at a temperature and pressure and for a time suitable to form a resist film upon the base substrate or input substrate. The temperature (and pressure, especially where reduced pressure is used) may be chosen for compatibility with the particular solvent of the resist composition (e.g. to boil off the solvent). In a particular embodiment, the coating (or coated-base substrate or coated-input substrate) is baked at atmospheric pressure (approximately 1 Bar) and a temperature between 60 and 200° C. (more suitably between 80 and 180° C.) for between 30 seconds and 5 minutes (suitably between 90 and 150 seconds, suitably around 120 seconds). Suitably such curing/drying may remove some, most, or all solvent(s) present in the resist composition. Where the anti-scattering compound(s) are associated with a solvate, suitably some, most, or all of said solvate is removed by said curing and/or drying.

The average thickness of the coating is suitably 10-500 nm, suitably 50-200 nm. The maximum thickness of the coating is suitably 1000 nm, suitably 500 nm. The minimum thickness of the coating is suitably 5 nm, suitably 20 nm. The technology of the present invention allows effective, high quality patterning of extremely thin resist coatings.

The resist coatings of the invention provide good adhesion to base substrates and input substrates, especially those suitable for electronic components.

Though the above description of the application of a resist coating suitably pertains to eBeam resist coatings, any of the descriptions may equally apply (where compatible) to the application of alternative resist coatings, such as photoresists, though the skilled person will be well able to adapt solvents and coating techniques to suit the resist coating in question.

Exposure and Electron Beam Radiation

Exposing part(s) of the eBeam resist coating to electron beam radiation provides an exposed eBeam resist coating. In pre-steps and/or repeat steps, where an alternative resist coating and optionally alternative radiation is used, exposing part(s) of the relevant resist coating to radiation provides an exposed resist coating.

Exposing part(s) of the coating of the eBeam resist-coated material to radiation suitably involves selectively exposing said part(s), whilst other part(s) are selectively non-exposed. As such, the method suitably excludes exposing all of the coating to radiation.

Selective exposure of part(s) of the coating may involve direct irradiation of the relevant part(s) with a focused or targeted beam (e.g. such as an electron beam or laser beam, e.g. a UV-laser beam, preferred when using eBeam resists) or blanket flood exposure (i.e. unfocussed/untargeted) exposure of the coating through a mask (e.g. photomask, preferred when using photoresists) comprising pre-determined apertures corresponding with the position of the exposed part(s) of the coating. The particular exposure technique used may depend on the particular radiation being employed.

Suitably the exposed part(s) of the coating undergo a transformation, suitably a chemical transformation, suitably which changes the solubility properties thereof (suitably in relation to a pre-determined developing medium, for example, one of the developing media described herein), suitably whether before or after an optional post-exposure bake, suitably even before any such post-exposure bake.

Suitably, parts of the coating which are "radiation-exposed" have different solubility properties to parts of the coating which are not "radiation-exposed". This solubility differential suitably allows for development and selective removal of either the "radiation-exposed" or "non-radiation-exposed" parts of the coating (depending on whether the resist is positive or negative tone resist).

In general, the resist material(s) (which may include an antiscattering compound and/or a base polymeric component) in the exposed part(s) of the coating is, at least partially, fragmented (i.e. through chemical bond-breakages, suitably via chain scission methods, suitably caused by irradiation), suitably into shorter polymeric or monomeric fragments. Such fragmentation is suitably caused by primary radiation (e.g. primary electrons of an eBeam) and/or secondary electrons (optionally produced by a secondary electron generator in response to primary radiation). Suitably, such shorter fragments have a higher solubility in the developing medium than the original base polymeric component.

Where the resist composition or resist coating is positive tone (i.e. a positive resist), suitably the exposed part(s) of the coating become more soluble (suitably in relation to a pre-determined developing medium, for example, one of the developing media described herein). As such, the net effect of irradiation (and optionally a post-exposure bake) is to increase the solubility of exposed part(s) of the resist coating. As such, suitably the exposed part(s) are intended to be removed after subsequent developing. Suitably, the increase solubility of the resist coating is the result of the aforementioned break down of the base polymeric component.

Where the resist composition or resist coating is negative tone (i.e. a negative resist), suitably the exposed part(s) of the coating become less soluble (suitably in relation to a pre-determined developing medium, for example, one of the developing media described herein). As such, the net effect of irradiation (and optionally a post-exposure bake) is to reduce the solubility of exposed part(s) of the resist coating. As such, suitably the exposed part(s) are intended to remain after subsequent developing. Since the aforementioned break down of the base polymeric component generally leads to elevated solubility, negative tone resist compositions suitably additionally comprise a negative resist agent, such as a cross linking agent. Such a cross-linking agent may suitably cross-link the base polymeric component, or any polymeric or monomeric fragments thereof (see above), during irradiation and/or during any optional post-exposure bake, to thereby provide a cross-linked polymeric component that is less soluble than the original base polymeric component. It will be readily recognized, by those skilled in the art, that radiation above a certain energy and/or intensity threshold may lead to negative resists becoming positive resist, merely because the negative resist agent (e.g. cross-linking agent) may itself be broken down and/or destroyed, thereby preventing it from performing its intended function. As such, a negative resist may only act as a negative resist within certain limits, which are straightforward for the skilled person to determine.

Exposure of the coating may lead directly to a developable substrate (i.e. a substrate which can undergo development to produce a patterned substrate). However, additional subsequent processing steps may be employed. Suitably, radiation exposure of the coating may be followed by a post-exposure bake. The post-exposure bake may comprise baking at a temperature and pressure and for a time suitable to form a developable substrate. The temperature (and pressure, especially where reduced pressure is used) may be chosen for compatibility with the particular solvent of the resist composition (e.g. to boil off the solvent). In a particular embodiment, the exposed coating (or exposed coated-base substrate or exposed coated-input substrate) is baked at atmospheric pressure (approximately 1 Bar) and a temperature between 60 and 200° C. (more suitably between 80 and 180° C.) for between 30 seconds and 5 minutes (suitably between 90 and 150 seconds, suitably around 120 seconds).

Any radiation suitable for use with resist compositions may be used. Suitably resist compositions are formulated for exposure with particular radiation, so the radiation may be selected base on the resist composition question. Suitably the radiation in question is either electromagnetic radiation (especially ultraviolet) or an electron beam. Obviously, the eBeam resist compositions and coatings of the invention are designed to be exposed by electron beam radiation. Alternative resist compositions and coatings are most suitably designed for exposure by light, suitably UV or visible light (i.e. as in photolithography), most suitably via a photomask.

Suitably the radiation is electron beam radiation (i.e. provided by an electron beam). Suitably the electron beam radiation is a focused, targeted beam, thereby allowing direct irradiation of the relevant part(s) of the coating (i.e. without any masking). As such, exposure of the coating using an electron beam may involve (effectively) writing upon the coating with the beam. The energy (or acceleration voltage), current, and write speed of the electron beam may be judiciously selected by the skilled person, depending on the circumstances. However, to expose the eBeam resist coatings of the invention, the electron beam radiation (i.e. primary electrons) suitably may have an initial energy (or acceleration voltage) between 10 and 300 keV, suitably between 30 and 200 keV, suitably between 50 and 150 keV, most suitably between 90 and 110 keV. The electron beam suitably has a current between 25 and 300 pA/beam (pA=pico amperes), suitably between 50 and 270 pA/beam, most suitably between 200 and 250 pA/beam. Where the electron beam is employed as a focused, targeted beam (i.e. for writing), the electron beam suitably has a write speed (or exposure dose) below 30 µC/cm$^2$ (uC=unit of electronic charge, $uC/cm^2$=electronic charge per unit area), suitably below 20 μC/cm², more suitably below 10 μC/cm², most suitably below 5 μC/cm². The write speed may be as low as 0.5 μC/cm², but is suitably greater than or equal to 0.5 μC/cm², suitably greater than or equal to 1 μC/cm². In a particular embodiment, the radiation is an electron beam having an energy between 15 and 60 keV, a current between 25 and 300 pA/beam, and a write speed below 20 μC/cm². The present invention allows the use of low energy electron beams, thereby minimizing damage to components of the resist composition (e.g. to cross-linking agents), which may compromise the function of the resist. An electron beam can be generated by methods well known to those skilled in the art.

In an embodiment, where alternative resist coatings are used alongside non-eBeam radiation (e.g. ultraviolet radiation), suitably said radiation has a wavelength between 10 and 400 nm. Where ultraviolet radiation is used for exposure, the resist composition (and hence the resist coating) will suitably comprise additional ingredients (e.g. a photoacid and/or photocatalyst) which facilitate the coating transformation process upon exposure to ultraviolet radiation. The ultraviolet radiation may give rise to secondary electrons during exposure (in much the same manner as with electron beam radiation, albeit the secondary electrons may be generated more indirectly), especially in the presence of a secondary electron generator as defined herein. The ultraviolet radiation can be generated by methods well known to those skilled in the art. The ultraviolet radiation may be extreme-ultraviolet (EUV), suitably having a wavelength between 10 and 124 nm, suitably between 10 and 20 nm, suitably between 11 and 15 nm (most suitably about 13.4 nm). Alternatively, the ultraviolet radiation may suitably have a wavelength between 150 and 240 nm, suitably between 180 and 210 nm, suitably between 190 and 200 nm, suitably about 193 nm.

Suitably, where an antiscattering compound, as defined herein, is present within a resist composition (and resist coating), exposure of the resist composition or coating thereof will be more controlled than in the absence of said antiscattering compound. The antiscattering compound is thought to focus and direct the radiation (and optionally also secondary electrons, where they are duly generated) to the desired exposure sites, to suitably thereby minimize any undesired exposure. In other words, the antiscattering compound may prevent radiation (and/or secondary electron) spillage, and thereby confine the transformational effects of the radiation (and/or secondary electrons) to ensure higher resolution exposure. Moreover, the antiscattering compound can prevent or reduce over-exposure of certain vulnerable components within the resist, e.g. a cross-linking agent (where negative tone resists are desired), which may otherwise compromise subsequent developing of the exposed resist.

Developing the Resist Coating and the Developing Medium

The present invention provides a patterned substrate, and a method for its preparation (e.g. developing an exposed eBeam resist-coated material), as defined herein. Suitably, "development" forms grooves within the resist coating to thereby form a pattern layer.

The step of developing the exposed eBeam resist coating generates an eBeam resist pattern layer comprising developer-insoluble coating portions of the eBeam resist coating (i.e. ridges) and an array of grooves extending through the eBeam resist pattern layer. In certain embodiments, a surface of the substrate underlying the resist pattern layer is exposed in/by the grooves, though is suitably masked by the ridges.

Developing the exposed resist-coated material is suitably performed with a developing medium. As such, the exposed resist-coated material, or at least the exposed coating thereof, is suitably contacted with (e.g. washed with and/or immersed within) a developing medium (which is suitably liquid) in a manner sufficient to remove (suitably through dissolving) either the exposed part(s) (for positive resists) or non-exposed part(s) (for negative resists) of the coating of the resist composition. For eBeam resist coatings of the invention, the developing medium suitably removes non-exposed part(s).

As aforementioned, exposure of the resist-coated material generally causes exposed part(s) of the coating to have a different solubility (suitably in relation to a pre-determined developing medium) to non-exposed part(s) of the coating. This solubility differential between the exposed and non-exposed part(s) of the coating is instrumental in facilitating subsequent development of the exposed coated-resist material. As such, either the exposed or non-exposed part(s) of the coating may be selectively removed (preferably dissolved) to transform the coating into a pattern layer comprising an array of grooves extending through the pattern layer (i.e. through what was the original coating). The grooves of the pattern layer then correspond with the part(s) of the coating that have been removed, whereas the ridge/protrusion (i.e. non-groove) part(s) of the pattern layer correspond with the part(s) of the coating that remain. The pattern layer (suitably the non-groove part(s) thereof) therefore suitably comprises ridges or protrusions (i.e. between the grooves) which are either exposed part(s) (for positive resists) or non-exposed part(s) (for negative resists) of a coating of the resist composition.

The specific developing conditions may be tuned, for instance, to optimise the quality of the resulting patterned substrate, or optimise the developing process (whether in the interests of cost, speed, or ultimate product quality). Developing times (for instance, the time if immersion of the exposed coating) may, for example, be optimised to maximise removal of the part(s) of the coating intended for removal and to minimise removal or damage of part(s) of the coating intended to remain. Likewise, the developing medium may be tuned to optimise either or both the developing process or the resulting product.

Suitably, after developing, the method of preparing a patterned substrate comprises rinsing the pattern layer, suitably with a rinse medium, which suitably comprises an organic solvent.

Suitably, after developing, and optionally after rising, the method further comprises drying (or baking) the patterned substrate.

The developing medium itself may be any suitable developing medium known in the art. Suitably the developing medium complements the resist composition (or coating thereof). Most suitably the developing medium complements the solubility properties of the resist composition and its post-exposed counterpart, suitably to optimize contrast (i.e. the differential solubility and/or solubilization rates) between exposed and unexposed parts of the resist coating. Where the resist composition/coating is an eBeam resist composition/coating of the invention, suitably the developing medium dissolves unexposed antiscattering compound.

Where the resist composition (or coating thereof) is a negative resist, the developing medium suitably comprises a solvent within which the antiscattering compound and/or base polymeric component is (substantially) soluble, or is at least more soluble than a post-exposed counterpart of the antiscattering compound and/or base polymeric component. Where the resist composition (or coating thereof) is a positive resist, the developing medium suitably comprises a solvent within which the antiscattering compound and/or base polymeric component is (substantially) insoluble, or at least less soluble than a post-exposed counterpart of the antiscattering compound and/or base polymeric component.

The developing medium may or may not dissolve all components of the exposed or non-exposed (depending on whether positive or negative resist) resist composition (or a coating thereof) intended for removal by development, but any insoluble (or less soluble) components may still be removed in slurry, suspension or dispersion following dissolution (or partial dissolution) of the base polymeric component or post-exposed counterpart thereof with which said insoluble components are mixed.

The developing medium for the eBeam resist coatings of the invention suitably comprise or consist of an organic solvent, suitably a non-polar organic solvent, suitably which is an organic compound. The organic solvent is suitably selected from one or more hydrocarbon solvents, suitably one or more (4-12C)hydrocarbon solvents. For example, the organic solvent may be selected from one or more of pentane, hexane, octane, decane, 2, 2, 4-trimethylpentane, 2, 2, 3-trimethylpentane, perflurohexane and perfluronpetane and aromatic hydrocarbon solvents, such as toluene, ethylmethpropylbenzene, dimethylbenzene, ethyldimethylbenzene and dipropylbenzene). In a particular embodiment, the developing medium for eBeam resist coatings of the invention is hexane.

The pattern layer may be considered to comprise an array of grooves extending through the pattern layer (i.e. a groove pattern) and an array of ridges/protrusions (i.e. the non-groove part(s) of the pattern layer). The ridges suitably correspond with developer-insoluble coating portions whereas the grooves suitably correspond with developer-soluble coating portions (i.e. which are removed upon developing).

The present invention allows extremely high resolutions to be achieved. The resolution of the pattern layer (particularly the groove and/or ridge pattern) generated using the eBeam resist coating of the invention is suitably less than 50 nm, suitably less than 20 nm, more suitably less than 10 nm, and suitably less than 7 nm. Typically the resolution is at least 1, suitably at least 2 nm, suitably at least 5 nm. Such resolutions may even be achieved with high energy radiation exposure, for instance, with electron beams of an energy of 10 keV or higher.

Moreover, one of the particular advantages of the eBeam resist coatings of the invention is that the grooves (or trenches) produced following development of an exposed eBeam-resist-coated substrate have (substantially) vertical walls, as opposed to sloping walls. Suitably the walls of the grooves are substantially perpendicular (e.g. 90°+/−20°, suitably +/−10°, suitably +/−5°, most suitably +/−1°) to the underlying substrate surface. This significantly improves the effectiveness and resolution of subsequent surface modification steps. For instance, the profile of the walls of any trenches formed by etching are substantially perpendicular (e.g. 90°+/−20°, suitably +/−10°, suitably +/−5°, most suitably +/−1°) to the underlying substrate surface (i.e. the bottom of the trenches). Such clean patterning and subsequent surface modification is achievable due to the lack of scattering events and secondary electrons generated by the anti-scattering compound following collisions with primary electrons. Thus the presence of such clean patterning and/or surface modifications in a final integrated circuit is indicative of the present invention having been employed.

The aspect ratio of the grooves (i.e. width/height ratio) may be suitably greater than or equal to 1:1, suitably greater than or equal to 5:1, suitably greater than or equal to 10:1, and impressively an aspect ratio of greater than or equal to 15:1 or even greater than or equal to 20:1 may be achieved. The technology underlying the present invention allows extremely high aspect ratios to be achieved, especially where an anti-scattering compound is employed.

Further Processing of Patterned/Developed Substrate

After developing the exposed resist coating, the surface of the substrate underlying the patent layer may be selectively modified in any one or more of a number of ways. Since the step of selectively modifying the substrate, substrate surface, or part(s) thereof, may be repeated indefinitely (before or after removing any residual resist pattern layer, and optionally after further lithography stages), one or more successive selective substrate/surface modification steps may ensue, which may optionally be selected from any of those detailed herein, or a combination thereof.

Suitably the part(s) of the substrate/surface modified during such selective modification are the part(s) exposed by or underlying the grooves in the pattern layer (i.e. the underlying surface to be modified may be exposed/visible or have only a relatively thin layer of resist remaining thereupon).

Selectively modifying the substrate/surface may involve removing part(s) of the substrate/substrate surface, adding or depositing a material to (or upon) the substrate/substrate surface, and/or changing part(s) of the substrate/substrate surface.

Modifying the substrate/surface may by removing part(s) of the substrate/substrate surface may, for instance, involve etching the substrate/surface. In the context of integrated circuit fabrication, typically such etching is performed to remove an insulating material (e.g. silicon oxide/dioxide layer, e.g. suitably which protects underlying conductive material), suitably to thereby uncover an underlying conductive material (e.g. silicon). Alternatively or additionally, etching may involve etching a conductive material (e.g. silicon)—e.g. capacitors may be produced via trenches etched deep into a silicon surface.

In the context of manufacturing a lithographic mask (e.g. a photomask), such etching may remove an opaque material or layer to reveal an underlying transparent material through which radiation may pass (e.g. during lithographic exposure through said resulting lithographic mask).

Etching would suitably selectively etch the part(s) of the substrate/surface underlying the groove(s) of the pattern layer rather than the part(s) of the substrate/surface underlying the ridges (which are essentially protected).

Modifying the substrate/surface by changing part(s) of the substrate/substrate surface may, for instance, involve altering the transparency properties of the substrate/surface (e.g. in producing a lithographic mask) or altering the electrical properties of the substrate/surface (or the relevant part(s) thereof) (e.g. when producing an integrated circuit). Altering the electrical properties of the substrate/surface is particularly applicable where the underlying substrate/surface being modified (e.g. that exposed by the grooves) is a semiconductor (e.g. silicon). Alteration of the substrate/surface(s) electrical properties may involve "doping" of the relevant part(s) of the substrate/surface. Doping is a well known phenomenon in the field of semiconductor technology, and facilitates the creation of electronic components within an integrated circuit (e.g. diodes, logic gates, transistors, etc.). Such doping can be performed using techniques well known in the art, such as diffusion (e.g. where a dopant is diffused into the substrate so that it becomes embedded therein), ion implantation (e.g. where an ion beam implants ions into the substrate).

Doping can, however, be achieved through pre-deposition, such as by epitaxial growth of a doped deposit (e.g. epitaxial growth of an Si—Ge layer).

Modifying the substrate/surface by changing part(s) of the substrate/substrate surface may alternatively or additionally involve forming an insulation layer (or isolation layer), or gate, suitably by transforming part(s) of the substrate/surface—e.g. through thermal oxidation (e.g. thermal oxidation of a conductor, such as silicon, produces the insulator silicon dioxide).

Modifying the substrate/surface by adding or depositing a material to (or upon) the substrate/substrate surface may, for instance, involve deposition of an insulating material, for instance, to isolate an electronic component or conductive element. Alternatively it may involve deposition of a conductive material (e.g. metal plating etc.).

Any, some, or all of the aforementioned surface modification steps may be deployed (suitably in succession, though optionally interspersed with lithographic steps—e.g. re-coating, re-exposure, re-development) to form a multi-layered substrate, such as an integrated circuit (e.g. die or wafer).

Suitably, at a certain stage (e.g. following one or more surface modifications), one or more resist pattern layers (which may or may not be an eBeam resist pattern layer) are removed. A variety of techniques known in the art may be deployed for such removal (e.g. chemical removal, physical removal, thermal treatment, radiative removal or plasma ashing, or a combination.), though plasma ashing may be employed in the context of integrated circuit fabrication. Alternatively, the residual resist pattern layer(s) may be removed with a solvent (e.g. through dissolution) or via a selective etching process.

In some embodiments, once a resist pattern layer is removed, the entire modified surface may be treated/modified in toto.

Step (vi) allows for repetition of a surface modification step, so that successive surface modification steps may be performed (before and/or after pattern layer removal). In addition, step (vi) allows all lithography steps (steps i)-iii))), further surface modification steps (step iv)), and optional pattern layer removal (step v)) steps, to be repeated any number of times. So long as the method comprises at least one step involving an eBeam resist composition/coating of the invention or at least one step involving a tool (e.g. lithographic mask) of the invention, any or all of the repeated steps may employ an alternative resist coating and where appropriate alternative radiation (during exposure) instead of the eBeam resist coatings of the invention and electron beam radiation (during exposure). Alternatively, any or all of the repeated steps may employ the eBeam resist coating of the invention and electron beam radiation. It should therefore be evident that the repeating steps are not limited, and permit a multiplicity of method steps outside the scope of the invention, suitably in the production of integrated circuits and the like.

In the context of fabricating an integrated circuit, selectively modifying the substrate/surface (or part(s) thereof) may involve front-end-of-line (FEOL) processing (e.g. formation of electronic components, such as transistors, directly in the substrate, i.e. silicon). In fact, steps (i) to (vi) may collectively constitute front-end-of-line (FEOL) processing. It will be appreciated that a multi-layered substrate, of which an integrated circuit is an example, can be fashioned by multiple repeat steps and optionally also pre-steps. The present invention is being employed wherever an eBeam resist coating of the invention is used at least once, or wherever a lithographic mask obtained by using said eBeam resist coating is used at least once, in the method(s) of the invention.

The aforementioned processing options and features may apply equally to a method of manufacturing a lithographic mask (though features relating to integrated circuit fabriaction are obviously not especially applicable to the creation of a lithographic mask), a method of performing lithography (using a lithographic mask formed by a method of the invention), a method of manufacturing a multi-layered substrate, or a method of fabricating an integrated circuit die or an integrated circuit wafer comprising a plurality of integrated circuit dice.

Typically, step (vi) may be followed by one or more finishing steps, such as back-end-if-line (BEOL) processing (as used in the fabrication of integrated circuits). This may involve conductively interconnecting electronic components and/or providing external contact terminals.

It will be evident that any number of pre-steps may precede step (i) of this method. In a particular embodiment, the input substrate is itself a partially built integrated circuit die (or wafer of dice) which has already been subjected to a plurality of pre-treatment steps.

Lithography using Lithographic Masks produced using eBeam Resist Compositions of the Invention As previously explained, eBeam resist compositions of the invention can be used to produce a lithographic mask. The lithographic mask is suitably produced by the electron beam lithography methods of the invention, which may optionally involve any further processing steps required to provide the lithographic mask. The lithographic mask comprises a mask pattern (which is suitably either a negative or positive image of the intended ridge pattern of a pattern layer to be produced using said mask). The mask pattern is suitably characterised by regions of surface/substrate transparency juxtaposed with regions of surface/substrate opacity. Such a mask is typically used in a method of performing lithography as defined herein (where step ii) involves exposure via the lithographic mask). The combination of transparent and opaque regions of the mask suitably allows relevant radiation (for exposing a resist coating, whether one of the invention or not) to pass through the transparent regions (and thereby expose a resist coating) and be blocked by the opaque regions (thereby leaving non-exposed resist coating portions). The exposed resist coating may then be developed as usual to yield a resist pattern layer.

Since such lithographic masks benefit from the invention in that they comprise a mask pattern of ultra high resolution, suitably ultra high resolution resist pattern layers can be produced using said masks. Such masks may be used in any of the methods defined herein, in conjunction or in the absence of steps involving an eBeam resist coating of the invention.

In an aspect of the invention, there is provided a lithographic mask with a mask pattern having a resolution as defined herein in relation to a product obtained from electron beam lithography.

Most suitably the lithographic mask is a photomask, which is suitable for use in photolithography (i.e. where the radiation is electromagnetic radiation, suitably UV or visible light).

Integrated Circuit Wafers and Dice

The present invention provides a method of fabricating an integrated circuit die or an integrated circuit wafer comprising a plurality of integrated circuit dice, the or each die comprising a plurality of electronic components, wherein the method comprises:

i) providing an (eBeam) resist-coated substrate as defined herein or applying an (eBeam) resist coating to a substrate; and
  ii) exposing part(s) of the (eBeam) resist coating to electron beam radiation to provide an exposed (eBeam) resist coating;
  OR
  iii) providing a resist-coated substrate or applying a resist coating to a substrate (the resist coating may be any resist coating suitable for exposing via a lithographic mask, e.g. a photoresist); and
  iv) exposing part(s) of the resist coating, through a lithographic mask (e.g. photomask) as defined herein (or obtainable by a method defined herein), to radiation (e.g. UV or visible light) to provide an exposed resist coating;
  AND
  iii) developing the exposed (eBeam) resist coating to generate an (eBeam) resist pattern layer, the (eBeam) resist pattern layer comprising: developer-insoluble coating portions of the (eBeam) resist coating (i.e. ridges); and an array of grooves extending through the (eBeam) resist pattern layer;
  iv) modifying the substrate, substrate surface, or part(s) thereof, underlying the (eBeam) resist pattern layer (this may involve conductively interconnecting the electronic components of the or each die with conductor(s));

v) removing the (eBeam) resist pattern layer to provide a modified substrate;

vi) optionally repeating, one or more times, step iv) and/or steps i)-v) (with either a resist coating of the invention or an alternative resist coating, such as a photoresist; and optionally using electron beam radiation with or without a lithographic mask or alternative radiation during exposure, such as visible or ultraviolet light) upon the modified substrate;

vii) optionally conductively interconnecting the electronic components of the or each die with conductor(s) (if not already performed during one or more substrate/substrate-surface modifying steps) to provide an integrated circuit with external contact terminals;

viii) optionally performing one or more further finishing steps;

ix) optionally separating an integrated circuit die from a wafer comprising a plurality of integrated circuit dice.

Step (i) of the method is optionally preceded by performing steps (i) to (vi) of this method (i.e. pre-steps (i)-(vi), optionally using either of the two step (i)/(ii) combinations) and/or performing steps (i) to (vi) of the method of performing electron beam lithography, optionally repeated one or more times, using either an eBeam resist coating or an alternative resist coating and using either electron beam radiation or alternative radiation during exposure.

The eBeam resist coating suitably comprises an optionally dried and/or cured resist composition; wherein the eBeam resist composition comprises an anti-scattering compound.

In a particular embodiment, steps (i) and (ii) comprise:
i) providing an (eBeam) resist-coated substrate as defined herein or applying an (eBeam) resist coating to a substrate; and
ii) exposing part(s) of the (eBeam) resist coating to electron beam radiation to provide an exposed (eBeam) resist coating;

In a particular embodiment, steps (i) and (ii) comprise:
i) providing a resist-coated substrate or applying a resist coating to a substrate (the resist coating may be any resist coating suitable for exposing via a lithographic mask, e.g. a photoresist); and
ii) exposing part(s) of the resist coating, through a lithographic mask (e.g. photomask) as defined herein (or obtainable by a method defined herein), to radiation (e.g. UV or visible light) to provide an exposed resist coating;

Features, including optional, suitable, and preferred features, relating to this method of fabricating an integrated circuit die or an integrated circuit wafer comprising a plurality of integrated circuit dice are described in relation to a method of performing electron beam lithography hereinbefore.

However, it is important to appreciate that the fabrication of integrated circuit dies or dice may involve many processing steps, and may involve the production of a multi-layered substrate.

As will be appreciated by those skilled in the art, producing an integrated circuit (for inclusion in a circuit board) typically involves wafer processing (i.e. processing of a silicon wafer), die preparation (e.g. cutting/separating individual dice from the processed wafer), integrated circuit packaging (where each dice is package so that it may be used in an circuit board), and suitably also integrated circuit testing.

Though wafer processing is well understood in the art, it is worth noting that in certain embodiments wafer processing comprises wet cleaning; photolithography; ion implantation; dry etching and/or wet etching; plasma ashing; thermal treatment (e.g. annealing or thermal oxidation); chemical vapour deposition (CVD), physical vapour deposition (PVD), molecular beam epitaxy (MBE), and/or electrochemical deposition (ECD); wafer testing (e.g. to validate electrical performance); and wafer backgrinding (to reduce thickness of the wafer and resulting die and chip). The methods, resist compositions/coatings, and lithographic masks of the invention are suitably used at least once during wafer processing. Where an eBeam resist coating is used during wafer processing, suitably at least one photolithography operation (which combines substrate resist coating, exposure, and development) is replaced by an electron beam lithography operation that uses an eBeam resist coating of the invention in place of a photoresist. Where a lithographic mask, produced using an eBeam resist coating of the invention (i.e. one characterised by the levels of resolution only achievable using the invention), is used during wafer processing, suitably at least one photolithography operation is replaced by a lithography operation (which may itself involve photolithography or any other type of lithography, including eBeam, though most preferably photolithography) that utilises said lithographic mask during exposure. However, it will be appreciated that the benefits of the invention may be realised even if the eBeam resist coating or lithographic mask of the invention is used only once (or to produce only a single layer or only a single electronic component or single set of electronic components), and conceivably any further lithography operations (e.g. photolithography) may employ standard techniques known in the art of fabricating integrated circuits. Hence the methods of the invention provide the option for any or all repeat steps (and even any or all of any pre-steps) to be performed without the coating or lithographic mask of the invention.

As aforementioned, steps (i)-(vi) of the method may constitute front-end-of-line (FEOL) processing. Optionally, this processing does, at least to an extent, involve conductively interconnecting the electronic components of the or each die. However, most suitably, steps vii) to ix) constitute back-end-of-line (BEOL) processing.

Suitably conductively interconnecting the electronic components involves metallisation. Suitably, conductively interconnecting the electronic components involves creating metal interconnecting wires isolated by one or more dielectric (i.e. insulating) layers, where the insulating material is typically silicon dioxide (typically formed by thermal oxidation of silicon) or a silicate glass, though the material is not limited.

Metallisation may involve generating a network of metal wires, such as copper or aluminium wires. Such a process may suitably involve: a) blanket coating of a modified substrate with a metal (e.g. copper or aluminium), patterning (e.g. using lithography to generate a resist pattern layer), etching the metal underlying a resist pattern layer (i.e. to produce discrete metal wires), and forming or depositing an insulating material over the metal wires. It will be appreciated that, for instance, where multiple layers of metal wires are required to generate a viable integrated circuit, some or all of such metal wire layers may be formed instead during a surface modification step, which may involve this same procedure.

After a wafer of dice is produced, die cutting may ensure to separate all of the dies ready for packaging.

Wafers and dice produced by the method of the invention are characterised by high performance owing, not least, to the high resolutions obtained. They may also be smaller than standard IC dice.

Integrated Circuit Packages

The skilled person in the field of integrated circuits is well able, using standard workshop techniques, to produce an integrated circuit package from an integrated circuit die.

However, the present invention provides an a method of manufacturing an integrated circuit package, the integrated circuit package comprising a plurality of pins and an integrated circuit die with external contact terminals conductively connected to the corresponding plurality of pins, wherein the method comprises:

i) providing an integrated circuit die as defined herein or fabricating an integrated circuit die by a method of fabricating an integrated circuit die as defined herein;

ii) attaching the integrated circuit die to a package substrate, wherein the package substrate comprises electrical contacts, each of the electrical contacts being optionally connected or connectable to a corresponding pin;

iii) conductively connecting each of the external contact terminals of the integrated circuit die to corresponding electrical contacts of the package substrate;

iv) optionally (and if necessary) connecting the electrical contacts of the package substrate to corresponding pins;

v) encapsulating the integrated circuit die.

Conductively Connecting Die and Package Substrate

Typically the method involves conductively connecting a die to a package substrate by one of a variety of methods known in the art, such as wire bonding, thermosonic bonding, flip chip, wafer bonding, or tab bonding.

Connecting pins render IC's practical and straightforward to incorporate into a circuit board. Therefore, the method suitably involve electrically connecting the IC package pins to the die via appropriate contacts. Typically, the connecting pins are part of an encapsulation device, and so this step may be combined with encapsulation step.

Dice can be air/moisture sensitive, hence why they are usually encapsulated. An encapsulated IC package is suitably baked, plated, laster marked, and trimmed. Finally, an IC package is suitably electronically tested for quality assurance.

Circuit Boards, Electronic Devices or Systems

Suitably, a circuit board incorporating an integrated circuit package (with a plurality of pins) of the invention may be readily produced by simply conductively connecting the integrated circuit package to a circuit board.

Furthermore, said circuit board may be readily incorporated into an electron device or system as defined herein. As such, consumer products that are or incorporate an electronic device or system of the invention, reap the benefits of the high resolution (and other notable advantages) integrated circuits afforded by methods of the invention, and the novel resist coatings described herein.

EXAMPLES

Materials and Equipment

Unless stated otherwise, all reagents and solvents were commercially available and used as received. Elemental analyses were performed by departmental services at The University of Manchester. Carbon, nitrogen and hydrogen analysis was performed using a Flash 200 elemental analyser. Metal analysis was performed by Thermo iCap 6300 Inductively Coupled Plasma Optical Emission Spectroscopy (ICP-OES).

Poly(methmethylacrylate) (PMMA) (Mw ~996 kDa) was obtained from Sigma Aldrich. Poly(methmethylacrylate) (PMMA) was used as the resist polymer (or base polymeric component), though the skilled person will appreciate that this is one of many suitably resist polymers that may be effectively used in conjunction with the invention.

Pentaerythritol tetraacrylate was obtained from Sigma Aldrich. Pentaerythritol tetraacrylate was used as a crosslinker in negative tone resist compositions.

Silicon wafer substrates (wafers 500 µm thick) 10 mm×10 mm were commercially sourced from University wafer.com and used as supplied.

The spin-coating equipment included an SCS G3P-8 spin coater, with an 8 inch bowl and spin speeds of 100 to 10000 rpm.

A FEI Sirion Scanning Electron Microscope (SEM) was used to provide a source of an electron beam.

Post-developed patterned substrates were inspected and analysed using a Leica optical microscope using a 10x objective lens.

Example 1—Formation of eBeam Resist Composition

In general, an eBeam resist composition of the invention may produced by forming a composition that includes an anti-scattering compound as defined herein. Suitably the composition also comprises a coating solvent to enable the anti-scattering compound to be applied as a resist coating.

Since the anti-scattering compound suitably includes a low-density, high molecular weight polymetallic cage (since such structures produce less scattering and secondary electrons from primary electron impacts, owing to the amount of empty space within such cage structures), any polymetallic cage may be used to obtain the relevant beneficial effect, as justified in view of the predictive models disclosed herein. By way of guidance to the skilled person, suitable structures may include any polymetallic cage complexes the same or similar to those disclosed in G. F. S. Whitehead, F. Moro, G. A. Timco, W. Wernsdorfer, S. J. Teat and R. E. P. Winpenny, "A Ring of Rings and Other Multicomponent Assemblies of Clusters", *Angew. Chem. Int. Ed.*, 2013, 52, 9932-9935. This literature described the synthesis of such polymetallic cages, and it would be straightforward for the skilled person to adapt the procedures disclosed therein to produce a wide range of potential anti-scattering compounds. Moreover, the list of references appended hereto also provide enabling disclosures of relevant compounds that may serve as anti-scattering compounds of the invention.

Generally, the polymetallic cages are formed by mixing the relevant inorganic salts (containing the metal(s) intended for incorporation into the cages) with the relevant ligands, typically carboxylic acids along with a fluoride salt (for example through an adaptation of the procedures disclosed in G. A. Timco et al, *Nat. Nanotechnol.* 2009, 4, 173-178). In some cases the polymetallic cages can act as a Lewis acid (i.e. capable of co-ordinatively accepting one or more electron pairs), and can be mixed with a suitable complementary Lewis base linker (e.g. pyridyl-substitute porphyrin) to produce an overall complex, suitably in which a plurality of the metal cages surrounds the linker. Alternatively, the polymetallic cages can act as a Lewis base (i.e. capable of co-ordinatively donating one or more electron pairs), suitably by virtue of basic moieties present within one or more of the associated ligands of the cage, and can be mixed with a suitable complementary lewis acid linker (e.g. optionally another metal-centered cage structure which is either Lewis acidic or has substitutable ligands). Suitably the Lewis acid and Lewis base components of the anti-scattering compound may be mixed in a stoichiometric ratio that produces a linker surrounded by a desired number of primary metal complexes.

However, in this disclosure we consider a number of specific examples in order to illustrate the inventive concepts and broad applicability of the invention.

Example 1A—Preparation of [H$_2$NR$_2$][Cr$_7$NiF$_8$ (Pivalate)$_{15}$(Iso-Nicotinate)] Complex, Along with Anti-Scattering Compounds and Resist Compositions Thereof The primary metal complex, [H$_2$NR$_2$][Cr$_7$NiF$_8$(pivalate)$_{16}$] metal cage complex, can be produced by co-mixing 28 mole equivalents of chromium (III) fluoride with 2.7 mole equivalent of nickel (II) inorganic salt and 137 mole equivalents of pivalic acid in the presence of 11 mole equivalents of a secondary amine, suitably di-propylamine. A modification of the procedure disclosed in F. K. Larsen et al., Synthesis and Characterisation of Heterometallic {Cr7M} Wheels, *Angew. Chem. Int. Ed.* 42, 101-105 (2003).

[H$_2$NPr$_2$][Cr$_7$NiF$_8$(pivalate)$_{16}$]. CrF$_3$.4H$_2$O (5.0 g, 27.6 mmol), [Ni$_2$(H$_2$O)(O$_2$CCMe$_3$)$_4$(HO$_2$CCMe$_3$)$_4$] (2.0 g, 2.7 mmol), dipropylamine (11.0 mmol) and pivalic acid (14.0 g, 137.1 mmol) were heated with stirring at 140° C. for 5 h. During this time chromium fluoride dissolved and a green crystalline product formed. The flask was cooled to room temperature and 50 ml of acetone added with stirring. The crystalline product was filtered, washed with a large quantity of acetone, dried in air and recrystallized from toluene to give [H$_2$NPr$_2$][Cr$_7$NiF$_8$(pivalate)$_{16}$]. Yield: 6.45 g (70.1%). Elemental analysis (%): calcd for C$_{89}$H$_{160}$Cr$_7$F$_8$N$_1$Ni$_1$O$_{32}$: Cr, 15.62; Ni, 2.52; C, 45.86; H, 6.92; N, 0.60; F, 6.52. found: Cr, 15.17; Ni, 2.47; C, 46.38; H, 7.07; N, 0.5; F, 6.57. ES-MS (THF): m/z: −2191 [Cr$_7$NiF$_8$(O$_2$CCMe$_3$)$_{16}$]$^-$; +2239 M$^+$.

The primary metal complex [H$_2$NR$_2$][Cr$_7$NiF$_8$(pivalate)$_{15}$(iso-nicotinate)] can be produced by co-mixing 1 molecule equivalent of [H$_2$NR$_2$][Cr$_7$NiF$_8$(pivalate)$_{16}$] and excess iso-nicotinic acid. A modification of the procedure disclosed in G. A. Timco, et al., Engineering coupling between molecular spin qubits by coordination chemistry. *Nature Nanotechnology* 4, 173-178 (2009) may be used.

[H$_2$NPr$_2$][Cr$_7$NiF$_8$(pivalate)$_{16}$] (5.0 g 2.18 mmol), iso-nicotinic acid (0.8 g 6.5 mmol) and n-propanol (150 mL) were refluxed for 24 h with constant stirring. The resulting solution was cooled to room temperature and filtered. The solvent from the filtrate was removed under reduced pressure and the residue was washed with a large quantity of acetonitrile. The residue was then dissolved in diethyl ether (~300 ml). The obtained solution was filtered and the diethyl ether was removed by distillation leaving a solid which was dissolved in pentane (~200 ml). The pentane extract was filtered and evaporated to dryness giving a green solid which still was a mixture of products. Further purification of [H$_2$NPr$_2$][Cr$_7$NiF$_8$(pivalate)$_{15}$(iso-nicotinate)] was performed by column chromatography on 40-63 μm mesh silica gel (BDH). First toluene was used as solvent, which allowed un-reacted [H$_2$NPr$_2$][Cr$_7$NiF$_8$(pivalate)$_{16}$] to be eluted, leaving the products of the reaction at the top of the column. Thereafter a mixture of toluene:ethyl acetate elution was used. With a mixture of toluene: ethyl acetate 24/1 the remains of 1 were eluted. Pure [H$_2$NPr$_2$][Cr$_7$NiF$_8$(pivalate)$_{15}$(iso-nicotinate)] was obtained as the second band starting its elution with a 13.5/1 ratio and finishing with a 10/1 ratio toluene/ethyl acetate mixture. Alternatively, pure [H$_2$NPr$_2$][Cr$_7$NiF$_8$(pivalate)$_{15}$(iso-nicotinate)] can be eluted (also after [H$_2$NPr$_2$][Cr$_7$NiF$_8$(pivalate)$_{16}$]) as the second band with a 20/1 hexane (or petroleum ether)/ethyl acetate mixture. The solvents then evaporated under reduced pressure. Yield: 1.2 g (24%).

Elemental analysis, calcd (%) for C$_{87}$H$_{155}$Cr$_7$F$_8$N$_2$Ni$_1$O$_{32}$: Cr, 15.72; Ni, 2.53; C, 45.12; H, 6.75; N, 1.21. Found: Cr, 15.97; Ni, 2.56; C, 44.90; H, 6.90; N, 1.19. ES-MS (sample dissolved in THF, run in MeOH): +2374 [M+Na+2H$_2$O)]$^+$(100%); +2338 [M+Na]$^+$; +2315 [M]$^+$.

The Cr$_7$Ni(pivalate)$_{16}$ metal cage complex, which suitably acts as a Lewis acid, may then be mixed with a variety of Lewis base linker components (in this case a central electron-donating hub) to produce various antiscattering compounds of different molecular weight, density, and mean ionisation potential. The mixture is then concentrated to afford the final anti-scattering compound, which includes a relevant linker (e.g. porphyrin) surrounded by a number of the metal cages.

To form the resist composition, the anti-scattering compound is dissolved in hexane (22 mg of compound for every 1 g hexane) by mixing it with hexane and shaking the mixture at 15000 rpm using a IKA shaker for 2 minutes.

Since a variety of linkers are used to form this particular series of anti-scattering compounds, a variety and molecular weights and densities were observed, all of which are detailed below in Example 2A.

Figure 15:
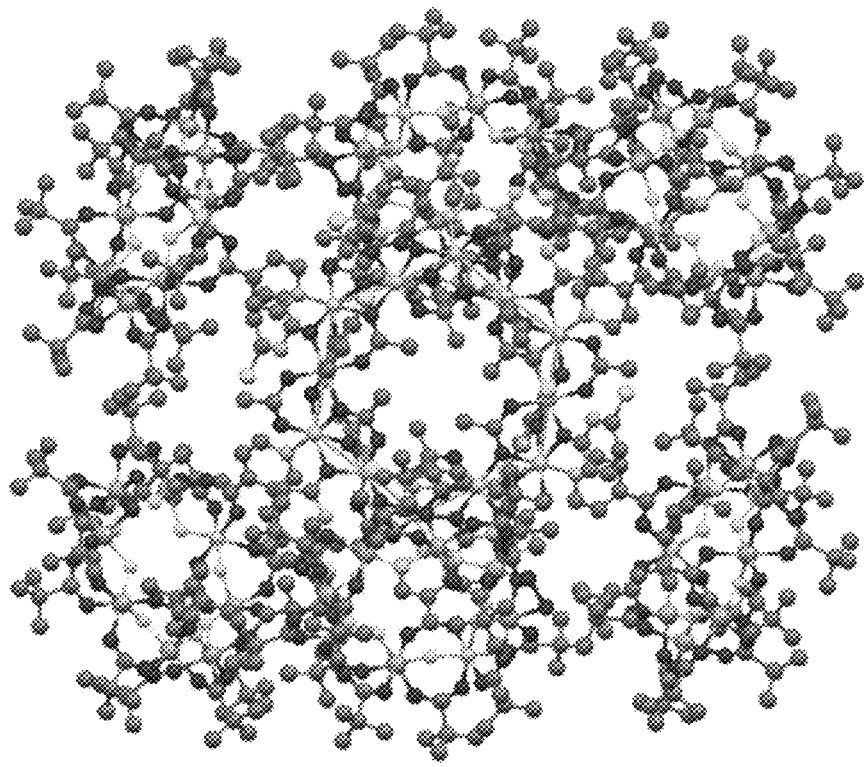
FIG. 15 depicts GW20-14.

Example 1B [GW20-14]—Preparation of [{Ni12(chp)12(O2CMe)12(H2O)6}{[NH2Pr2][Cr7NiF8(O2CtBu)15(O2C—C5H4N)]}6] Anti-Scattering Compounds and Resist Compositions Thereof See FIG. 15

Ring of Rings (GW20-14)

Formula: C$_{606}$H$_{1002}$Cl$_{12}$Cr$_{42}$F$_{48}$N$_{24}$Ni$_{18}$O$_{234}$ Molecular Weight: 16886.04 g/mol The primary metal complex and its associated dipropylammonium countercation [NH2Pr2][Cr7NiF8(O2CtBu)15(O2C—C5H4N)] was prepared by the method given in G. A. Timco, et al., Engineering coupling between molecular spin qubits by coordination chemistry. Nature Nanotechnology 4, 173-178 (2009). This represents a salt of a primary metal complex. This particular primary metal complex may serve as a lewis base to a lewis acidic linker.

The linker compound [Ni12(chp)12(O2CMe)12(H2O)6}(THF)6] was prepared by the method given in H. Andres, et al., Studies of a nickel-based single molecule magnet. *Chem. Eur. J.* 8, 4867-4876 (2002). This particular linker compound serves as a Lewis acidic linker, since the THF (solvent) ligand associated with the nickel ions can be substituted, in this case by the primary metal complex which may co-ordinate with the nickel ions of the linker via the O2C—C5H4N (isonicotinate) ligand of the primary metal complex.

The anti-scattering compound [{Ni12(chp)12(O2CMe)12(H2O)6}{[NH2Pr2][Cr7NiF8(O2CtBu)15(O2C-05H4-N)]}6] may then be prepared by mixing the aforementioned linker compound (25.2 mg, 0.007 mmol) suspended in acetone (5 mL) with the aforementioned primary metal complex salt (0.1 g, 0.043 mmol) in hot acetone (15 mL) with stirring. The mixture is heated for 15 minutes, during which time the solution goes clear and subsequently a precipitate is formed. This is removed from the heat and left to stir overnight. The precipitate is then collected, washed with hot acetone and extracted in ether. The solvent is removed under reduced pressure and the resultant powder recrystallised from vapour diffusion MeCN into Toluene. Large, well defined crystals suitable for single crystal XRD are collected and weighed. Yield: 97.5 mg (0.0058 mmol, 79.8% based on the linker); Elemental analysis calculated (%) for C606H1026C112Cr42F48N24Ni18O234: C, 42.92; H, 6.03; N, 1.98; Cr, 12.88; Ni, 6.23. Found: C, 42.08; H, 5.92; N, 1.76; Cr, 12.52; Ni, 6.16.

To form the resist composition, the anti-scattering compound is dissolved in hexane (22 mg of compound for every 1 g hexane) by mixing it with hexane and shaking the mixture at 15000 rpm using a IKA shaker for 2 minutes.

Figure 16:
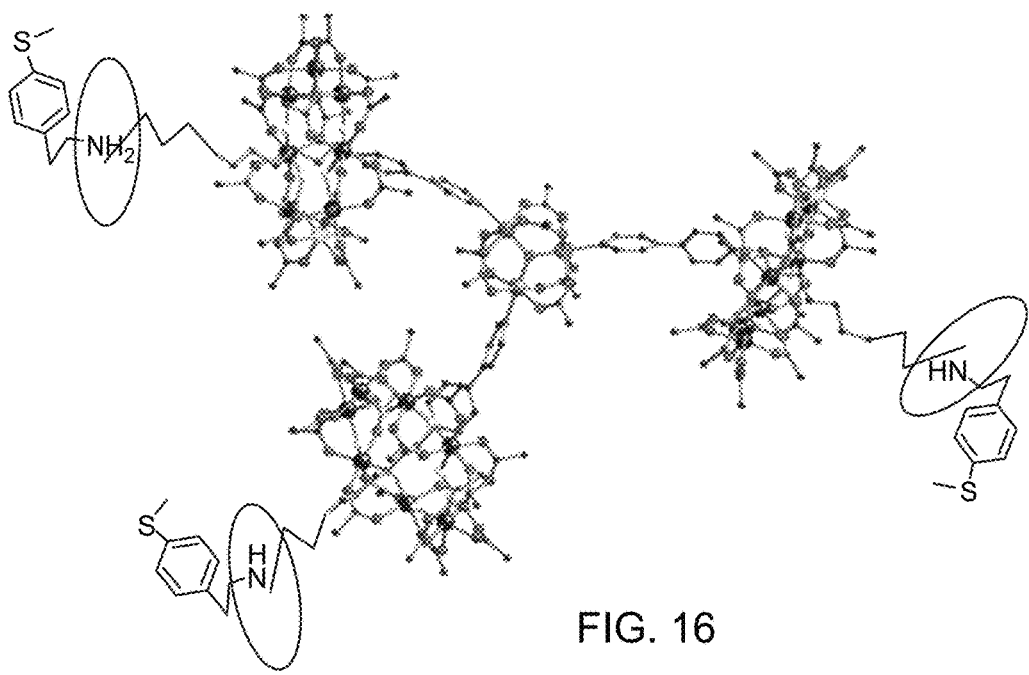
FIG. 16 depicts 7—Rotaxane.

Example 1C—Preparation of [7]Rotaxane Anti-Scattering Compounds and Resist Compositions Thereof See FIG. 16

7-Rotaxane

Formula: $C_{606}H_{1059}CoCr_{42}F_{48}Fe_2N_9O_{205}Zn_6$

Molecular Weight: 15506.85 g/mol

Synthesis of thread A

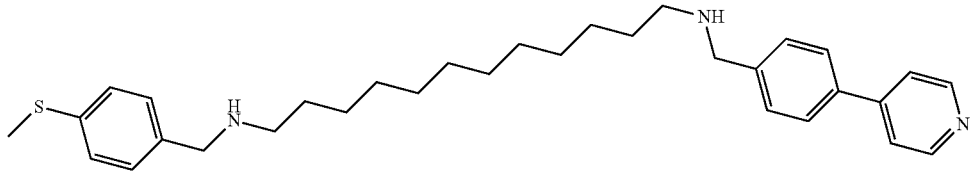

To a solution of 1,12-diaminododecane (0.7 g, 3.5 mmol) in methanol (30 mL), 4-methylthiobenzaldehyde (0.47 mL, 3.5 mmol) in methanol (5 mL) was added and the reaction mixture was refluxed for 3 hr under nitrogen atmosphere and then cooling to room temperature. NaBH$_4$ was added and reaction mixture stirred over night under nitrogen atmosphere. The reaction was quenched with water and evaporated. The solid was extracted with chloroform, washed with water and dried over anhydrous magnesium sulphate and evaporated. To a solution of the amine in methanol (30 mL), 1 (0.64 mL, 3.5 mmol) in 5 mL methanol was added and the reaction mixture was refluxed for 3 hr under nitrogen atmosphere, allowed to stir at room temperature overnight. NaBH$_4$ was added and reaction mixture stirred over night under nitrogen atmosphere. The reaction was quenched with water and evaporated. The solid was extracted with chloroform, washed with water and dried over anhydrous magnesium sulphate and evaporated (60% yield). The product A was recrystallized from methanol and confirmed by spectroscopic analysis. ES-MS (sample dissolved in dichloromethane, run in MeOH): m/z=504 [M+H]$^+$. $^1$H NMR (400 MHz, 293K, CDCl$_3$): □□=1.2-1.6 (m, 20H), 2.3 (s, 3H), 2.4-2.6 (m, 4H), 3.7 (s, 2H), 3.8 (s, 2H), 7.1-7.3 (m, 4H), 7.3-7.5 (m, 4H), 7.6 (d, 2H), 8.6 (d, 2H).

Synthesis of [3]rotaxane B

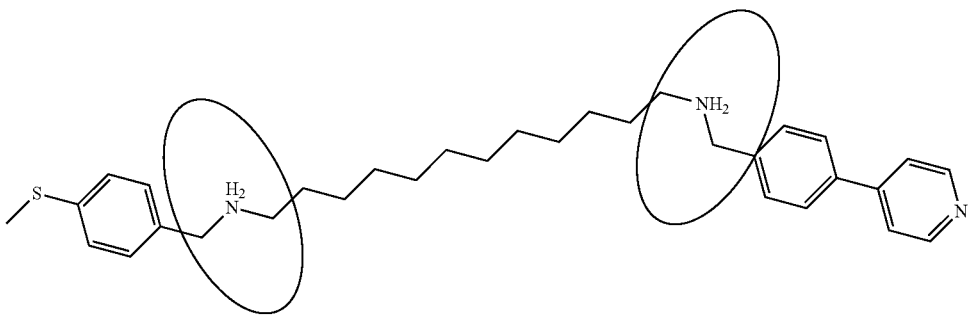

Me$_3$CCO$_2$H (24 g, 230 mmol), thread A (0.47 g, 0.94 mmol), CrF$_3$.4H$_2$O (2.36 g, 13 mmol) and ZnCO$_3$ (1.5 g, 4.47 mmol) were heated at 140° C. with stirring in a Teflon flask for 1 h, then the temperature of the reaction was increased to 160° C. for 24 h under N$_2$. The flask was cooled to room temperature, and then acetonitrile (35 mL) was added while stirring. The green microcrystalline product was collected by filtration, washed with a large quantity of acetonitrile, dried in air, and then extracted with toluene. Flash chromatography (toluene then toluene/ethyl acetate 7/3) afforded the desired [3]-rotaxane B as a green crystalline solid (1.1 g) in 23% yield. Elemental analysis (%) calcd for C$_{192}$H$_{335}$Cr$_{14}$F$_{16}$N$_3$Zn$_2$O$_{641}$: Cr, 14.84; Zn, 2.66; C, 47.02; H, 7.37; N, 0.85. found: Cr, 13.92; Zn, 2.39; C, 47.71; H, 6.88. N, 0.77.

[Fe$_2$Co(C$_{45}$H$_{18}$O$_{84}$)] (0.14 g, 2.86 mmol) was added to a solution of the [3]rotaxane B (0.01 g, 0.95 mmol) in hot acetone (10 mL), and the mixture was refluxed for 5 min. and then stirred at r.t. for 4 h. Yield: 0.05 g (20%). Elemental analysis (%) calcd for C$_{606}$H$_{1059}$ Cr$_{42}$ F$_{48}$N$_9$Zn$_6$ O$_{205}$CoS$_3$Fe$_2$: Cr, 14.0; Zn, 2.53; Co, 0.38; Fe, 0.79; C, 46.94; H, 6.88; N, 0.81. found: Cr, 12.76; Zn, 2.02; Co, 0.48; Fe, 0.91; C, 47.23; H, 7.93; N, 0.82.

To form the resist composition, the anti-scattering compound is dissolved in hexane (22.5 mg of compound for every 1 g hexane) by mixing it with hexane and shaking the mixture at 15000 rpm using a IKA shaker for 2 minutes.

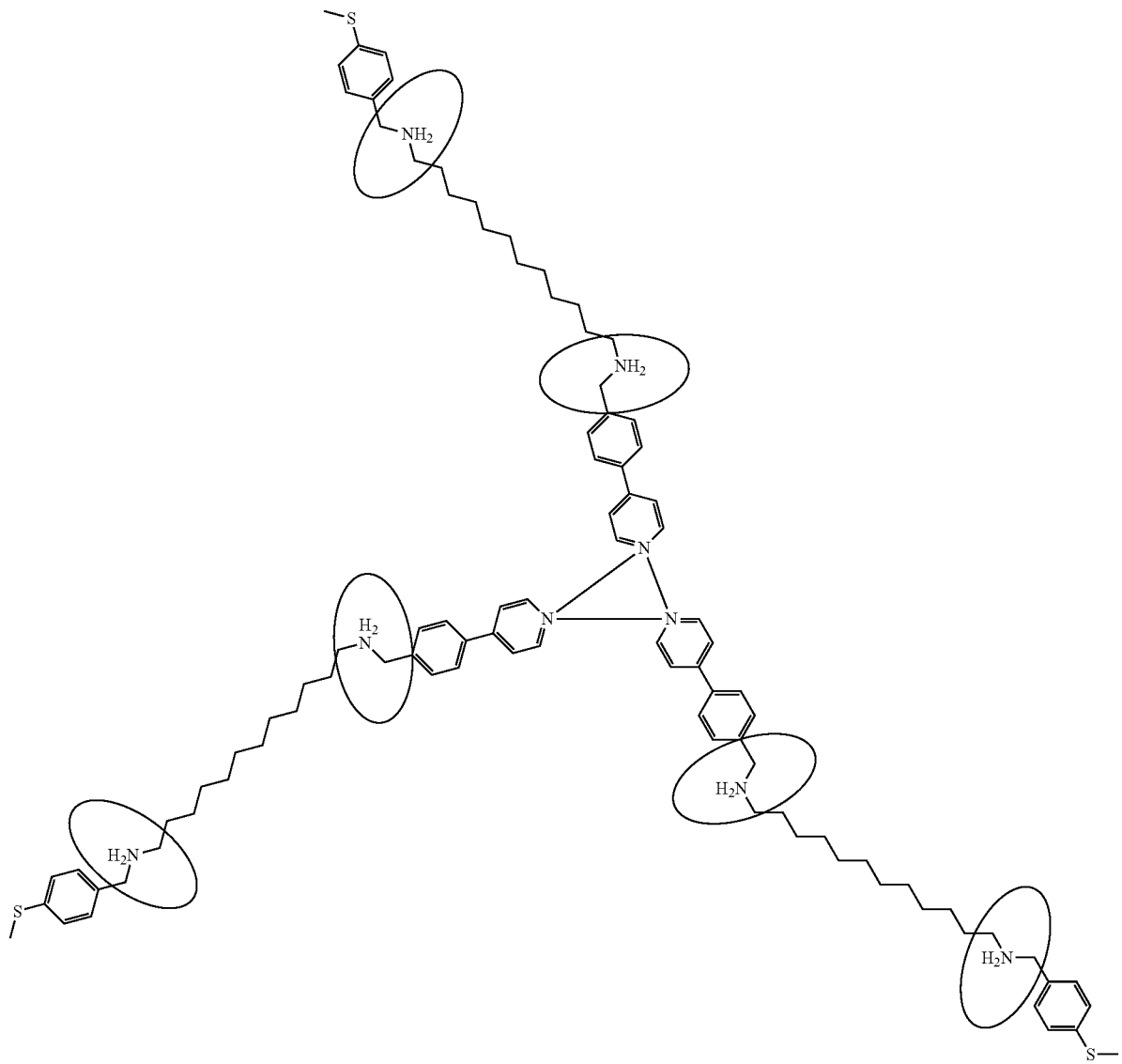

Example 1D [GT188-13]—Preparation of $(C_{56}H_{32}MgN_{16}^{2+})[Cr_7NiF_8(O_2CR_{B1})_{16}]_8$ Anti-Scattering Compounds and Resist Compositions Thereof

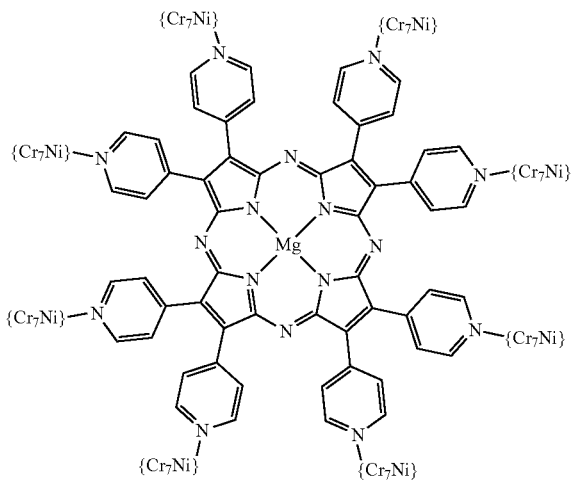

GT188-13.
Formula: $C_{712}H_{1208}Cr_{56}F_{24}MgN_{16}Ni_8O_{280}$
Molecular weight: 18334.75 g/mol

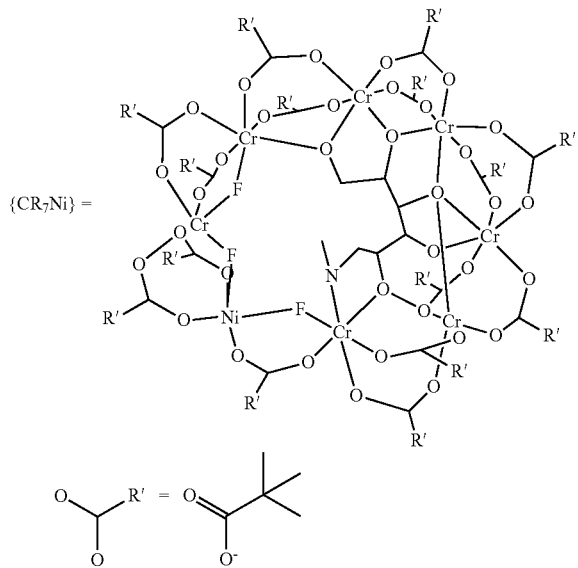

The primary metal complex, $[Cr_7NiF_3(O_2CRB1)_{15}((Gluc-NH-R_{O1})(H_2O)]$ metal cage complex ($R_{B1}$=t-butyl), can be produced by co-mixing 33 mole equivalents of chromium (III) fluoride with 2 mole equivalent of nickel (II) inorganic salt, and 294 mole equivalents of pivalic acid (i.e. $R_{B1}$=t-butyl) and 17 mole equivalents of N-methyl-D-glucamine. A modification of the procedure disclosed in G. A. Timco, et al., Heterometallic Rings Made from Chromium Stick Together Easily, Angew. Chem. Int. Ed. 47, 9681-9684 (2008) may be used. This particular primary metal complex may serve as a lewis acid to a lewis base linker.

Chromium(III) fluoride tetrahydrate (6.0 g, 33 mmol), N-ethyl-D-glucamine (3.6 g, 17 mmol), pivalic acid (30.0 g, 294 mmol) and nickel(II) carbonate hydroxide tetrahydrate (1.2 g, 2.0 mmol) were heated together with constant moderate stirring in a Teflon flask at 160° C. for 34 h. After the first 2 h of the reaction the solid which had formed in the flask was broken into small pieces using a spatula. This procedure was repeated twice more during the following 4 h. At the end of the reaction a solid has formed. The reaction is cooled to RT and $Et_2O$ (100 mL) was added with stirring and the resulting solution was filtered. The filtrate was diluted slowly with stirring with MeCN (~170 mL) and a microcrystalline violet product started to precipitate during this time. The flask was sealed and kept at −10° C. for 2 days. The crystalline product was collected, washed with a mixture of $Et_2O$: MeCN (1:1) and dried in air. This product was purified from a very fine brown powder by column chromatography on 40-63 μm mesh silica gel (BDH). 1 was eluted with $Et_2O$ as the first main band leaving a brown band on the column. The solvent was then evaporated under reduced pressure and the solid dissolved in $Et_2O$ (~50 mL) and the solution diluted with MeCN (~50 mL). The crystalline product started to form immediately. The flask was kept at −10° C. for one day, then the crystals were collected by filtration, washed with a mixture of $Et_2O$: MeCN (1:2) and dried in air. Yield 3.2 g (30%, based on Cr). Elemental analysis calcd (%) for $C_{83}H_{151}Cr_7NiF_3N_1O_{36}$: Cr, 16.40; Ni, 2.65; C, 44.93; H, 6.86; N, 0.63. found: Cr, 16.40; Ni, 2.54; C, 44.42, H, 7.11; N, 0.55.

ES-MS (sample dissolved in $Et_2O$, run in MeOH): +2200 $[M]^+(100\%)$; +2223 $[M+Na]^+$.

The linker compound salt (2,3,7,8,12,13,17,18-Octakis(4-pyridyl)porphyrazinato)magnesium(II), [Mgpz(pyr)8] (C56H32N16Mg) thereof shown below was prepared by M. E. Anderson, A. G. M. Barrett, B. M. Hoffman, Inorg. Chem. 1999, 38, 6143-6151. This particular linker compound serves as a Lewis base linker, whose pyridine lone pairs co-ordinate with the metal centre(s) of the primary metal complex.

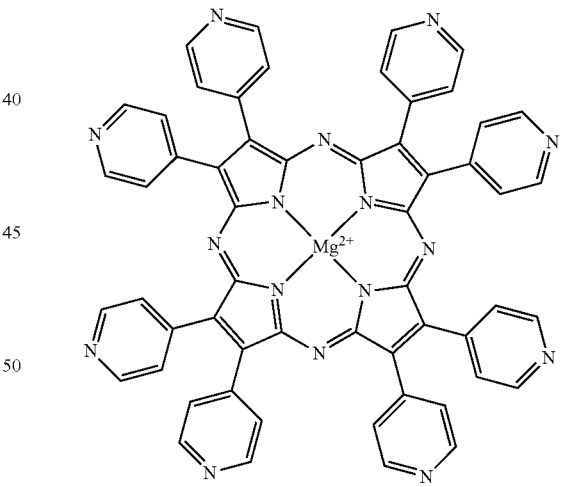

Chemical Formula: $C_{56}H_{32}MgN_{16}^{2+}$

Preparation of $[(Cr_7NiF_3(Meglu)(O_2C^tBu)_{15})]_8$ [Mgpz(pyr)$_8$]

$[Cr_7NiF_3(Meglu)(O_2C^tBu)_{15}(H_2O)]$ where $H_5Meglu$=N-Methyl-D-glucamine; was prepared similarly $[Cr_7NiF_3(Etglu)(O_2C^tBu)_{15}(H_2O)]$ where $H_5Etglu$=N-Ethyl-D-glucamine by the method given in E. Garlatti et al, J. Am. Chem. Soc. 2014, 136, 9763-9772, using H5Meglu instead of H5Etglu.

The linker compound salt [(2,3,7,8,12,13,17,18-Octakis(4 pyridyl) porphyrazinato) magnesium(II)], [Mgpz(pyr)$_8$]= (C$_{56}$H$_{32}$N$_{16}$Mg) was prepared by the method given in M. E. Anderson, A. G. M. Barrett, B. M. Hoffman, Inorg. Chem. 1999, 38, 6143-6151.

[Mgpz(pyr)$_8$] (0.14 g, 0.15 mmol) and [Cr$_7$NiF$_3$(Meglu) (O$_2$C$^t$Bu)$_{15}$(H$_2$O)] (3.5 g, 1.59 mmol where stirred in dichloromethane (DCM) (250 mL) for 4 days at room temperature (r.t.), then solvent (DCM) was removed under reduced pressure at caT=36° C. and residue stirred with acetone (100 mL) at ambient temperature for 24 h. Obtained precipitate was collected by filtration and washed with acetone (3×25 mL). Then it was re-dissolved in DCM (40 mL) and obtained solution filtered, and filtrate diluted with acetone (20 mL). After this the solvents where evaporated while stirring at r.t. in a flow of N$_2$. Obtained blue solid was dried en vacuo. Yield: 2.1 g (77.5%, based on [Mgpz(pyr)$_8$]).

Elemental analysis (%): calc. for C$_{712}$H$_{1208}$Cr$_{56}$F$_{24}$Mg$_1$N$_{24}$Ni$_8$O$_{280}$: Cr, 15.78; Ni, 2.55; C, 46.36; H, 6.60, N, 1.82. found: Cr, 16.17; Ni, 2.50, C45.32; H, 6.88; N, 1.18.

The anti-scattering compound C$_{712}$H$_{1208}$Cr$_{56}$ F$_{24}$MgN$_{16}$Ni$_8$O$_{280}$ (C$_{56}$H$_{32}$MgN$_{16}{}^{2+}$)[Cr$_7$NiF$_8$(O$_2$CR$_{B1}$)$_{16}$]$_8$ may then be prepared by mixing one mole equivalent of the aforementioned linker (specifically a salt thereof) suspended in an appropriate solvent [acetone] with the aforementioned primary metal complex (specifically a salt thereof) in an appropriate solvent [acetone] with stirring. The mixture is heated for 15 minutes, during which time the solution goes clear and subsequently a precipitate is formed. This is removed from the heat and left to stir overnight. The precipitate is then collected, washed with hot acetone and extracted in ether. The solvent is removed under reduced pressure and the resultant powder recrystallised from vapour diffusion MeCN into Toluene.

To form the resist composition, the anti-scattering compound is dissolved in hexane (20 mg of compound for every 1 g hexane) by mixing it with hexane and shaking the mixture at 15000 rpm using a IKA shaker for 2 minutes.

Example 1E [GT133-14]—Preparation of [NH$_2$Pr$_2$] [Cr$_7$NiF$_8$(O$_2$CR$_{B1}$)$_{16}$] Anti-Scattering Compounds and Resist Compositions Thereof

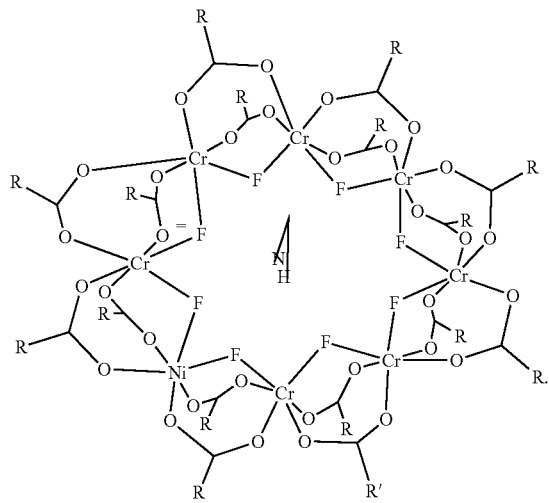

GT133-14.
Formula: C$_{102}$H$_{106}$Cr$_7$NiF$_8$NO$_{32}$
Molecular weight: 2487 g/mol -continued

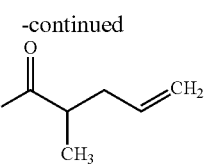

The primary metal complex, [Cr$_7$NiF$_8$(O$_2$CR$_{B1}$)$_{16}$] metal cage complex (where R$_{B1}$=C$_5$H$_9$; 1-methylbut-4-enyl), can be produced by co-mixing 7 mole equivalents of chromium (III) inorganic salt with one mole equivalent of nickel (II) inorganic salt, 8 mole equivalents of fluoride (may be provided amongst other inorganic salts), and 16 mole equivalents of 2-methylpent-4-enoic acid. This metal cage complex is prepared as the dipropylammonium salt. A modification of the procedure disclosed in F. K. Larsen et al., Synthesis and Characterisation of Heterometallic {Cr$_7$M} Wheels, Angew. Chem. Int. Ed. 42, 101-105 (2003) was used to prepare the primary metal complex with its associated dipropylammonium countercation [NH$_2$Pr$_2$][Cr$_7$NiF$_8$ (O$_2$CR$_{B1}$)$_{16}$] was prepared. For the purposes of comparison this primary metal complex was in fact the anti-scattering compound, and was not associated with a linker.

To form the resist composition, the anti-scattering compound is dissolved in hexane (25 mg of compound for every 1 g hexane) by mixing it with hexane and shaking the mixture at 15000 rpm using a IKA shaker for 2 minutes.

Example 2—Formation of eBeam Resist-Coated Materials

In general, eBeam resist-coated materials are formed through coating a substrate, or part thereof, with an appropriate eBeam resist composition, and suitably thereafter drying and/or curing to form a coating.

Example 2A—Formation of Resist Coating with Cr$_7$Ni(2-ethylhexanoate)$_{16}$ Complex As mentioned in Example 1A, this particular metal cage complex was used to gauge a range of key properties, which would then be use in Monte-Carlo simulations to determine the suitability of various anti-scattering compounds for use in high-resolution eBeam resists. Moreover, comparisons were made with standard resists (e.g. PMMA) and standard IC substrates, e.g. silicon.

Resist-coated substrates were formed using a variety of anti-scattering compounds incorporating Cr$_7$Ni(2-ethylhexanoate)$_{16}$ metal cages (as per Example 1A) by systematically spin-coating a series of 10 mm×10 mm silicon substrates (600 nm thick) with the relevant anti-scattering compounds. Each anti-scattering compound was dissolved in hexane to allow spin-coating of the corresponding resist composition. The resist was spun using a spin cycle of 8000 rpm for 30 seconds, which was followed by a soft-bake at 100° C. for 2 minutes, allowing the cast solvents to evaporate. All resist films resulted with a thickness of 100 nm.

Table 1 therefore illustrates the relevant properties for a variety of resist cpatomgs incorporating various proportions of Cr$_7$Ni(2-ethylhexanoate)$_{16}$ metal cages (i.e. so that density and MW may be varied).

TABLE 1

Physical properties of the materials used in the Monte Carlo model.

| Physical property | PMMA | Cr$_7$Ni(2-EthylHexanote)$_{16}$ complex | Silicon |
|---|---|---|---|
| Density (g/cm$^3$) | 1.19 | 0.8 → 2 | 2.33 |
| Effective Atomic Number | 5.85 | 11.6 | 14 |
| Average Atomic Weight (g/mol) | 100.116 | 2000 → 16000 | 28.0855 |
| Mean Ionization Potential (eV) | 74 | 150 | 174 |

Example 28—Formation of Resist Coating with [{Ni12(chp)12(O2CMe)12(H2O)6}{[NH2Pr2][Cr7NiF8(O2CtBu)15(O2C—C5H4N)]}6] Anti-Scattering Compound Resist-coated substrates were formed using a resist composition including a [{Ni12(chp)12(O2CMe)12(H2O)6}{[NH2Pr2][Cr7NiF8(O2CtBu)15(O2C—C5H4N)]}6] anti-scattering compound in the same manner as described in Example 2A. Again the resist films resulted with a thickness of 100 nm.

Example 2C—Formation of Resist Coating with [7]Rotaxane Anti-Scattering Compound Resist-coated substrates were formed using a resist composition including a [7]rotaxane anti-scattering compound in the same manner as described in Example 2A. Again the resist films resulted with a thickness of 100 nm.

Example 2D—Formation of Resist Coating with (C$_{56}$H$_{32}$MgN$_{16}$$^{2+}$)[Cr$_7$NiF$_8$(O$_2$CR$_{B1}$)$_{16}$]$_8$ Anti-Scattering Compound Resist-coated substrates were formed using a resist composition including a (C$_{56}$H$_{32}$MgN$_{16}$$^{2+}$)[Cr$_7$NiF$_8$(O$_2$CR$_{B1}$)$_{16}$]$_8$ anti-scattering compound in the same manner as described in Example 2A. Again the resist films resulted with a thickness of 100 nm.

Example 2E—Formation of Resist Coating with [NH$_2$Pr$_2$][Cr$_7$NiF$_8$(O$_2$CR$_{B1}$)$_{16}$] Anti-Scattering Compound Resist-coated substrates were formed using a resist composition including a [NH$_2$Pr$_2$][Cr$_7$NiF$_8$(O$_2$CR$_{B1}$)$_{16}$] anti-scattering compound in the same manner as described in Example 2A. Again the resist films resulted with a thickness of 100 nm.

Example 3—Formation of Exposed eBeam Resist-Coated Materials (i.e. e-Beam Exposure)

During these studies, all eBeam resist-coated materials are exposed in the same manner: by directly writing onto the relevant coating with an electron beam. The input current and voltage of the beam, and overall dosage delivered to the coating, may be judiciously adapted by the skilled person without undue burden.

In the present studies the exposure clearing doses of each resist material was determined from a two 1-dimensional matrix of a single pixel line by 20 μm, therefore the width of the line was the width of the electron beam. The first 1-dimensional matrix had each single pixel line separated by a pitch of 100 nm. These were exposed with a dose scale from 1 to 20.95 pC/cm in incremental steps of 0.05 pC/cm, while, the second 1-dimensional matrix had a pitch of 200 nm.

The dose scale was increased from a dose factor of 1 to 17.95 pC/cm with the same incremental step as the 100 nm pitch. Test patterns were then produced. All resists were then exposed using a FEI Sirion Scanning Electron Microscope (SEM). The exposed pattern was written using an acceleration voltage of 30 keV, a probe current of 50 pA, the dwell time was 12.12 ρS and the step size was 6.1 nm. From these exposure parameters, the base dose was calculated to be 1000 pC/cm. Each pattern was exposed using a write field of 100 μm.

Example 4—Formation of Patterned Substrate (i.e. Developing Exposed Resist Coating)

Each material was developed using a solution of Hexane, for 30s followed by an N2 blow dry.

All patterns fabricated in all of the resist were inspected using a Leica optical microscope using a 10× objective lens.

Example 5—Predictive Models

Monte Carlo Simulation

The Monte Carlo simulation presented is based on the model developed by Joy (D. C. Joy, *'Monte Carlo Modeling for Electron Microscopy and Microanalysis', pp.* 33, *Oxford University Press,* (1995)). When electrons are incident on a resist film they are scattered elastically and inelastically with the molecule throughout the resist. These two scattering events are governed by two different sets of equations. Elastic scattering is determined by the screened Rutherford cross section, $$\sigma_{elastic} = \frac{Z^2}{E^2} \frac{4\pi}{\alpha(1+\alpha)} \left( \frac{E+511}{E+1024} \right)^2 \text{cm}^2/\text{atom}, \quad (2)$$

where E is the electron energy in keV, Z is the atomic number of the material or if the material is a compound then the effective atomic number is used. α is the screening factor, this compensates for the fact that the electron does not 'see' the all of the atom's charge as it is surrounded by a cloud of electrons. The mean free path is calculated from the scattering cross section is given by $$\lambda_{elastic} = \frac{A}{N_a \rho \sigma_{elastic}}, \quad (3)$$

where A is the atomic weight of the material and Na is Avogadro's number. Inelastic scattering however, must use a different relationship because there is a high probability that a secondary electron (SE) is produced from this scattering event. Therefore, the inelastic scattering cross section is calculated using, $$\frac{d\sigma_{inelastic}}{d\Omega} = \frac{\pi e^4}{E^2} \left( \frac{1}{\Omega^2 + (1-\Omega)^2} \right), \quad (4)$$

where ΩE is the energy of the secondary electron produced. The inelastic scattering event causes the primary electron to be deflected by an angle α given by $$\sin^2\alpha = \frac{2\Omega}{2+t-t\Omega}, \tag{5}$$

where t is the kinetic energy of the electron (in units of its rest mass). However the secondary electron created exits the collision at an angle γ given by, $$\sin^2\gamma = \frac{2(1-\Omega)}{2+t\Omega}, \tag{6}$$

Once the inelastic scattering cross section is calculated, the mean free path of the electron must be calculated using, $$\lambda_{inelastic} = \frac{A}{N_a Z \rho \sigma_{inelastic}}, \tag{7}$$

The total mean free path of the electron in resist is the sum of the elastic and inelastic mean free paths $$\frac{1}{\lambda_{total}} = \frac{1}{\lambda_{elastic}} + \frac{1}{\lambda_{inelastic}}. \tag{8}$$

From the value of the mean free path, the statistical distance the electron will travel before it collides again can be calculated. This is achieved using the step size equation given by, $$s = -\lambda \ln(RND), \tag{9}$$

where λ is the total mean free path and RND is a random number between 0 and 1. This gives a distribution of step sizes with an average step size of λ.

The final step of the Monte Carlo simulation is to calculate the energy lost by the electron during the scattering event. This was done using the modified Bethe equation, which governs the stopping power of a material and is given by, $$\frac{dE}{dS} = 78500 \frac{Z}{AE} \ln\left(\frac{1.166(E+0.85J)}{J}\right), \tag{10}$$

where J is the mean ionization potential of the material. The mean ionization potential describes the energy losses the electron experiences in a given material, it can be calculated by, $$J = 9.76(Z) + \frac{58.5}{Z^{0.19}}, \tag{11}$$

Every time an electron scatters, this energy loss value is calculated and subtracted from the current energy of the electron. Once the electron's energy falls below 0.5 KeV, the electron was no longer tracked as the distance it travels in the material is negligible.

For the inclusion of the nanocomposite material to the base material a weighted average distribution was used, here the percentage (by weight) of the two materials was compared to a random number generator to calculate the material the electron effectively scatters off for each step.

$$\sigma_{total} = \omega \sigma_{HAuCl_4} + (1-\omega)\sigma_{PMMA}, \tag{12}$$

where ω is the relative weight of the anti-scattering compound to PMMA.

The electron beam resists modeled here had thickness of 100 nm. All resists systems are on 600 nm of Silicon and the physical properties of one (GW20-14 of Example 1B) are given in Table 2.

TABLE 2

Physical properties of the GW20 - 14 molecules that was used in the Monte Carlo model.
GW20-14 is [{Ni12(chp)12(O2CMe)12(H2O)6}{[NH2Pr2][Cr7NiF8(O2CtBu)15(O2C—C5H4N)]}6]

| Physical property | GW20 - 14 | Silicon [12] |
|---|---|---|
| Density (g/cm³) | 0.814 | 2.33 |
| Effective Atomic Number | 0.21 | 14 |
| Average Atomic Weight (g/mol) | 16886.04 | 28.0855 |
| Mean Ionization Potential (eV) | 87.43 | 174 |

The density was experimentally determined from the unit cell contents determined by X-ray diffraction (XRD) measurements and the effective Atomic number and the average Atomic weight of the each material was calculated and also determined from the XRD measurements whereas, the mean ionization potential was calculated from equation 11. The Monte Carlo simulation used here can be found in S. Lewis et al, 'Influence of nanocomposite materials for next generation nanolithography', Advances in diverse industrial applications of nanocomposite', Intech, pp 503-528, March 2011, and also in S. Lewis et al, 'Characterization of an ultra high aspect ratio electron beam resist for nanolithography', Nanotechnology 2010: Electronics, Devices, Fabrication, MEMS, Fludics & Computational, Vol 2, pp 195-198.

The incident electron beam that the simulation used had a Gaussian distribution of 3σ, where the spot size had a diameter of 3 nm. The simulation was run with a 100000 electrons and was run 1,000,000 times and averaged to reduce the statistical error.

Results & Discussion

Results A—Tests Upon Resist Coatings Containing $Cr_7Ni(2\text{-Ethylhexanoate})_{16}$ Complex of Example 1A A variety of experiments were conducted using the resist compositions of Example 1A, and resist-coated materials of Example 2A, which are discussed below.

It was shown by the Monte Carlo simulations that when the molecular weight of the $Cr_7Ni(2\text{-EthylHexanote})_{16}$ complex was increased from 2000 to 16000 g/mol the number of secondary electrons decreased from 12 to 0 (when the density was 0.8 g/cm³), this can be seen in FIG. 1. However, by increasing the density (2 g/cm³) of the molecule gave rise to an increase of secondary electrons generated of 8.5 times. This is significant amount of secondary electrons within the resist as these electrons are responsible for exposing the resist laterally, thus broadening the desired nanostructure and this is shown in FIG. 1.

FIG. 1 is a chart showing the number of Secondary Electrons generated in a 100 nm thick films at 30 KeV eBeam exposure for compounds of molecular weights shown as a function of density.

FIG. 1 shows a red cross surrounded by a red box, this exhibits the real parameters for the $Cr_7Ni(2\text{-EthylHexa-}$ note)$_{16}$ complex molecule (which is in fact [NPr$_2$H$_2$][Cr$_7$NiF$_8$(2-EthylHexanote)$_{16}$]), where it has a molecular weight of 2968.02 g/mol and a density of 1.25 g/cm$^3$. It can be clearly seen that this molecule generates 13 secondary electrons, when comparing this to PMMA where in previous studies it had been ascertained that it produces 200 at the incident energy of 30 KeV [1]. Therefore the PMMA produces approximately 15 times more secondary electrons. This is significant, as this is related to the ultimate resolution that can be determined.

To produce the highest fidelity resolution the optimum material parameters was found to have the largest molecular weight and the lowest density possible because to produce the highest resolution nano structure the number of secondary electrons must be zero. This is that case when the molecular weight was 16000 g/mol and the density was 0.8 to 1.15 g/cm$^3$ respectively and this is indicated by the red box in FIG. 3. This is the optimum material properties.

Figure 2:
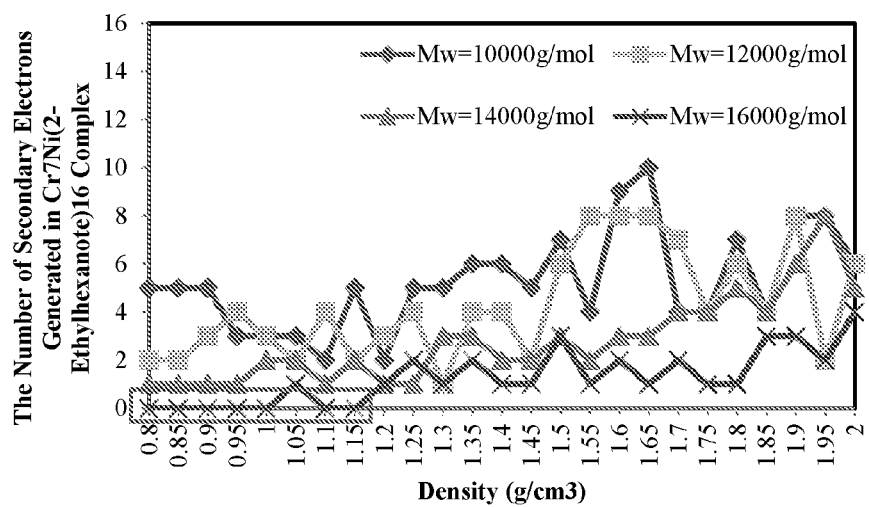
FIG. 2 is a chart showing a close up of FIG. 1, where the molecule weight is varied from 10000 to 16000 g/mol. All conditions are the same as FIG. 1.

The observation seen in FIG. 2 illustrate that the primary electrons do not interact with molecule, as it has significant amounts of empty space. This is because the density of the Cr$_7$Ni(2-EthylHexanote)$_{16}$ complex is smaller than that of the PMMA material, due to that the mean free path between the atoms of the molecule is larger. Therefore, the primary electrons (PE) will experience a reduced amount of collisions as it travels through the resist film. From this, It is evident that as the molecule weight of the Cr$_7$Ni(2-EthylHexanote)$_{16}$ complex is increased, the number of SE's that are generated decreases. This is because the molecular weight of the Cr$_7$Ni(2-EthylHexanote)$_{16}$ complex is large (above 14000 g/mol) and governs a smaller the concentration of scattering centers (with the properties of a larger effective atomic number, density and ionization potential than that of the polymer) can be incorporated into the polymer film.

FIG. 2 is a chart showing a close up of FIG. 1, where the molecule weight is varied from 10000 to 16000 g/mol. All conditions are the same as FIG. 1.

As a consequence of this is that the primary electrons lose very little amount of energy, for the case of Cr$_7$Ni(2-EthylHexanote)$_{16}$ complex it is 150 eV per collision when compared to that of PMMA material, which is 74 eV. Thus, the primary electrons are fast enough not to cause multiple inelastic scattering events and generate more and more SE. Therefore, it is expected that a large exposure dose is required because the statistical chance of generating a secondary electron is extremely low.

Figure 3:
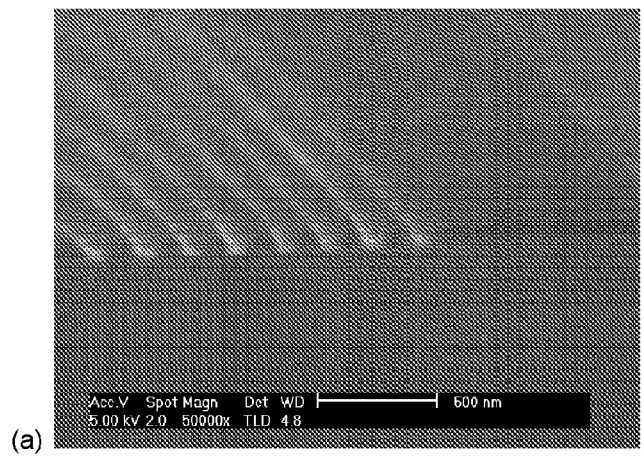
FIG. 3 shows SEM images illustrating: a) 50 nm lines exposed in PMMA with a dose of 774 pC/cm. The sample was developed with MIBK:IPA with the ratio of 1:3. b) 6.22 nm lines exposed in GW20-14 with a dose of 6200 pC/cm. The sample was developed with Hexane.
Figure 3:
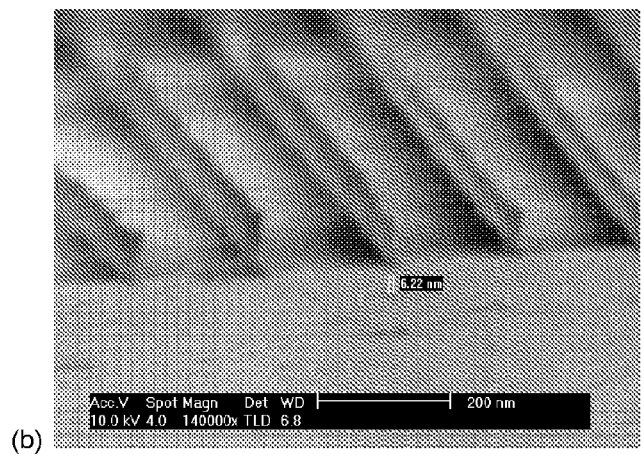

As a comparison the GW20-14 ring of ring material (Example 1B, chemical composition [{Ni12(chp)12 (O2CMe)12(H2O)6}{[NH2Pr2][Cr7NiF8(O2CtBu)15 (O2C—C5H4N)]}6]—it's material parameters are density is 0.814 g/cm$^3$, effective atomic number is 4.4, molecular weight is 16886.02 g/mol and its ionization potential is 87.43 eV) was spun directly on to a silicon substrate, this resulted with a film of 100 nm thick. FIG. 3 shows a nano-grating pattern was fabricated in PMMA and GW20-14 ring of ring structure. The PMMA material produced nanostructures with line widths of 50 nm, and this can be seen in FIG. 3a. Whereas, the GW20-14 ring of ring material resulted with a pattern which exhibited line widths of 6.22 nm. This is a significant result because it demonstrates that this material offers a resolution of more than 8 times that of PMMA for the same resist thickness.

FIG. 3 shows SEM images illustrating: a) 50 nm lines exposed in PMMA with a dose of 774pC/cm. The sample was developed with MIBK:IPA with the ratio of 1:3. b) 6.22 nm lines exposed in GW20-14 with a dose of 6200pC/cm. The sample was developed with Hexane.

It was found that the GW20-14 material produced an increase in exposure dose. This gave rise to exposure dose of 6200 pC/cm, which is slower by a factor of ~8 when compared to the industry standard PMMA, respectively. From this it can be ascertained that the exposure method was not contributed by the presence of SE, as the molecule prohibits the creation of secondary electrons. Therefore, the primary electrons are responsible for the production of the pattern. This can be seen because the side wall profile appears to exhibit perpendicular angle of 90° when compared to the Silicon. This was shown to show strong agreement with the Monte Carlo simulation. Thus extrapolations from the Monte Carlo simulation of how other materials would behave in terms of their anti-scattering properties are entirely credible and justified.

A metal organic negative tone electron beam resist have been investigated using Monte Carlo Model. It was shown by the Monte Carlo simulations that the Cr$_7$Ni(2-EthylHexanote)$_{16}$ complex compound did not generate any secondary electrons when the molecular weight was 16000 g/mol and the density was 0.8 to 1.15 g/cm$^3$. This demonstrated strong agreement between the simulation and the experimental results because it was shown that the GW20-14 ring of ring material resulted with a pattern which exhibited line widths of 6.22 nm. This is a significant result because it demonstrates that this material offers a resolution of more than 8 times that of PMMA for the same resist thickness. It was found that to the produce these nano structures an exposure dose of 6200 pC/cm was required. From this, it can be deduced that the primary electrons are responsible for the production of the pattern because the molecule prohibits the generation of secondary electrons and therefore cannot be the exposure method.

Results B-E—Tests Upon Resist Coatings Containing Antiscattering Compounds Described in Examples 1B-1E These studies demonstrate that the eBeam resists of the invention ensure that the primary electrons are confined to the immediately write area and as a consequence this constrains the lateral electron scattering of the secondary electrons (SE) thus, the highest resolution can be obtained. It was shown by the Monte Carlo simulations that Nickel Chromium cages decreased the amount of SE's significantly within the material and this is shown in FIG. 4.

Figure 4:
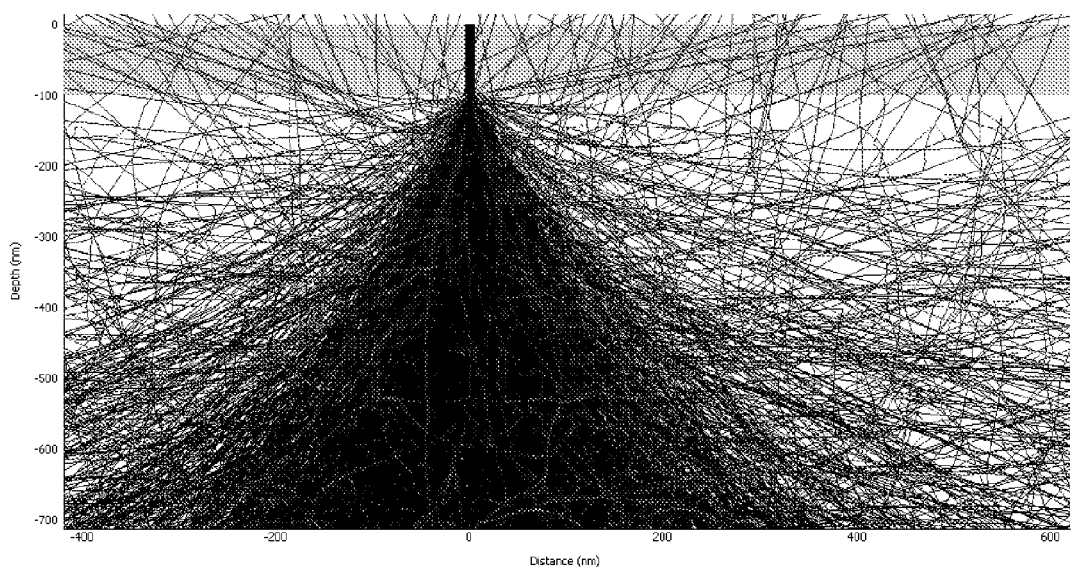
FIG. 4 is a chart showing the internal electron scattering interactions inside the Nickel Chromium ring like structured materials exposed to an acceleration voltage of 30 KeV. Secondary electrons and backscattered electrons are indicated in Red and Blue respectively.

FIG. 4 is a chart showing the internal electron scattering interactions inside the Nickel Chromium ring like structured materials exposed to an acceleration voltage of 30 KeV. Secondary electrons and backscattered electrons are indicated in Red and Blue respectively.

FIGS. 5-9 show SEM micrographs of sub—30 nm structures that were fabricated with the GW20-14 (Ex. 1B), 7—Rotaxane (Ex. 1C), GT188-13 (Ex. 1D) and GT133-14 (Ex. 1E) resists respectively.

Figure 5:
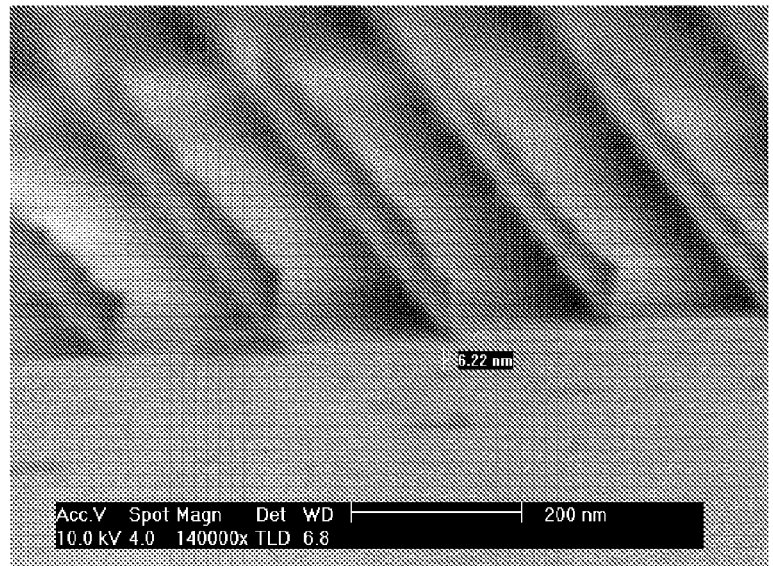
FIG. 5 shows SEM images illustrating: (a) Profile view of 6.22 nm lines on a 200 nm pitch (tilt) 70°. (b) Profile view of 10.4 nm lines on a 100 nm pitch (tilt 70°). Dose is 6200 pC/cm.
Figure 5:
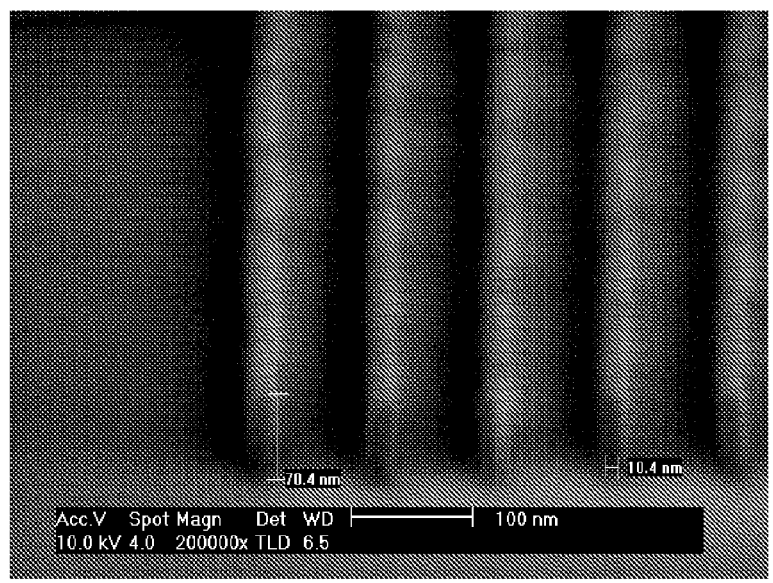

FIG. 5 shows SEM images illustrating: (a) Profile view of 6.22 nm lines on a 200 nm pitch (tilt 70°). (b) Profile view of 10.4 nm lines on a 100 nm pitch (tilt 70°). Dose is 6200pC/cm. FIG. 5 shows the GW20-14 material that had been patterned to produce a resolution of 6.22 and 10.4 nm with a pitch of 200 and 100 nm respectively.

The aspect ratio seen here is 16:1 and 10:1 respectively. These nanostructures obtained show strong agreement with the predications produced by the Monte Carlo simulation illustrated in FIG. 4.

From these observations, it can be deduced that the interaction between the generation of SE's and the material cannot occur. This is because the density of the molecule is 0.814 g/cm3 and its molecular weight is large (16886.04 g/mol). From this, most of the film is free space and as a consequence the primary electrons are constrained and cannot produce SE, therefore lateral electron scattering is prohibited. Hence, a resolution of 6.22 nm is achieved.

Figure 6:
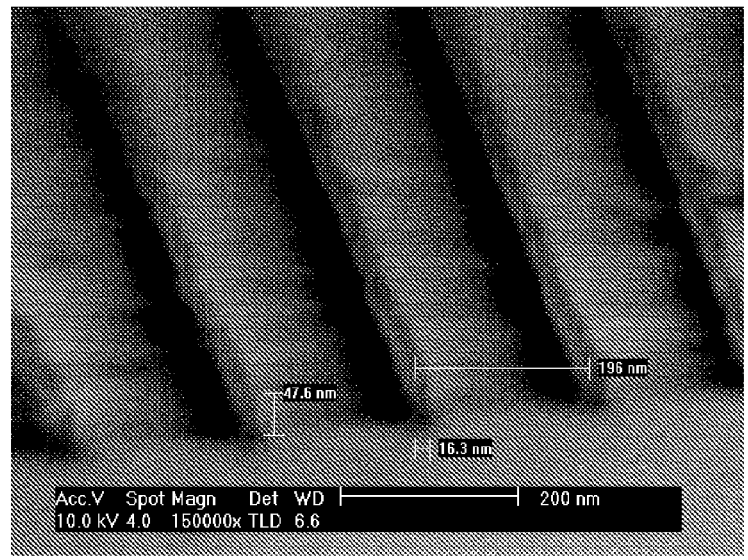
FIG. 6 shows an SEM image illustrating a profile view of 16.3 nm lines on a 200 nm pitch (tilt) 70°. Dose is 6000 pC/cm.

FIG. 6 shows an SEM image illustrating a profile view of 16.3 nm lines on a 200 nm pitch (tilt 70°). Dose is 6000pC/cm. FIG. 6 shows the resultant nanostructures that were fabricated using the 7—Rotaxane material. From this material, nanostructures with line widths of 16.3 nm have been demonstrated. In turn, this gave an aspect ratio of 6.1:1. Interestingly, despite the decreased resolution, the exposure dose remains consistent with the exposure dose that produced the nanostructures in the GW20-14 material.

Figure 7:
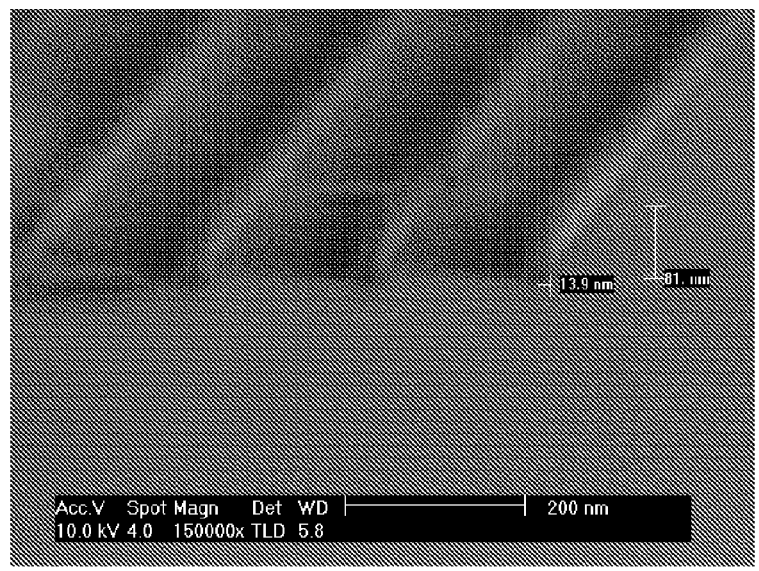
FIG. 7 shows an SEM image of GT188-13 material illustrating a profile view of 13.9 nm lines on a 200 nm pitch (tilt 70°). Dose is 16850 pC/cm.

FIG. 7 shows the resultant nanostructures that were fabricated using the GT188-13 material. From this material, nanostructures with line widths of 13.9 nm have been demonstrated. In turn, this gave an aspect ratio of 7.2:1. It has been noticed that the exposure dose has increased dramatically.

FIG. 7 shows an SEM image of GT188-13 material illustrating a profile view of 13.9 nm lines on a 200 nm pitch (tilt 70°). Dose is 16850pC/cm.

Figure 8:
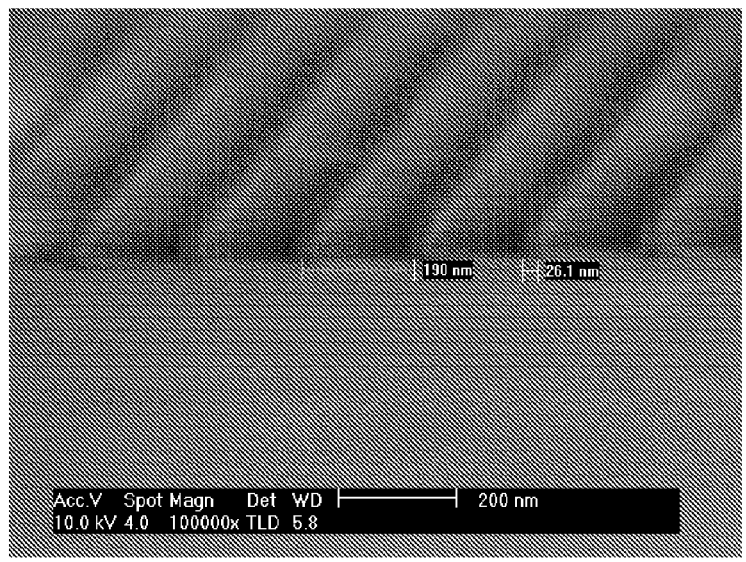
FIG. 8 shows an SEM image of the GT133-14 material illustrating a profile view of 26.1 nm lines on a 200 nm pitch (tilt 70°). Dose is 1000 pC/cm.

The nanostructures produced by the GT133-14 material can be seen in FIG. 8. The GT133-14 material produced nanostructures with a resolution of 26.1 nm and an aspect ratio of 3.8:1. The decreased resolution was expected because the 2-Methyl-4-Pentenoic acid was incorporated into the molecule to serve has a cross linker. This was preformed to increase to sensitivity of the material, which was approximately 2000pC/cm. This is an improvement on previous materials presented in FIGS. 5-7.

FIG. 8 shows an SEM image of the GT133-14 material illustrating a profile view of 26.1 nm lines on a 200 nm pitch (tilt 70°). Dose is 1000 pC/cm.

The sensitivity was increased at the expense of resolution, this was due to that the 2-Methyl-4-Pentenoic acid produces free radicals upon exposure and subsequently they produce SE. These electrons scatter laterally and interact with the adjacent molecules and cross links them together forming a web like structure. Hence, the exposure dose is lower while broadening the resultant resolution of the nanostructure.

Figure 9:
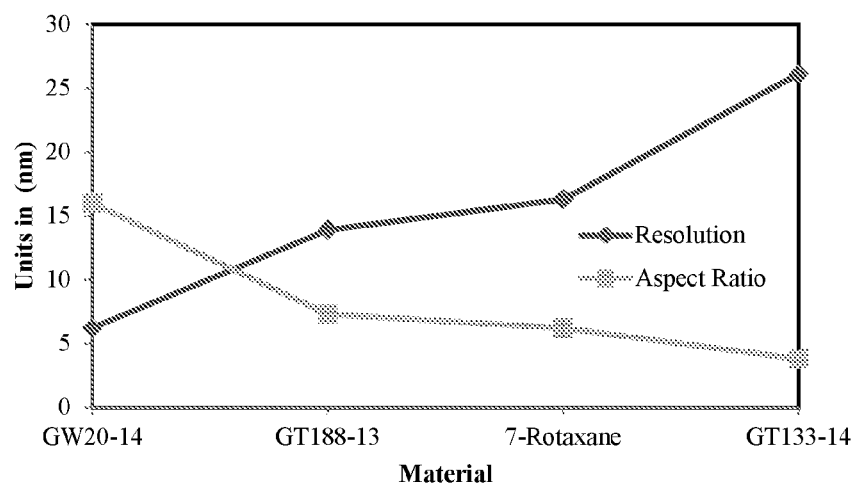
FIG. 9 is a chart showing Resolution and Aspect ratio of each antiscattering compound with a 200 nm pitch.

FIG. 9 is a chart showing Resolution and Aspect ratio of each antiscattering compound with a 200 nm pitch. FIG. 9 depicts the optimum material that produced the highest resolution and aspect ratio was the GW20-14. It is evident that as the resolution decreases the aspect ratio that can be achieved also decreases.

It was found that the Nickel Chromium ring like structured materials produce an increase in resolution of 6.22 nm while exhibiting aspect ratios larger than 10:1 at an accelerating voltage of 30 KeV, whilst the 7—Rotaxane and GT188-13 material obtained a decrease in resolution and aspect ratio. This result is significant as this is not possible using industry standard polymeric type materials such as PMMA. This gave rise to exposure dose of 6200 pC/cm, which is slower by a factor of 8 when compared to the industry stand PMMA. From this it can be ascertained that the exposure method was not contributed by the presence of SE, as the molecule prohibits the creation of secondary electrons. Therefore, the primary electrons are responsible for the production of the pattern. This can be seen because the side wall profile appears to exhibit perpendicular angle of 90° when compared to the Silicon. This was shown to show strong agreement with the Monte Carlo simulation.

When the sensitivity of these materials was increased by a factor of 6.2, the resolution decreased significantly. This was attributed by the generation of secondary electrons scattering at an angle of 80° and broadening the resultant nanostructure. Secondary electrons were generated from the 2-Methyl-4-Pentenoic acid present in the molecule. Therefore, this confirms the role of secondary electrons.

Further Results Relating to GW20-14 (of Example 1B)

Figure 10:
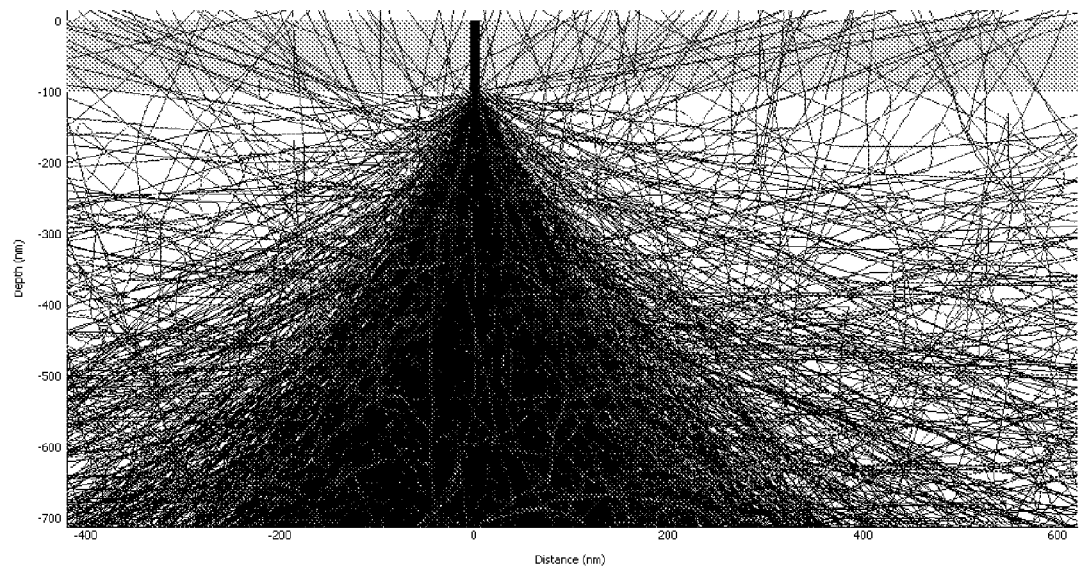
FIG. 10 is a chart showing the internal electron scattering interactions inside GW20-14 using 30 KeV acceleration voltage. Secondary electrons and backscattered electrons are indicated in Red and Blue respectively.

It is evident from FIG. 10 that the primary electrons are confined to the immediate write area. This would suggest that a large exposure dose is required for the GW20-14 resist. This is because the density of the GW20-14 is smaller (0.814 g/cm$^3$, where conventional polymeric resists are 1.2 g/cm$^3$ and above) than conventional resist materials such as PMMA, this is attributed to that the mean free path between the atoms of the molecule is large due to the free space inside the Nickel Chromium ring like structure.

FIG. 10 is a chart showing the internal electron scattering interactions inside GW20-14 using 30 KeV acceleration voltage. Secondary electrons and backscattered electrons are indicated in Red and Blue respectively.

It can be seen from FIG. 10 that little energy is lost from the PE that the likely hood of creating a SE is very small. Moreover, the diameter of the molecule was measured to be 4.4 nm by 2.8 nm thick, this leads to a molecular weight of 16886.02 g/mol. The significance of this is that the molecule is large and the PE will not 'see' the entire molecule and can only scatter from the top and bottom surface of the cage. As the GW20-14 film thickness is 100 nm and thickness of the molecule is 2.8 nm. Therefore, there are approximately 35 molecules on top of each other (in the z-direction) and from this there are only approximately 72 scattering points that the PE can scatter from. Hence, this leads to a small chance of generating an inelastic scattering event. Of course, a SE can be created if the concentration of the PE inserted into the film is increased; from this a large exposure dose is expected.

Figure 11:
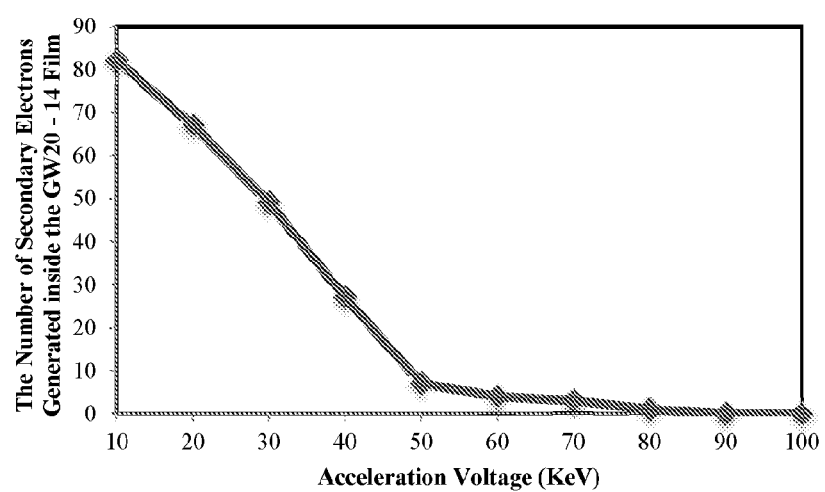
FIG. 11 is a chart showing the number of Secondary Electrons generated in a 100 nm thick GW20-14 film.

FIG. 11 is a chart showing the number of Secondary Electrons generated in a 100 nm thick GW20-14 film.

FIG. 11 shows the number of SE generated inside the GW20-14 resist film. It is evident that at the lower energies of 10 to 50 KeV, the PE is slow enough to cause multiple inelastic scattering events and generate more and more SE, this is expected from equations 4 and 6. However, at the larger energies of 50 KeV to 100 KeV, the incident electron has more energy associated with it, and therefore, to generate a secondary electron it needs to have more collisions with the atoms in the resist material to lose most of its energy to generate a SE. However, as the film is a 100 nm thick, there are not enough atoms in the film (in the z direction) to scatter off to lose a large proportion of its energy. The consequence of this is that the a substantial number of PE's will come to rest deep into the silicon substrate below or they will be back scattered into the underside of the resist material, approximately 30-40 μm away from the immediate exposure area. Thus, higher resolution can be achieved by exposing the resist with 100 KeV tool by confining the forward scattering electrons to the incident beam inside the resist, but at the expense of larger writing times. Currently, 50 KeV tools are employed by the semiconductor industry. This is because it is seen that the threshold of resolution vs writing times is at this acceleration voltage, and reflects this philosophy, as the number of SE created is relatively constant.

FIG. 12a and FIG. 12b show the GW20-14 material that had been patterned to produce a resolution of 6.22 and 10.4 nm with a pitch of 200 and 100 nm respectively. The aspect ratio seen here is 16:1 and 10:1 respectively. These nanostructures obtained show strong agreement with the predications produced by the Monte Carlo simulation illustrated in FIG. 10. From these observations, it can be deduced that the interaction between the generation of SE's and the material cannot occur. This is because the density of the molecule is 0.814 g/cm$^3$ and its molecular weight is large (16886.04 g/mol). From this, most of the film is free space and as a consequence the primary electrons are constrained and cannot produce SE, therefore lateral electron scattering is prohibited. Hence, a resolution of 6.22 nm is achieved.

To produce these nanostructures the exposure doses required was 6200 and 9950 pC/cm. This was expected because the results of the simulation shown in FIG. 4 predicted that the probability of generating a SE is very small. It is well known that these SE will experience an increased number of scattering events (due to that their associated energy is considerably lower than that of the PE) and these collisions generate even more SE. This is significant, that the SE are scattered at angles larger than 80° in arbitrary trajectories away from the primary beam. These electrons expose the resist material laterally. This is why the SE plays a major role in producing the nano structure.

Figure 12:
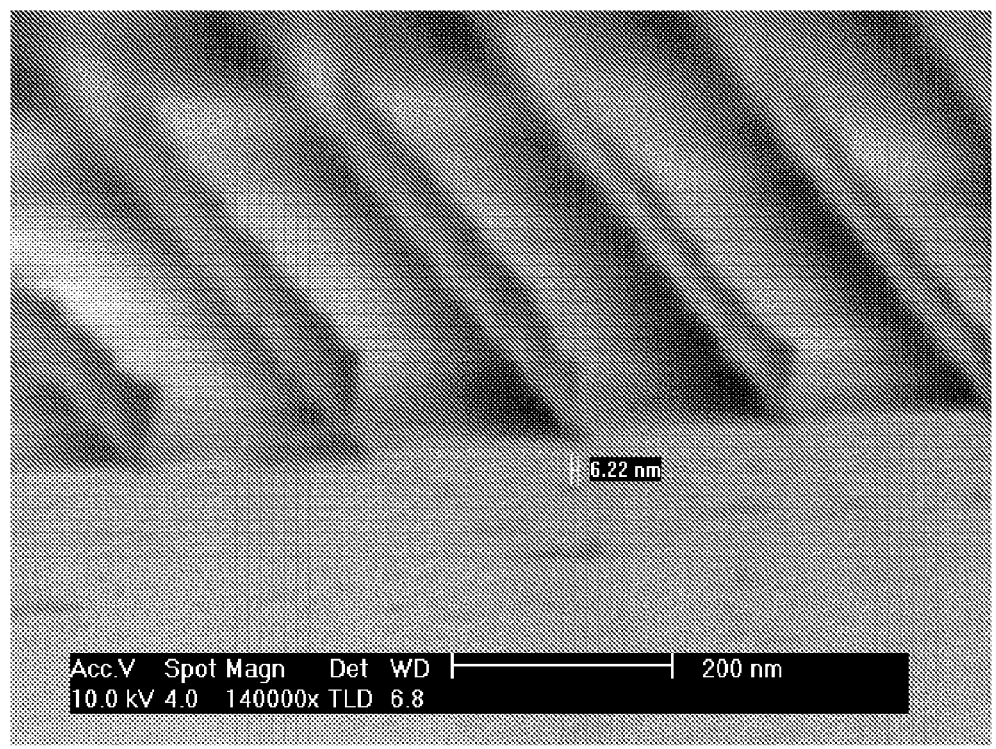
FIG. 12 shows SEM images illustrating (a) Profile view of 6.22 nm lines on a 200 nm pitch (tilt) 70°. (b) Profile view of 10.4 nm lines on a 100 nm pitch (tilt 70°).
Figure 12:
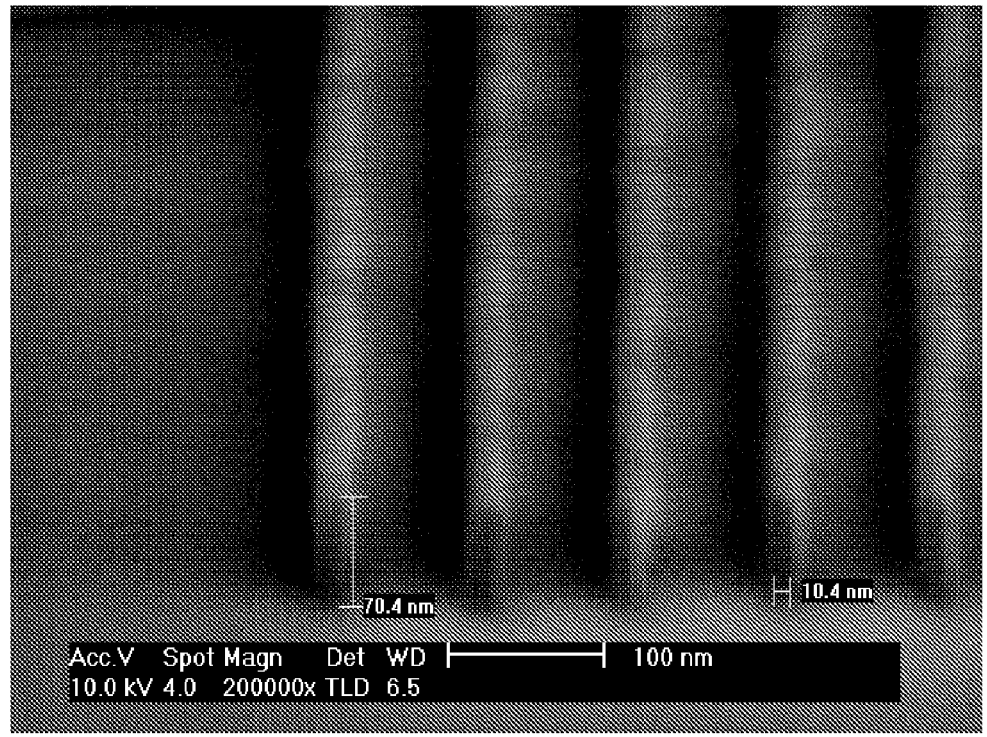

FIG. 12 shows SEM images illustrating (a) Profile view of 6.22 nm lines on a 200 nm pitch (tilt 70°). (b) Profile view of 10.4 nm lines on a 100 nm pitch (tilt 70°).

Figure 13:
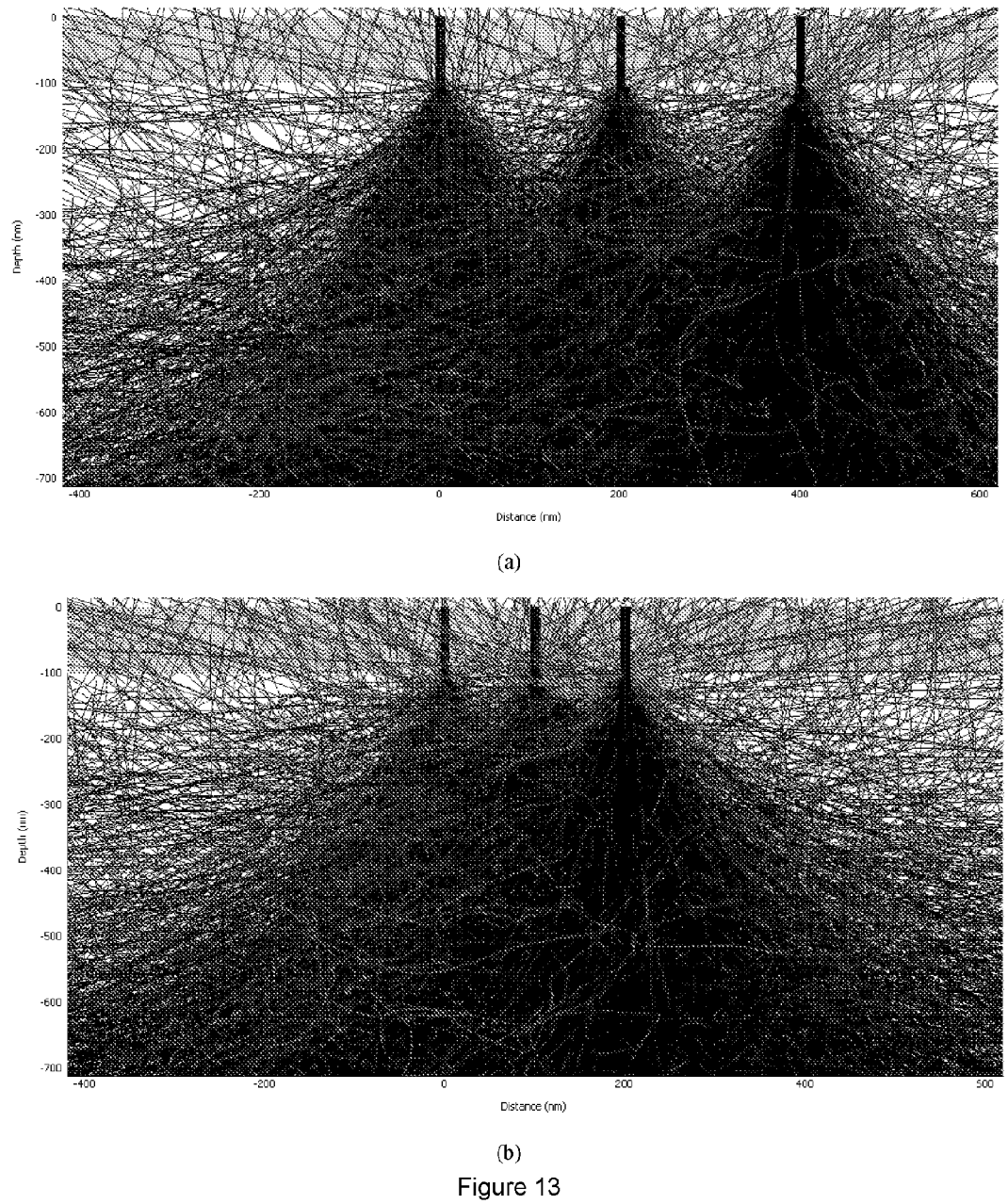
FIG. 13 is a chart showing the internal electron scattering interactions inside (a) GW20-14 that had a 7.5 nm nanostructure with a 200 nm pitch and had a dose of 6200 pC/cm, (b) GW20-14 that has a 10 nm nanostructure with a 100 nm pitch and has a dose of 9950 pC/cm. Secondary electrons and backscattered electrons are indicated in Red and Blue respectively.
Figure 14A:
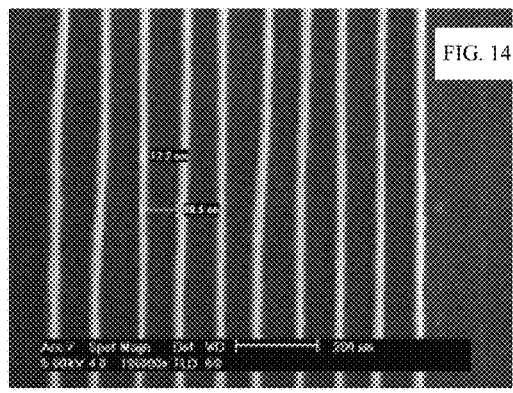
FIGS. 14A-14K are SEM images showing various lines written using eBeam in the various eBeam resist compositions.
Figure 14B:
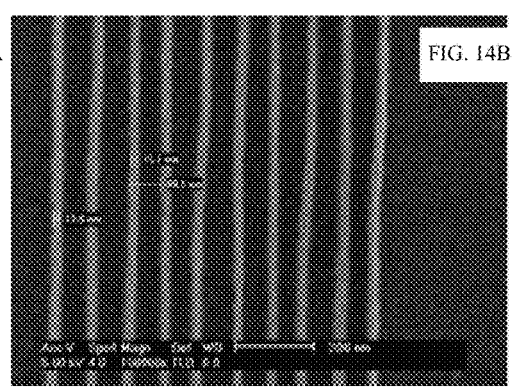
Figure 14C:
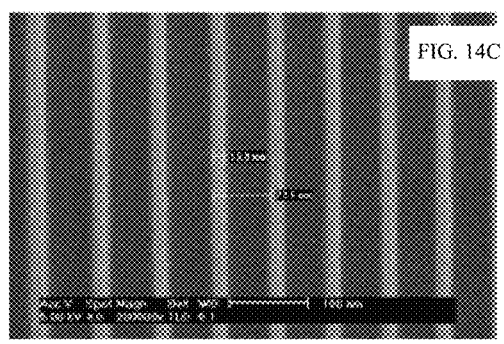
Figure 14D:
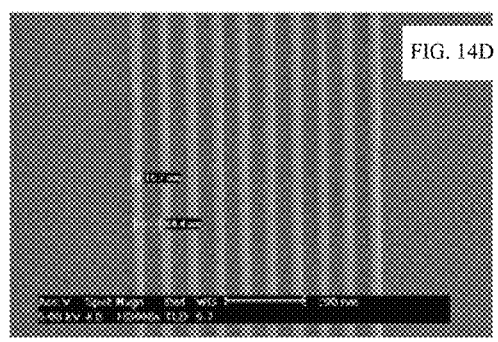
Figure 14E:
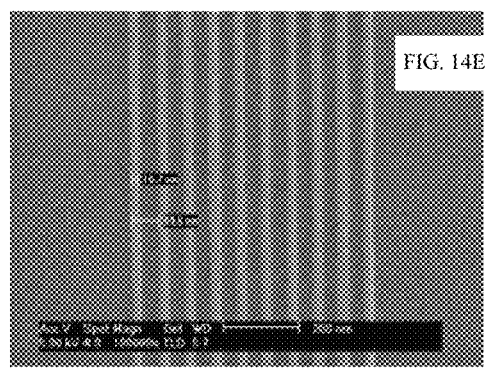
Figure 14F:
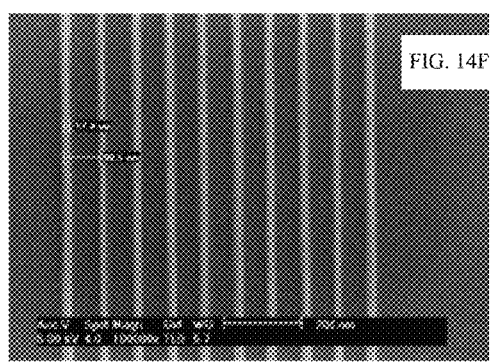
Figure 14G:
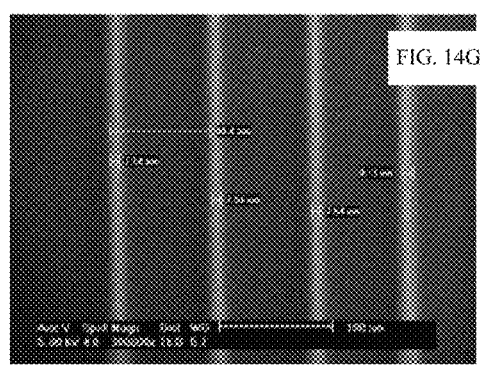
Figure 14H:
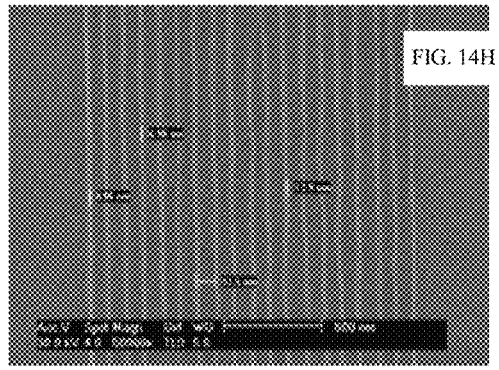
Figure 14I:
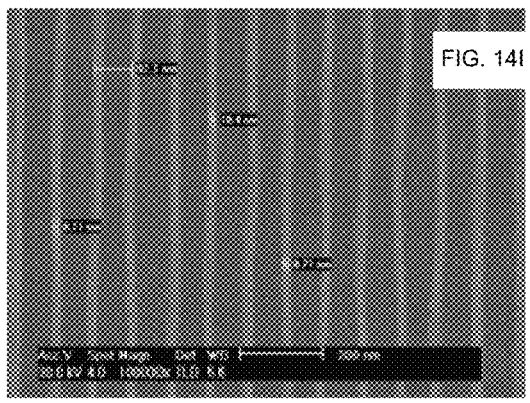
Figure 14J:
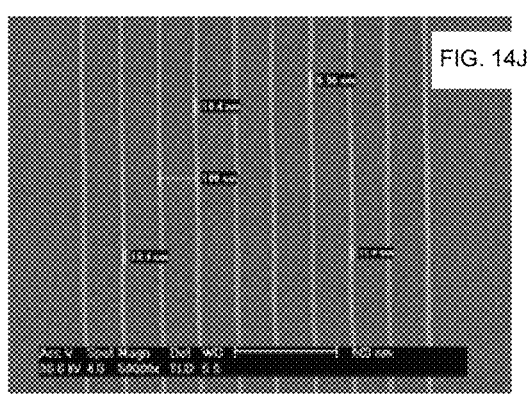
Figure 14K:
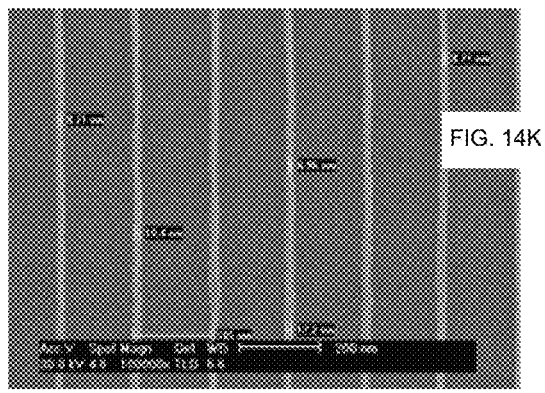

From the exposure doses presented in FIG. 12, it was possible to calculate the number of electrons that were incident on each of the GW20-14 samples. To achieve this, the exposure parameters that produced the nanostructures were; the step size between each exposure is 6.1 nm and the current and dwell time is 50 pA and 12.12 μS respectively. The dose factor to fabricate the nanostructures with a pitch of 200 and 100 nm was 6.2 and 9.95 respectively. Therefore, the number of electrons inserted to the GW20-14 materials was 23482 and 37686 respectively. FIG. 13 shows a Monte Carlo simulation of the scattering trajectory cross sections when three nanostructures are fabricated.

It can be seen in FIGS. 7a and 7b that the simulation had produced nanostructures with line widths of 7.5 and 11 nm. Comparing these theoretical results with experimental observations presented in FIG. 12, good agreement is found. Indeed the results of the model were increased by a factor of 1.2 and 1.06, therefore, this equated that the model has a discrepancy of approximately 1 nm.

FIG. 13 is a chart showing the internal electron scattering interactions inside (a) GW20-14 that had a 7.5 nm nanostructure with a 200 nm pitch and had a dose of 6200 pC/cm, (b) GW20-14 that has a 10 nm nanostructure with a 100 nm pitch and has a dose of 9950 pC/cm. Secondary electrons and backscattered electrons are indicated in Red and Blue respectively.

It was found that the Nickel Chromium ring like structured materials produce an increase in resolution of 6.22 nm while exhibiting aspect ratios larger than 10:1 at an accelerating voltage of 30 KeV. This result is significant as this is not possible using industry standard polymeric type materials such as PMMA. This gave rise to exposure dose of 6200 pC/cm, which is slower by a factor of 8 when compared to the industry stand PMMA. From this it can be ascertained that the exposure method was not contributed by the presence of SE, as the molecule prohibits the creation of secondary electrons, due that its density was 0.814 g/cm$^3$ and its molecular weight was 16886.02 g/mol. This equates to approximately 72 possible interactions that the primary electrons can experience with the entire film in the z-direction. Therefore, the primary electrons are responsible for the production of the pattern. This can be seen because the side wall profile appears to exhibit perpendicular angle of 90° when compared to the Silicon. This was shown to show strong agreement with the Monte Carlo simulation.

Applications of Technology

In view of the excellent resolution and aspect ratios obtainable in lithographic methods according to the invention, it is clear the resist compositions and methods of the invention are ideal for producing improved and potentially smaller integrated circuits. The skilled person is well able to adapt current IC production methods to incorporate one or more lithographic steps using resist compositions of the invention. Alternatively, the present invention allows the skilled person to produce a high-resolution lithographic mask, which may then in turn be used in the production of integrated circuits.

The present invention thus represents a significant contribution to a field which has long needed the advances in resolution, and practicalities afforded by the present invention.

Example 6—Anti-Scattering Compounds with Appended Secondary Electron Generator(s) and/or Scattering Compound(s)

Though the eBeam resist compositions comprising the unadulterating anti-scattering compounds described in the previous examples perform exceptionally well, the following further experiments were performed in order to establish whether the benefits of the unadulterated anti-scattering compounds (e.g. extremely high resolution) could be substantially maintained whilst increasing write speeds. To this end, various anti-scattering compounds were associated (by way of dative bonds) with either or both a secondary electron generator (such as one of those recently developed by the same research team as per co-pending application PCT/GB2015/050884) and/or a scattering compound, such as the alkene-based compounds now described.

The following procedures describe the fabrication of the relevant tested products.

Example 6.1—Synthesis of ["Pr$_2$NH$_2$][Cr$_7$NiF$_8$(O$_2$C$^t$Bu)$_{15}$(O$_2$CC$_5$H$_4$N)] (Compound 1)

Figure 17:
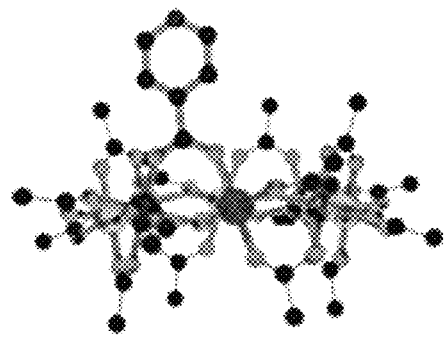
FIG. 17 depicts Compound [″Pr$_2$NH$_2$][Cr$_7$NiF$_8$(O$_2$C$^t$Bu)$_{15}$(O$_2$CC$_5$H$_4$N)].

See FIG. 17

Compound ["Pr$_2$NH$_2$][Cr$_7$Ni(μ-F)$_8$(O$_2$C$^t$Bu)$_{16}$] (15.0 g, 6.54 mmol), iso-nicotinic acid (2.48 g, 19.5 mmol) and n-propanol (300 mL) were refluxed for 24 h with constant stirring. The resulting solution was cooled to room temperature and filtered. The solvent from the filtrate was removed under reduced pressure and extracted in diethyl ether (300 mL). The obtained solution was filtered and the diethyl ether was removed under reduced pressure leaving a solid. This was extracted in pentane (200 mL), filtered and evaporated to dryness giving a green solid, which was still a mixture of products. The mixture of compounds were separated and purified by flash chromatography. First, toluene was used as eluent, which allowed un-reacted starting material to be eluted, leaving the products of the reaction at the top of the column. Thereafter a mixture of petroleum ether/ethyl acetate (20/1) elution was used to remove any remaining unreacted starting material. The solvent ratio was then gradually increased to 10/1, eluting a large single band of 1.

The solvent was removed under reduced pressure to obtain the title compound. 1 Yield: 4.89 g (32%). Elemental analysis (%) calcd for $C_{87}H_{155}Cr_7F_8N_2NiO_{32}$: Cr, 15.72; Ni, 2.53; C, 45.12, H, 6.75; N, 1.21. found: Cr, 15.97; Ni, 2.56; C, 44.90; H, 6.90; N, 1.19. ES-MS (sample dissolved in THF, run in MeOH): m/z=2338 [M+Na]'; 2316[M+H]'.

Coordination to 1Hg:

Compound 1 (100 mg, 0.04 mmol) was dissolved in hot acetone (10 mL). A solution of mercury chloride (11.7 mg, 0.04 mmol) in acetone (2 mL) was added dropwise and the green solution was stirred at 50° C. for 1 hour. The solution was cooled to room temperature and concentrated. A green microcrystalline powder was obtained. Elemental analysis (%) calcd for $C_{87}H_{155}Cr_7F_8N_2NiO_{32}Hg$: Cr, 14.46, Ni, 2.33; C, 41.53; H, 6.21; N, 1.11. found: Cr, 14.87; Ni, 2.67; C, 41.12; H, 5.88; N, 0.81.

Example 6.2—Synthesis of [$^nPr_2NH_2$][$Cr_7NiF_8$ $(O_2C^tBu)_{14}(O_2CC_5H_4N)_2$] (Compound 2)

Figure 18:
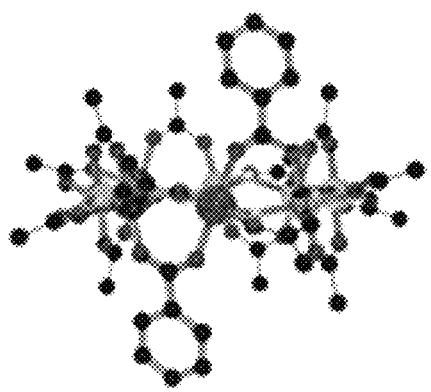
FIG. 18 depicts Compound [″Pr$_2$NH$_2$][Cr$_7$NiF$_8$(O$_2$C$^t$Bu)$_{14}$(O$_2$CC$_5$H$_4$N)$_2$].

See FIG. 18

Compound [$^nPr_2NH_2$][$Cr_7NiF_8(O_2C^tBu)_{14}(O_2CC_5H_4N)_2$] (15.0 g, 6.54 mmol), iso-nicotinic acid (2.48 g, 19.5 mmol) and n-propanol (300 mL) were refluxed for 24 h with constant stirring. The resulting solution was cooled to room temperature and filtered. The solvent from the filtrate was removed under reduced pressure and extracted in diethyl ether (300 mL). The obtained solution was filtered and the diethyl ether was removed under reduced pressure leaving a solid. This was extracted in pentane (200 mL), filtered and evaporated to dryness giving a green solid, which was still a mixture of products. The mixture of compounds were separated and purified by flash chromatography. First, toluene was used as eluent, which allowed un-reacted starting material to be eluted. Thereafter a mixture of petroleum ether/ethyl acetate (20/1) elution was used and then gradually worked up to a 5/1 mixture, eluting 2 as product. The solvent was removed under reduced pressure to obtain the title compound. Yield: 1.62 g (10%). Elemental analysis (%) calcd for $C_{88}H_{150}Cr_7F_8N_3NiO_{32}$: Cr, 15.57; Ni, 2.51; C, 45.25; H, 6.47; N, 1.80. found: Cr, 15.46; Ni, 2.38, C4 5.56; H, 6.77; N, 1.82. ES-MS (sample dissolved in THF, run in MeOH): m/z=2359 [M+Na]$^+$; 2337 [M+H]$^+$.

Coordination to 2Hg:

Compound 2 (100 mg, 0.04 mmol) was dissolved in hot acetone (10 mL). A solution of mercury chloride (23.1 mg, 0.08 mmol) in acetone (2 mL) was added dropwise and the green solution was stirred at 50° C. for 1 hour. The solution was cooled to room temperature and concentrated. A green microcrystalline powder was obtained. Elemental analysis (%) calcd for $C_{88}H_{150}Cr_7F_8N_3NiO_{32}Hg_2$: Cr, 13.29; Ni, 2.14; C, 38.61; H, 5.52; N, 1.53. found: Cr, 13.60; Ni, 1.09; C, 38.19; H, 6.01; N, 1.02.

Example 6.3—Synthesis of [$^nPr_2NH_2$][$Cr_7NiF_8$ $(O_2C^tBu)_{12}(O_2CC_5H_4N)_4$] (Compound 3)

Figure 19:
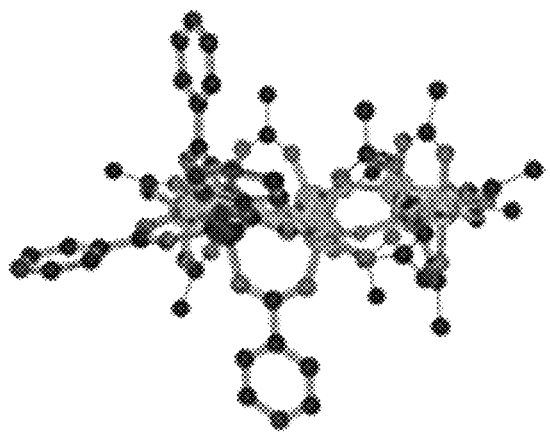
FIG. 19 depicts Compound [″Pr$_2$NH$_2$][Cr$_7$NiF$_8$(O$_2$C$^t$Bu)$_{12}$(O$_2$CC$_5$H$_4$N)$_4$].

See FIG. 19

Compound [$^nPr_2NH_2$][$Cr_7NiF_8(O_2C^tBu)_{12}(O_2CC_5H_4N)_4$] (15.0 g, 6.54 mmol), iso-nicotinic acid (2.48 g, 19.5 mmol) and n-propanol (300 mL) were refluxed for 24 h with constant stirring. The resulting solution was cooled to room temperature and filtered. The solvent from the filtrate was removed under reduced pressure and extracted in diethyl ether (300 mL). The obtained solution was filtered and the diethyl ether was removed under reduced pressure leaving a solid. This was extracted in pentane (200 mL), filtered and evaporated to dryness giving a green solid, which was still a mixture of products. The mixture of compounds were separated and purified by flash chromatography. First, toluene was used as eluent, which allowed un-reacted starting material to be eluted. Thereafter, acetone was used to elute 3 as product. The solvent was removed under reduced pressure to obtain the title compound. Yield: 1.22 g (8%). Elemental analysis (%) calcd for $C_{90}H_{140}Cr_7F_8N_5NiO_{32}$: C. 45.44; H, 5.93; N, 2.94. found: C. 45.63; H, 5.87; N, 3.11. ES-MS (sample dissolved in THF, run in MeOH): m/z=2399 [M+Na]$^+$; 2379 [M+H]$^+$.

Coordination to 4Hg:

Compound 3 (100 mg, 0.02 mmol) was dissolved in hot acetone (10 mL). A solution of mercury chloride (21.6 mg, 0.08 mmol) in acetone (2 mL) was added dropwise and the green solution was stirred at 50° C. for 1 hour. The solution was cooled to room temperature and concentrated. A green microcrystalline powder was obtained. Elemental analysis (%) calcd for $C_{90}H_{140}Cr_7F_8N_5NiO_{32}Hg_4$: Cr, 11.44; Ni, 1.85; C, 33.98; H, 4.44; N, 2.20. found: Cr, 11.81; Ni, 1.56; C, 34.29; H, 4.11; N, 1.83.

Example 6.4—Synthesis of [$C_6H_{11}NH_2$][$Cr_7NiF_8$ $(O_2CC_2H_5)_{16}$] (Compound 4)

Figure 20:
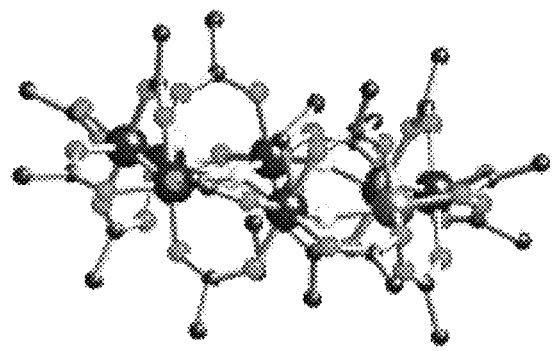
FIG. 20 depicts [C$_6$H$_{11}$NH$_2$][Cr$_7$NiF$_8$(O$_2$CC$_2$H$_5$)$_{16}$].

See FIG. 20

Pivalic acid (20.0 g, 195 mmol), diallylamine (0.55 g, 5.6 mmol), and chromium(III) fluoride tetrahydrate (6.7 g, 39 mmol) were heated at 140° C. with stirring in a Teflon flask for 0.5 h, then nickel(II) carbonate hydroxide tetrahydrate (0.98 g, 1.67 mmol) was added. After 1 h the temperature of the reaction was increased to 160° C. for 24 h. The flask was cooled to room temperature, and then acetone (35 mL) was added while stirring. The green microcrystalline product was collected by filtration, washed with a large quantity of acetone, dried in air. Flash chromatography with toluene as eluent afforded the desired compound 4 as green crystalline solid. Yield: 7.7 g (60%). Elemental analysis (%) calcd for $C_{86}H_{156}Cr_7F_8NNiO_{32}$: Cr, 15.89; Ni, 2.56; C, 45.09; H, 6.86; N, 0.61. found: Cr, 15.43; Ni, 2.32; C, 45.65, H, 6.81; N, 1.11. ES-MS (sample dissolved in THF, run in MeOH): m/z=2313 [M+Na]$^+$; 2291 [M+H]$^+$.

Example 6.5—Synthesis of N-allylhexa-2,4-dien-1-amine

To a solution of 2,4-hexanedienal (1.15 mL, 10.4 mmol) in 30 mL methanol, allylamine (0.78 mL, 13.6 mmol) in 5 mL methanol was added and the reaction mixture was stirred overnight under nitrogen atmosphere. Then an excess of $NaBH_4$ was added (5 equivalents) at 0° C. and reaction mixture stirred for 12 h under nitrogen atmosphere at room temperature. The reaction was quenched with water and the solvents evaporated under reduced pressure. The residue was extracted with chloroform and washed with water. The organic extract was dried over anhydrous magnesium sulphate and evaporated under reduced pressure and the compound was obtained as a light yellow oil in 90% yield (1.28 g). ES-MS (sample dissolved in MeOH, run in MeOH): m/z=138 [M+H]$^+$. NMR (400 MHz, 293K, CDCl$_3$): δ=1.7 (d, 3H), 3.22 (d, 4H), 5.08-5.17 (m, 2H), 5.72-5.76 (m, 3H), 5.8-6.02 (m, 2H).

Synthesis of [C$_9$H$_{15}$NH$_2$][Cr$_7$NiF$_8$(O$_2$CC$_2$H$_5$)$_{16}$] (Compound 5)

Pivalic acid (20.0 g, 195 mmol), N-allylhexa-2,4-dien-1-amine (0.65 g, 4.7 mmol), and chromium(III) fluoride tetrahydrate (6.0 g, 33.2 mmol) were heated at 140° C. with stirring in a Teflon flask for 0.5 h, then nickel(II) carbonate hydroxide tetrahydrate (0.83 g, 1.42 mmol) was added. After 1 h the temperature of the reaction was increased to 160° C. for 24 h. The flask was cooled to room temperature, and then acetone (35 mL) was added while stirring. The green microcrystalline product was collected by filtration, washed with a large quantity of acetone, dried in air. Flash chromatography with toluene as eluent afforded the desired compound 5 as green crystalline solid. Yield: 2.7 g (25%). Elemental analysis (%) calcd for C$_{89}$H$_{160}$Cr$_7$F$_8$NNiO$_{32}$: Cr, 15.62; Ni, 2.52; C, 45.86; H, 6.92; N, 0.60. found: Cr, 15.13; Ni, 2.39, C, 45.10; H, 6.48; N, 0.55. ES-MS (sample dissolved in THF, run in MeOH): m/z=2353 [M+Na]$^+$; 2331 [M+H]$^+$.

Example 6.6—Synthesis of bis(2-(hepta-1,6-dien-4-yloxy)ethyl)amine

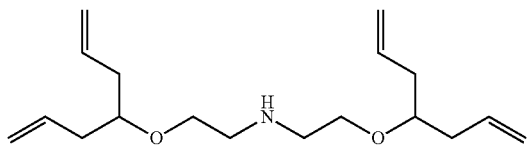 [SMILES: C=CCC(CC=C)OCCNCCOC(CC=C)CC=C]

To a solution of NaH (0.83 g, 5 equiv) in anhydrous DMF (10 mL), the dienol (1 g, 8.9 mmol, 2 equiv) was added dropwise at 0° C. The mixture was stirred for 15 min, and then bis(2-chloroethyl)amine hydrochloride (0.78 g, 1 equiv) was added. The mixture was allowed to warm to r.t. and stirred overnight. Excess NaH was quenched by addition of ice at 0° C. and the mixture was stirred for 10 min. The mixture was poured into H$_2$O, extracted with ethyl acetate (3×50 mL). The combined organic layers were washed with H$_2$O and brine solution, dried (anhydrous Na$_2$SO$_4$), and concentrated under reduced pressure. The residue was purified by flash chromatography (silica gel) to furnish the desired compound in 60% yield (0.7 g). ES-MS (sample dissolved in MeOH, run in MeOH): m/z=294 [M+H]+. NMR (400 MHz, 293K, CDCl$_3$): δ=2.15-2.32 (m, 8H), 2.80 (t, 4H), 3.62-3.70 (m, 2H), 3.76-3.89 (m, 4H), 5.13-5.34 (m, 8H), 5.85-6.03 (m, 4H).

Synthesis of [C$_{18}$F$_{131}$NO$_2$][Cr$_7$NiF$_8$(O$_2$CC$_2$H$_5$)$_{16}$] (Compound 6)

Pivalic acid (20.0 g, 195 mmol), bis(2-(hepta-1,6-dien-4-yloxy)ethyl)amine (0.5 g, 1.7 mmol), and chromium(III) fluoride tetrahydrate (2.1 g, 11.9 mmol) were heated at 140° C. with stirring in a Teflon flask for 0.5 h, then nickel(II) carbonate hydroxide tetrahydrate (0.31 g, 0.53 mmol) was added. After 1 h the temperature of the reaction was increased to 150° C. for 25 h. The flask was cooled to room temperature, and then acetone (35 mL) was added while stirring. The green microcrystalline product was collected by filtration, washed with a large quantity of acetone, dried in air. Flash chromatography with toluene as eluent afforded the desired compound 6 as green crystalline solid. Yield: 0.2 g (5%). Elemental analysis (%) calcd for C$_{98}$H$_{176}$Cr$_7$F$_8$NNiO$_{34}$: Cr, 14.64; Ni, 2.36; C, 47.33; H, 7.13; N, 0.56. found: Cr, 14.99; Ni, 2.17; C, 47.60; H, 6.67; N, 0.73. ES-MS (sample dissolved in THF, run in MeOH): m/z=2509 [M+Na]$^+$; 2487[M+H]$^+$.

Example 6.7—Synthesis of [C$_6$H$_{11}$NH$_2$][Cr$_7$NiF$_8$(O$_2$C$^t$Bu)$_{14}$(O$_2$CC$_5$H$_4$N)$_2$] (Compound 7)

Figure 21:
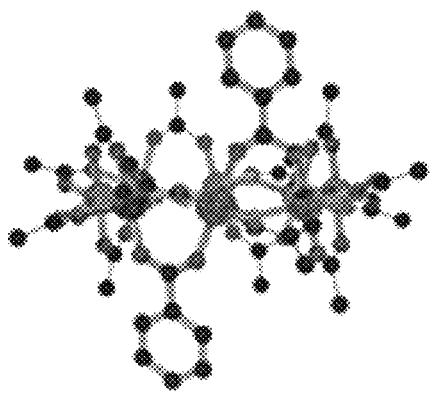
FIG. 21 depicts [C$_6$H$_{11}$NH$_2$][Cr$_7$NiF$_8$(O$_2$C$^t$Bu)$_{14}$(O$_2$CC$_5$H$_4$N)$_2$].

See FIG. 21

Compound [C$_6$H$_{11}$NH$_2$][Cr$_7$NiF$_8$(O$_2$CtBu)$_{14}$(O$_2$CC$_5$H$_4$N)$_2$] (7.5 g, 3.27 mmol), iso-nicotinic acid (1.2 g, 9.75 mmol) and n-propanol (150 mL) were refluxed for 24 h with constant stirring. The resulting solution was cooled to room temperature and filtered. The solvent from the filtrate was removed under reduced pressure and extracted in diethyl ether (100 mL). The obtained solution was filtered and the diethyl ether was removed under reduced pressure leaving a green solid. First, toluene was used as solvent, which allowed un-reacted starting material to be eluted, leaving the products of the reaction at the top of the column. Thereafter a mixture of petroleum ether:ethyl acetate (20/1) elution was used to remove any remaining unreacted starting material. The solvent ratio was then gradually worked up to a 5/1 mixture, eluting 7 as product. The solvent was removed under reduced pressure to obtain the title compound. Yield: 0.79 g (10%). Elemental analysis (%) calcd for C$_{88}$H$_{146}$Cr$_7$F$_8$N$_3$NiO$_{32}$: Cr, 15.60; Ni, 2.52, C, 45.31; H, 6.31; N, 1.80. found: Cr, 15.83; Ni, 2.11; C, 46.33; H, 5.80; N, 2.11. ES-MS (sample dissolved in THF, run in MeOH): m/z=2355 [M+Na]$^+$; 2333 [M+H]$^+$.

Coordination to 2Hg:

Compound 7 (100 mg, 0.04 mmol) was dissolved in hot acetone (10 mL). A solution of mercury chloride (23.1 mg, 0.08 mmol) in acetone (2 mL) was added dropwise and the green solution was stirred at 50° C. for 1 hour. The solution was cooled to room temperature and concentrated. A green microcrystalline powder was obtained. Elemental analysis (%) calcd for C$_{88}$H$_{142}$Cr$_7$F$_8$N$_3$NiO$_{32}$Hg$_2$: Cr, 13.33; Ni, 2.15; C, 38.72; H, 5.24; N, 1.54. found: Cr, 13.71; Ni, 2.01; C, 38.39; H, 5.72; N, 1.09.

Example 6.8—Synthesis of Methyl 3,5-di(pyridin-4-yl)benzoate

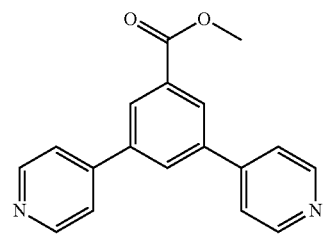 [SMILES: COC(=O)c1cc(-c2ccncc2)cc(-c2ccncc2)c1]

A mixture of methyl 3,5-dibromobenzoate (1.5 g, 5.1 mmol), 4-pyridylboronic acid pinacol ester (3.5 g, 16.9 mmol), Pd(PPh$_3$)$_4$ (0.6 g), and K$_3$PO$_4$ (8 g, 40.0 mmol) in dioxane (120 mL) was refluxed for 3 d under an argon atmosphere. The reaction mixture was treated with water and the products were extracted with CHCl$_3$, and washed with water. The organic extract was dried over anhydrous magnesium sulphate and evaporated under reduced pressure. The result was purified by column flash chromatography on silica gel (CHCl$_3$/MeOH (10/1)) to give the title compound as a pale yellow solid. Yield: 0.7 g (50%). ES-MS (sample dissolved in THF, run in MeOH): m/z=291 [M+H]+. NMR (500 MHz, 293K, CDCl$_3$): δ=3.9 (s, 3H), 7.6 (s, 2H), 8.1 (s, 1H), 8.4 (d, 4H), 8.7 (d, 4H).

Synthesis of 3, 5-di(pyridin-4-yl)benzoic Acid

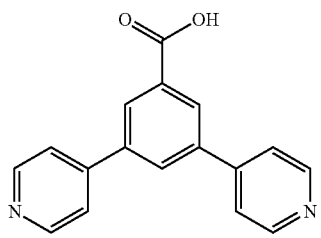 [SMILES: O=C(O)c1cc(-c2ccncc2)cc(-c2ccncc2)c1]

A solution of methyl 3,5-di(pyridin-4-yl)benzoate (0.7 g, 2.41 mmol) in a mixture of MeOH/THF/H$_2$O (30/20/6 mL) LiOH (0.11 g, 2 equiv) was added. The reaction mixture was stirred at room temperature for 24 h. MeOH and THF were removed in vacuum, and the residue was acidified with 1M aqueous HCl to pH 5. The resulting solid was isolated by filtration, washed with cold water (10 mL), and dried in vacuum. The filtrate was concentrated in vacuum and additionally acidified with 1M aqueous HCl to pH 5. Additional solid precipitated which was filtered, washed with cold water (3 mL) and dried in vacuum to give the product as white solid. Yield: 0.5 g (71%). ES-MS (sample dissolved in THF, run in MeOH): m/z=277 [M+H]'. NMR (400 MHz, 293K, DMSO): δ=7.7 (s, 2H), 7.9 (s, 1H), 8.1 (d, 4H), 8.5 (d, 4H), 12.9 (s, 1H).

Synthesis of [$''$Pr$_2$NH$_2$][Cr$_7$NiF$_8$(O$_2$CtBu)$_{15}$(O$_2$C(C$_6$H$_4$)$_2$OH)]

Figure 22:
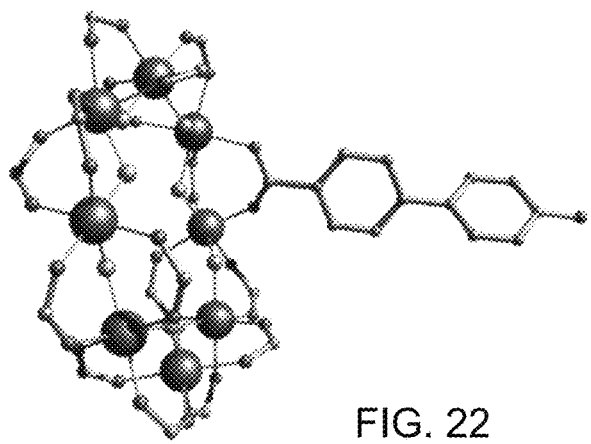
FIG. 22 depicts [″Pr$_2$NH$_2$][Cr$_7$NiF$_8$(O$_2$C$^t$Bu)$_{15}$(O$_2$C(C$_6$H$_4$)$_2$OH)].

See FIG. 22

An excess of 4'-hydroxy-4-biphenylcarboxylic acid (1.71 g, 8.0 mmol) was reacted with [$''$Pr$_2$NH$_2$][Cr$_7$Ni(μ-F)$_8$(O$_2$C$^t$Bu)$_{16}$] (6.92 g, 3.0 mmol) in toluene (25 mL), dimethylformamide (25 mL) and 1,2-dichlorobenzene (75 mL). The solution was heated with constant stirring at 150° C. for 12 h in a round-bottomed flask. Solvent was removed under reduced pressure and the resulting residue was purified by column chromatography. First toluene, followed by 60/1 toluene/ethyl acetate was used, which allowed un-reacted [$''$Pr$_2$NH$_2$][Cr$_7$Ni(μ-F)$_8$(O$_2$C$^t$Bu)$_{16}$] to be eluted, leaving the products of the reaction at the top of the column. Thereafter 40/1 toluene/ethyl acetate was used, eluting the product. The solvent was removed under reduced pressure and X-ray quality crystals were obtained from recrystallization from Et$_2$O/MeCN (2.89 g, 40%). ESI-MS (m/z): 2429 [M+Na]$^+$; 2407 [M+H]$^+$. Elemental analysis (%) calcd for C$_{94}$H$_{160}$Cr$_7$F$_8$NNiO$_{33}$: Cr, 15.12; Ni, 2.44; C, 46.91; H, 6.70; N, 0.58. found: Cr, 15.17; Ni, 2.47; C, 47.05, H, 6.78; N, 0.60.

Synthesis of [$''$Pr$_2$NH$_2$][Cr$_7$NiF$_8$(O$_2$C$^t$Bu)$_{15}$(O$_2$C(C$_6$H$_4$)$_2$O$_2$C(C$_6$H$_3$)(C$_6$H$_4$N)$_2$)]

Figure 23:
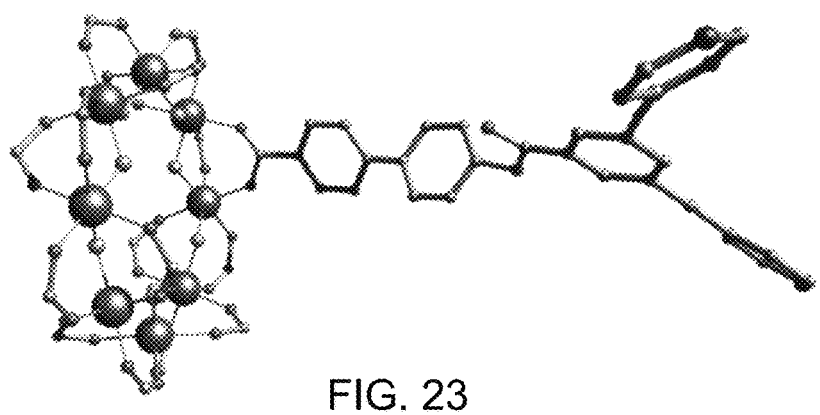
FIG. 23 depicts [″Pr$_2$NH$_2$][Cr$_7$NiF$_8$(O$_2$C$^t$Bu)$_{15}$(O$_2$C(C$_6$H$_4$)$_2$O$_2$C(C$_6$H$_3$)(C$_6$H$_4$N)$_2$)].

See FIG. 23

A mixture of [$''$Pr$_2$NH$_2$][Cr$_7$NiF$_8$(O$_2$C$^t$Bu)$_{15}$(O$_2$C(C$_6$H$_4$)$_2$OH)] (1 g, 0.4 mmol), 3,5- di(pyridin-4-yl)benzoic acid (0.11 g, 0.4 mmol), dicyclohexylcarbodiimide (0.26 g, 1.26 mmol), 4-dimethylamino pyridine (0.14 g, 1.26 mmol) in dry THF (50 mL) was stirred for 48 h at room temperature under argon atmosphere. The reaction mixture was filtered to remove the dicyclohexylurea formed. The solvent was removed under reduced pressure leaving a solid. The solid was extracted in hexane (200 mL), the solution was filtered and evaporated to dryness giving a green solid, which was separated and purified by flash chromatography using toluene and then toluene/ethyl acetate as eluents to give the title compound as a green solid. Yield: 0.2 g (20%). Elemental analysis (%) calcd for C$_{111}$H$_{170}$Cr$_7$F$_8$N$_3$NiO$_{34}$: Cr, 13.66, Ni, 2.20; C, 50.03; H, 6.43; N, 1.58. found: Cr, 13.43; Ni, 2.12; C, 50.31; H, 6.90; N, 1.19. ES-MS (sample dissolved in THF, run in MeOH): m/z=2688 [M+Na]'; 2666 [M]'.

Synthesis of [{[$''$Pr$_2$NH$_2$][Cr$_7$Ni(μ-F)$_8$(O$_2$C$^t$Bu)$_{15}$(O$_2$CC$_{33}$H$_{19}$O$_2$N$_2$)]}$_{24}$Pd$_{12}$(BF$_4$)$_{24}$]8

Figure 24:
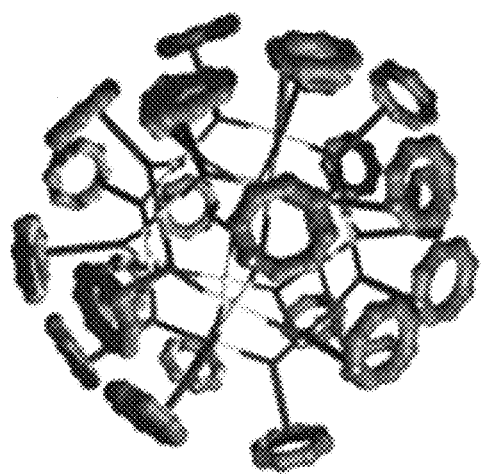
FIG. 24 depicts [{[″Pr$_2$NH$_2$][Cr$_7$Ni(μ-F)$_8$(O$_2$C$^t$Bu)$_{15}$(O$_2$CC$_{33}$H$_{19}$O$_2$N$_2$)]}$_{24}$Pd$_{12}$(BF$_4$)$_{24}$]$_8$.

See FIG. 24

Compound [$''$Pr$_2$NH$_2$][Cr$_7$NiF$_8$(O$_2$C$^t$Bu)$_{15}$(O$_2$C(C$_6$H$_4$)$_2$O$_2$C(C$_6$H$_3$)(C$_6$H$_4$N)$_2$)] (0.07 g, 0.026 mmol) was dissolved in hot acetone (2 mL). A solution of Pd(BF$_4$)$_2$.4CH$_3$CN (0.004 g, 0.0013 mmol) in acetone (2 mL) was added dropwise and the green solution was stirred at 50° C. for 12 hours. The solution was concentrated to obtain a green powder. Elemental analysis (%) calcd for C$_{2664}$H$_{4080}$B$_{24}$Cr$_{168}$F$_{288}$N$_{72}$Ni$_{24}$O$_{816}$Pd$_{12}$: Cr, 12.97; Ni, 2.09; C, 47.53; H, 6.11; N, 1.50. found: Cr, 12.42, Ni, 1.98; C, 48.39; H, 6.50; N, 1.10.

Example 6.9—Nanocomposite Material which Comprises of Fujita Cage with 24 Satellite Cr$_7$Ni Rings Attached and DiAllylamine, where the Diallylamine is not Attached to the Cage The relevant formulation is shown in Table 6 below, and is formed by mixing 30 mg of the Fujita Cage with 24 satellite Cr7Ni rings attached thereto with 2 g of Tert Butyl Methyl Ether. 6 mg of Diallylamine is then introduced into the mix.

Example 6.10—Nanocomposite Material which Comprises of Fujita Cage with 24 Satellite Cr$_7$Ni Rings Attached and Trans Trans Famesyl Bromide, where the Trans Trans Farnesyl Bromide is not Attached to the Cage The relevant formulation is shown in Table 6 below, and is formed by mixing 30 mg of the Fujita Cage with 24 satellite Cr7Ni rings attached thereto with 2 g of Tert Butyl Methyl Ether. 6 mg of trans trans farnesyl bromide is then introduced into the mix.

Example 6.11—Nanocomposite Material which Comprises of Fujita Cage with 24 Satellite Cr$_7$Ni Rings Attached and Pentraerythritol Tetraacrylate, where the Pentraerythritol Tetraacrylate is not Attached to the Cage The relevant formulation is shown in Table 6 below, and is formed by mixing 30 mg of the Fujita Cage with 24 satellite Cr7Ni rings attached thereto with 2 g of Tert Butyl Methyl Ether. 6 mg of Pentraerythritol tetraacrylate is then introduced into the mix.

Example 6A—Production of eBeam Resist Compositions eBeam resist formulations were prepared using the anti-scattering compounds (with or without appended secondary electron generator(s) and/or scattering compounds) as explained below.

Resist formulations containing Cr7Ni Ring molecule and $HgCl_2$ were prepared according to the formulations shown in Table 3:

Table 3 shows the resist formulations that have $HgCl_2$ attached to a Cr7Ni Ring.

| $Cr_7Ni$ Ring + 1$HgCl_2$ (Ex 6.1) | $Cr_7Ni$ Ring + 2$HgCl_2$ (Ex 6.2) | $Cr_7Ni$ Ring + 4$HgCl_2$ (Ex 6.3) | Tert Butyl Methyl Ether (tBME) |
|---|---|---|---|
| 15 mg | — | — | 2 g |
| — | 15 mg | — | 2 g |
| — | — | 15 mg | 2 g |

Table 4 shows the resist formulations that incorporate Alkene groups attached inside the $Cr_7Ni$ Ring. The relevant alkene structures are also illustrated below.

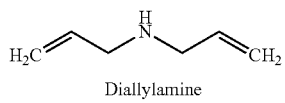
Diallylamine

Table 4 shows the resist formulations that have Alkene molecules attached inside a $Cr_7Ni$ Ring.

| $Cr_7Ni$ Ring + DiAllylamine | $Cr_7Ni$ Ring + TriAllylamine | $Cr_7Ni$ Ring + 4 Alkene groups | Tert Butyl Methyl Ether (tBME) |
|---|---|---|---|
| 15 mg | — | — | 2 g |
| — | 15 mg | — | 2 g |
| — | — | 15 mg | 2 g |

Table 5 shows resist formulations of two $HgCl_2$ attached to the $Cr_7Ni$ Ring molecule where the $Cr_7Ni$ Ring had a DiAllylamine attached inside it Table 5 shows the resist formulations that have $Cr_7Ni$ Ring and two equivalents of $HgCl_2$ with DiAllylamine attached inside it.

| $Cr_7Ni$ Ring (DiAllylamine) + 2$HgCl_2$ | $Cr_7Ni$ Ring + 2$HgCl_2$ | $Cr_7Ni$ Ring + 4$HgCl_2$ | Tert Butyl Methyl Ether (tBME) |
|---|---|---|---|
| 15 mg | — | — | 2 g |

Table 6 shows resist formulations containing "Fujita cage" nanocomposite formulations. A nanocomposite material that uses the Fujita cage with 24 satellite $Cr_7Ni$ rings that orbit it was fabricated and the nanocomposite resist formulation is given table 6. The other molecules that were mixed with the Fujita cage had 2, 3 and 8 Alkene groups associated with their molecular structure. This was done in an attempt to potentially increase write speed. The alkene structures are shown below.

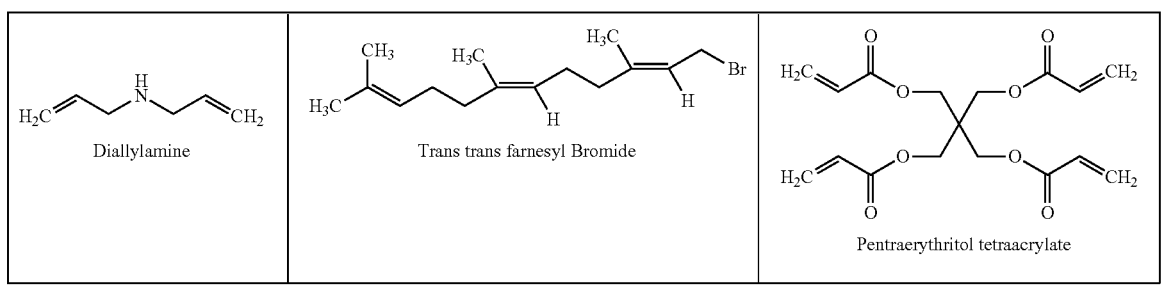

Diallylamine | Trans trans farnesyl Bromide | Pentaerythritol tetraacrylate

-continued

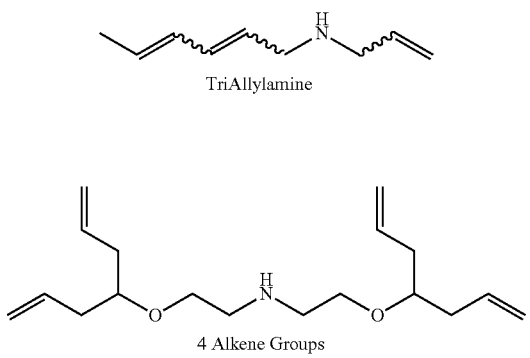

TriAllylamine

4 Alkene Groups

TABLE 6

"Fujita cage" nanocomposite resist formulations

| Fujita Cage with 24 satellite CrNi rings | Tert Butyl Methyl Ether (tBME) | Diallyl-amine | Trans trans farnesyl Bromide | Pentaerythritol tetraacrylate |
|---|---|---|---|---|
| 30 mg | 2 g | — | — | — |
| 30 mg | 2 g | 6 mg (20%) | — | — |
| 30 mg | 2 g | — | 6 mg (20%) | — |
| 30 mg | 2 g | — | — | 6 mg (20%) |

Example 6B—Preparation of Wafers for Testing

Using the compositions of Example 6A, silicon wafers were prepared in order to compare the performance of the resist compositions of Example 6A.

The formulations of Example 6A were spun onto 10 mm×10 mm silicon substrates. The resist was spun using a spin cycle of 8000 rpm for 30 seconds, which was followed by a soft-bake at 100° C. for 2 minutes, allowing the cast solvent to evaporate. The resist film resulted with a thickness of 100 nm. The exposure clearing doses of each resist material was determined from a ten 1-dimensional matrix of a single pixel line by 20 µm long, therefore the width of the line was the width of the electron beam. The first 1-dimensional matrix had each single pixel line separated by a pitch of 100 nm. These were exposed with a dose scale from 1 to 20.9 pC/cm in incremental steps of 0.1 pC/cm, while, the second to the tenth 1-dimensional matrices had a pitches of 90 to 50 nm in decremental pitches of 5 nm.

All resists were then exposed using a FEI Sirion Scanning Electron Microscope (SEM). The exposed pattern was written using an acceleration voltage of 30 KeV, a probe current of 50 pA, the dwell time was 12 µS and the step size was 12 nm. From these exposure parameters, the base dose was calculated to be 500 pC/cm. Each pattern was exposed using a write field of 100 µm. Each material was developed using a solution of Hexane, for 30s followed by an N2 blow dry.

Result and Discussion for Example 6

The aforementioned compounds/compositions were tested in their capacity as eBeam resists, in the same or similar manner as per the antiscattering compounds/resists described in the Examples preceding Example 6. In particular, the eBeam resist compositions (which may be considered compositions by virtue of the inclusion of multiple compounds, despite the fact that the compounds may associate as part of the same complex) of Example 6 were assessed in terms of feature/write width (which is a measure of resolution and focusing) and also the required exposure dose (which is an indication of write speed).

Table 7 below summarises the tests carried out in respect of each of Example 6.1-6.11 by reference to relevant FIGs and exposure dose values. FIGS. 14.1-14.11 are SEM images showing various lines written using eBeam in the various eBeam resist compositions.

TABLE 7

Test Data for Example 6.1-6.11

| Ex | eBeam resist description | FIG. No. | Feature width (nm) | Clearing Exposure Dose (pC/cm) |
|---|---|---|---|---|
| 6.1 | Cr$_7$Ni ring with 1 HgCl$_2$ present | 14.1 | 12.2 | 10600 |
| 6.2 | Cr$_7$Ni ring with 2 HgCl$_2$ present | 14.2 | 13.9 | 2200 |
| 6.3 | Cr$_7$Ni ring with 4 HgCl$_2$ present | 14.3 | 13.9 | 1400 |
| 6.4 | Cr$_7$Ni ring with a DiAllylamine attached | 14.4 | 15.7 | 15000 |
| 6.5 | Cr$_7$Ni ring with a TriAllylamine attached | 14.5 | 15.7 | 10200 |
| 6.6 | Cr$_7$Ni ring with an organic with 4 Alkene groups | 14.6 | 17.4 | 7200 |
| 6.7 | Cr$_7$Ni ring with a DiAllylamine attached in the middle and 2 HgCl$_2$ present | 14.7 | 7.5 | 1760 |
| 6.8 | Fujita Cage with 24 satellite Cr$_7$Ni rings attached | 14.8 | 6.9 | 5000 |
| 6.9 | Nanocomposite material which comprises of Fujita Cage with 24 satellite Cr$_7$Ni rings attached and DiAllylamine. The DiAllylamine is not attached. DiAllylamine has 2 Alkene groups. | 14.9 | 8.7 | 2600 |
| 6.10 | Nanocomposite material which comprises of Fujita Cage with 24 satellite Cr$_7$Ni rings attached and trans trans farnesyl Bromide. The trans trans farnesyl Bromide is not attached. Trans trans farnesyl Bromide has 3 Alkene groups. | 14.10 | 6.9 | 3400 |
| 6.11 | Nanocomposite material which comprises of Fujita Cage with 24 satellite Cr$_7$Ni rings attached and Pentraerythritol tetraacrylate. The Pentraerythritol tetraacrylate is not attached. Pentraerythritol tetraacrylate has 8 Alkene groups. | 14.11 | 6.9 | 1150 |

These results indicate that a synergistic effect can be achieved through combining antiscattering compounds with either or both a secondary electron generator and/or a scattering compound. Such a synergistic effect permits write speeds to be increased without significantly compromising the resolution.

REFERENCES

General Reviews

M. Affronte, S. Carretta, G. A. Timco and R. E. P. Winpenny, "A Ring Cycle: Studies of Heterometallic Wheels", Chem. Commun., 2007, 1789-1797.

G. A. Timco, T. B. Faust, F. Tuna and R. E. P. Winpenny, "Linking Rings for Quantum Information Processing and Amusement", Chem. Soc. Rev. 2011, 40, 3067-3075.

G. A. Timco, E. J. L. McInnes and R. E. P. Winpenny, "Physical Studies of Heterometallic Rings: An Ideal System for Studying Magnetically-Coupled Systems", Chem. Soc. Rev. 2013, 42, 1796-1806.

References Relevant to Antiscattering Compounds Comprising a Primary Metal Complex of Formula $[M^1_xM^2_y(monoLIG^1)_{m1}(O_2CR_{B1})_{16-b2}(O_2CR_{B2})_{b2}]$ F. K. Larsen, E. J. L. McInnes, H. El Mkami, J. Overgaard, S. Piligkos, G. Rajaraman, E. Rentschler, A. A. Smith, G. M. Smith, V. Boote, M. Jennings, G. A. Timco and R. E. P. Winpenny, "Synthesis and Characterisation of Heterometallic {Cr7M} Wheels", Angew. Chem. Int. Ed. 2003, 42, 101-105.

J. van Slageren, R. Sessoli, D. Gatteschi, A. A. Smith, M. Helliwell, R. E. P. Winpenny, A. Cornia, A.-L. Barra, A. G. M. Jansen, G. A. Timco and E. Rentschler, "Magnetic Anisotropy of the Antiferromagnetic Ring [Cr$_8$F$_8$Piv$_{16}$]: A Cantilever Torque Magnetometry and High-Frequency EPR Study", *Chem. Eur. J.,* 2002, 8, 277-285.

R. H. Laye, F. K. Larsen, J. Overgaard, C. A. Muryn, E. J. L. McInnes, E. Rentschler, V. Sanchez, H. U. Güdel, O. Waldmann, G. A. Timco and R. E. P. Winpenny, "A Family of Heterometallic Wheels Containing Potentially Fourteen Hundred Siblings", *Chem. Commun.* 2005, 1125-1127.

M. Affronte, I. Casson, M. Evangelisti, A. Candini, S. Carretta, C. A. Muryn, S. J. Teat, G. A. Timco, W. Wernsdorfer and R. E. P. Winpenny, "Linking Rings Through Diamines and Clusters: Exploring Synthetic Methods for Making Magnetic Quantum Gates", *Angew. Chem. Int. Ed.,* 2005, 44, 6496-6500.

C.-F. Lee, D. A. Leigh, R. G. Pritchard, D. Schultz, S. J. Teat, G. A. Timco and R. E. P. Winpenny, "Hybrid organic-inorganic rotaxanes and molecular shuttles", Nature, 2009, 458, 314-318.

G. A. Timco, S. Carretta, F. Troiani, F. Tuna, R. G. Pritchard, E. J. L. McInnes, A. Ghirri, A. Candini, P. Santini, G. Amoretti, M. Affronte and R. E. P. Winpenny, "Engineering Coupling Between Molecular Spin Qubits By Coordination Chemistry" Nature Nanotechnology, 2009, 4, 173-178.

T. B. Faust, P. G. Heath, C. A. Muryn, G. A. Timco and R. E. P. Winpenny, "Cesium ion sequestration by a fluorometallocrown [16]-MC-8", Chem. Commun., 2010, 46, 6258-6260.

B. Ballesteros, T. B. Faust, C. -F. Lee, D. A. Leigh, C. A. Muryn, R. G. Pritchard, D. Schultz, S. J. Teat, G. A. Timco and R. E. P. Winpenny, "Synthesis, Structure and Dynamic Properties of Hybrid Organic-Inorganic Rotaxanes", J. Amer. Chem. Soc. 2010, 132, 15435-15444.

M. L. Baker, S. Piligkos, A. Bianchi, S. Carretta, D. Collison, J. J. W. McDouall, E. J. L. McInnes, H. Mutka, G. A. Timco, F. Tuna, P. Vadivelu, H. Weihe, H. U. Gudel and R. E. P. Winpenny, "Modification of the magnetic properties of a heterometallic wheel by inclusion of a Jahn-Teller distorted Cu(II) ion", Dalton Trans., 2011, 40, 8533-8539.

C. J. Wedge, R. E. George, G. A. Timco, F. Tuna, S. Rigby, E. J. L. McInnes, R. E. P. Winpenny, S. J. Blundell and A. Ardavan, "Chemical engineering of molecular qubits", Phys. Rev. Lett., 2012, 108, 107204.

H. Rath, G. A. Timco, V. Corradini, A. Ghirri, U. del Pennino, A. Fernandez, R. G. Pritchard, C. A. Muryn, M. Affronte and R. E. P. Winpenny, "Studies of Hybrid Organic-Inorganic [2] and [3] Rotaxanes Bound to Au Surfaces", Chem. Commun., 2013, 4, 3404-3406.

G. F. S. Whitehead, B. Cross, L. Carthy, V. A. Milway, H. Rath, A. Fernandez, S. L. Heath, C. A. Muryn, R. G. Pritchard, S. J. Teat, G. A. Timco and R. E. P. Winpenny, "Rings and threads as linkers in metal-organic frameworks and poly-rotaxanes", Chem. Commun., 2013, 49, 7195-7197.

G. F. S. Whitehead, F. Moro, G. A. Timco, W. Wernsdorfer, S. J. Teat and R. E. P. Winpenny, "A Ring of Rings and Other Multicomponent Assemblies of Clusters", *Angew. Chem. Int. Ed.,* 2013, 52, 9932-9935.

G. F. S. Whitehead, J. Ferrando-Soria, L. G. Christie, N. F. Chilton, G. A. Timco, F. Moro and R. E. P. Winpenny, "The Acid Test: the chemistry of carboxylic acid functionalised {Cr$_7$Ni} rings," Chem. Sci., 2014, 5, 235-239.

References Relevant to Antiscattering Compounds Comprising a Primary Metal Complex of Formula [M$^1$$_{8-y}$M$^2$$_y$F$_3$(O$_2$CR$_{B1}$)$_{15}$(Gluc-NH—R$_{O1}$)]

G. A. Timco, E. J. L. McInnes, R. G. Pritchard, F. Tuna and R. E. P. Winpenny, "Heterometallic Rings Made from Chromium Stick Together Easily", *Angew. Chem. Int. Ed.* 2008, 47, 9681-9684.

T. B. Faust, V. Bellini, A. Candini, S. Carretta, G. Lorusso, D. R. Allan, L. Carthy, D. Collison, R. J. Docherty, J. Kenyon, J. Machin, E. J. L. McInnes, C. A. Muryn, H. Nowell, R. G. Pritchard, S. J. Teat, G. A. Timco, F. Tuna, G. F. S. Whitehead, W. Wernsdorfer, M. Affronte and R. E. P. Winpenny, "Chemical control of spin propagation between heterometallic rings", Chem. Eur. J. 2011, 17, 14020-14030.

T. B. Faust, F. Tuna, G. A. Timco, M. Affronte, V. Bellini, W. Wernsdorfer and R. E. P. Winpenny "Controlling magnetic communication through aromatic bridges by variation in torsion angle", Dalton Trans., 2012, 41, 13626-13631.

E. Garlatti, M. A. Albring, M. L. Baker, R. J. Docherty, V. Garcia Sakai, H. Mutka, T. Guidi, G. F. S. Whitehead, R. G. Pritchard, G. A. Timco, F. Tuna, G. Amoretti, S. Carretta, P. Santini, G. Lorusso, M. Affronte, E. J. L. McInnes, D. Collison and R. E. P. Winpenny, "A detailed study of the magnetism of chiral {Cr7M} rings: an investigation into parameterization and transferability of parameters" . . . accepted for J. Amer. Chem. Soc.

References Relevant to Other Potential Antiscattering Compounds

F. K. Larsen, J. Overgaard, S. Parsons, E. Rentschler, G. A. Timco, A. A. Smith and R. E. P. Winpenny, "Horseshoes, Rings and Distorted Rings: Studies of Reactions of Chromium-Fluoride Wheels", *Angew. Chem. Int. Ed.,* 2003, 42, 5978-5981.

O. Cador, D. Gatteschi, R. Sessoli, F. K. Larsen, J. Overgaard, A.-L. Barra, S. J. Teat, G. A. Timco and R. E. P. Winpenny, "The Magnetic Mobius Strip: Synthesis, Structure and First Magnetic Studies of Odd-Numbered Anti-Ferromagnetically Coupled Wheels", *Angew. Chem. Int. Ed.* 2004, 43, 5196-5200.

S. L. Heath, R. H. Laye, C. A. Muryn, R. Sessoli, R. Shaw, S. J. Teat, G. A. Timco and R. E. P. Winpenny, "Ringing The Changes: Templating Open and Closed-Chain Structures About Metal-Macrocycle Complexes", *Angew. Chem. Int. Ed.* 2004, 43, 6132-6135.

G. A. Timco, A. S. Batsanov, F. K. Larsen, C. A. Muryn, J. Overgaard, S. J. Teat and R. E. P. Winpenny, "Influencing The Nuclearity and Constitution of Heterometallic Rings Via Templates", Chem. Commun. 2005, 3649-3651.

M. Shanmugam, L. P. Englehardt, F. K. Larsen, M. Luban, C. A. Muryn, E. J. L. McInnes, J. Overgaard, E. Rentschler, G. A. Timco and R. E. P. Winpenny, "Synthesis and Studies of a Cyclic Dodecanuclear {Cr$_{10}$Cu$_2$} Complex", Chem. Eur. J., 2006, 12, 8267-8275.

L. P. Engelhardt, C. A. Muryn, R. G. Pritchard, G. A. Timco, F. Tuna and R. E. P. Winpenny, "Octa-, Deca-, Trideca- and Tetradeca-nuclear Heterometallic Cyclic Chromium-Copper Cages", *Angew. Chem. Int. Ed.* 2008, 47, 924-927.

M. Rancan, G. N. Newton, C. A. Muryn, R. G. Pritchard, G. A. Timco, L. Cronin and R. E. P. Winpenny, "Chemistry and supramolecular chemistry of chromium(III) horseshoes", Chem. Commun. 2008, 1560-1562.

A. B. Boeer, D. Collison, C. A. Muryn, G. A. Timco, F. Tuna and R. E. P. Winpenny, "Linkage Isomerism and Spin Frustration in Heterometallic Rings: Synthesis, Structural Characterisation and Magnetic and EPR Spectroscopic Studies of Cr7Ni, Cr6Ni2 and Cr7Ni2 Rings Templated About Imidazolium Cations", *Chem. Eur. J.* 2009, 15, 13150-13160.

M. L. Baker, A. Bianchi, S. Carretta, D. Collison, R. Docherty, E. J. L. McInnes, A. McRobbie, C. A. Muryn, H. Mutka, S. Piligkos, M. Rancan, P. Santini, G. A. Timco, P. L. W. Tregenna-Piggott, F. Tuna, H. U. Güdel and R. E. P. Winpenny, "Varying Spin State Composition by the Choice of Capping Ligand in A Family of Molecular Chains: Detailed Analysis of Magnetic Properties of Chromium(III) Horseshoes", *Dalton Trans.*, 2011, 40, 2725-2734.

A. McRobbie, A. R. Sarwar, S. Yeninas, H. Nowell, M. L. Baker, D. Allan, M. Luban, C. A. Muryn, R. G. Pritchard, R. Prozorov, G. A. Timco, G. F. S. Whitehead and R. E. P. Winpenny, "Chromium Chains as Polydentate Fluoride Ligands for Lanthanides", *Chem. Commun.* 2011, 47, 6251-6253.

M. L. Baker, G. A. Timco, S. Piligkos, J. Mathieson, H. Mutka, F. Tuna, P. Kozlowski, M. Antkowiak, T. Guidi, T. Gupta, H. Rath, R. J. Woolfson, G. Kamieniarz, R. G. Pritchard, H. Weihe, L. Cronin, G. Rajaraman, D. Collison, E. J. L. McInnes and R. E. P. Winpenny, "Spin frustration in molecular magnets, a classification based on physical studies of large odd-numbered-metal, odd-electron rings", *Proc. Natl. Acad. Sci.* 2012, 109, 19113-19118.

The invention claimed is:

1. A method of performing electron-beam lithography, the method comprising:
   i) providing an (eBeam) resist-coated substrate or applying an (eBeam) resist coating to a substrate;
   ii) exposing part(s) of the (eBeam) resist coating to (electron beam) radiation to provide an exposed (eBeam) resist coating;
   iii) developing the exposed (eBeam) resist coating to generate an (eBeam) resist pattern layer, the (eBeam) resist pattern layer comprising: developer-insoluble coating portions of the (eBeam) resist coating; and an array of grooves extending through the (eBeam) resist pattern layer;
   iv) optionally modifying the substrate, substrate surface, or part(s) thereof, underlying the (eBeam) resist pattern layer;
   v) optionally removing the (eBeam) resist pattern layer to provide a modified substrate;
   vi) optionally repeating, one or more times, step iv) and/or steps i)-v) (optionally with an alternative resist coating, such as a photoresist, instead of the eBeam resist coating; and optionally using alternative radiation during exposure, such as visible or ultraviolet light, instead of electron beam radiation) upon the modified substrate;

wherein the eBeam resist-coated substrate is a substrate coated with an eBeam resist coating;
wherein the eBeam resist coating comprises an optionally dried and/or cured eBeam resist composition;
wherein the eBeam resist composition comprises an anti-scattering compound; wherein the anti-scattering compound has a density less than or equal to 1.3 g/cm$^3$ and a molecular weight greater than or equal to 2000 g/mol.

2. The method of claim 1, wherein the anti-scattering compound comprises a primary metal complex (PMC), wherein the primary metal complex is a polymetallic cage.

3. The method of claim 2, wherein the anti-scattering compound comprises a linker component associated with one or more primary metal complexes in a hybrid complex of Formula B:

$$(PMC)_p(LINK)_l$$

wherein:
   PMC is a primary metal complex and p is a value between 1 and 30 and is the number of moles of PMC per mole of hybrid complex of Formula B; and
   wherein LINK is a linker component and l is a value between 1 and 10 and is the number of moles of LINK per mole of hybrid complex of Formula B;
wherein optionally either or both of the primary metal complex(es) and/or linker component(s) within a hybrid complex are each independently associated with any of the counterions, and/or the counterions may be associated with the hybrid complex as a whole;
wherein the anti-scattering compound optionally comprises one or more counterions associated with the hybrid complex as part of a hybrid complex salt, wherein the hybrid complex salt is defined by Formula C:

$$(C^1{}_{i1}C^2{}_{i2} \ldots C^c{}_{ic})(PMC)_p(LINK)_l$$

wherein $C^1$ is a first counterion, $C^2$ is a second counterion, and $C^c$ is a cth counterion, wherein i1, i2, and is are the respective number of moles of each of $C^1, C^2, \ldots,$ and $C^c$ per mole of hybrid complex salt of Formula C.

4. The method of claim 2, wherein the primary metal complex is defined by Formula I or comprises units defined by Formula I:

$$[M^1{}_xM^2{}_y \ldots M^n{}_{zn}(monoLIG^1)_{m1}(monoLIG^2)_{m2} \ldots (monoLIG^4)_{mq}(biLIG^1)_{b1}(biLIG^2)_{b2} \ldots (biLIG^r)_{br}(optLIG^5)(optLIG^1)_{o1}(optLIG^2)_{o2} \ldots (optLIG^s)_{os}];$$

wherein:
   $M^1$ is a first metal species and x is the number of moles of $M^1$ per mole of primary metal complex, wherein x is a number between 1 and 16;
   $M^2$ is a second metal species and y is the number of moles of $M^2$ per mole of primary metal complex, wherein y is a number between 0 and 7;
   $M^n$ is an nth metal species and zn is the number of moles of each $M^n$ per mole of primary metal complex, wherein zn is a number between 0 and 6; suitably between 0 and 2; suitably 0;
   monoLIG$^1$ is a first monodentate ligand and m1 is the number of moles of monoLIG$^1$ per mole of primary metal complex, wherein m1 is a number between 0 and 20;
   monoLIG$^2$ is a second monodentate ligand and m2 is the number of moles of monoLIG$^2$ per mole of primary metal complex, wherein m2 is a number between 0 and 10;
   monoLIG$^4$ is a qth monodentate ligand and mq is the number of moles of each monoLIG$^4$ per mole of primary metal complex, wherein mq is a number between 0 and 2;
   biLIG$^r$ is a first bidentate ligand and b1 is the number of moles of biLIG$^r$ per mole of primary metal complex, wherein b1 is a number between 1 and 20;
   biLIG$^2$ is a second bidentate ligand and b2 is the number of moles of biLIG$^2$ per mole of primary metal complex, wherein b2 is a number between 0 and 16;

biLIG$^r$ is a rth bidentate ligand and br is the number of moles of each additional biLIG$^r$ per mole of primary metal complex, wherein br is a number between 0 and 2;

optLIG$^1$ is a first optional extra ligand and o1 is the number of moles of optLIG$^1$ per mole of primary metal complex, wherein o1 is a number between 0 and 4;

optLIG$^2$ is a second optional extra/terminal ligand and o2 is the number of moles of optLIG$^2$ per mole of primary metal complex, wherein o2 is a number between 0 and 3;

optLIG$^s$ is a sth optional extra/terminal ligand and os is the number of moles of each additional optional optLIG$^s$ per mole of primary metal complex; wherein os is a number between 0 and 2.

5. The method of claim 4, wherein the sum of x and y is between 4 and 16.

6. The method of claim 4, wherein M$^1$ is a trivalent metal species.

7. The method of claim 4, wherein M$^2$ is a divalent metal species.

8. The method of claim 6, wherein M$^1$ is a trivalent metal species selected from the group including Cr$^{III}$, Fe$^{III}$, V$^{III}$, Ga$^{III}$, Al$^{III}$, or In$^{III}$.

9. The method of claim 7, wherein M$^2$ is a divalent metal species selected from the group including Ni$^{II}$, Co$^{II}$, Zn$^{II}$, Cd$^{II}$, Mn$^{II}$, Mg$^{II}$, Ca$^{II}$, Sr$^{II}$, Ba$^{II}$, Cu$^{II}$, or Fe$^{II}$.

10. The method of claim 4, wherein:

biLIG$^1$ is a carboxylate defined by the formula —O$_2$CR$_{B1}$ (or R$_{B1}$CO$_2^-$), wherein R$_{B1}$ is a hydrocarbyl moiety selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, or aryl(1-3C)alkyl;

biLIG$^2$ is a carboxylate defined by the formula —O$_2$CR$_{B2}$ (or R$_{B2}$CO$_2$), wherein R$_{B2}$ is a group comprising a basic or chelating group, and is selected from optionally substituted heterocyclyl, heteroaryl, heterocyclyl(1-6C)alkyl, heteroaryl(1-6C)alkyl, or is selected from (1-12C)alkyl, (1-12C)alkenyl, (1-12C)alkynyl, -8C)cycloalkyl, (3-8C)cycloalkenyl, (1-3C)alkyl(3-8C)cycloalkyl, (1-3C)alkyl(3-8C)cycloalkenyl, aryl, (1-3C) alkylaryl, or aryl(1-3C)alkyl;

optLIG$^1$ is either a solvent molecule or a polydentate ligand having a denticity greater than or equal to 3.

11. The method of claim 10, wherein the primary metal complex is defined or comprises units defined by either:

by the Formula IIa: [M$^1_{8-y}$M$^2_y$F$_8$(O$_2$CR$_{B1}$)$_{16-b2}$(O$_2$CR$_{B2}$)$_{b2}$]

by the Formula IIb: [CR$_7$NiF$_8$(O$_2$CR$_{B1}$)$_{16-b2}$(O$_2$CR$_{B2}$)$_{b2}$];

by the Formula IIc: [Cr$_7$NiF$_8$(O$_2$CR$_{B1}$)$_{16}$];

by the Formula IId: [Cr$_8$F$_8$(O$_2$CR$_{B1}$)$_{16-b2}$(O$_2$CR$_{B2}$)$_{b2}$];

by the Formula IIe: [Cr$_8$F$_8$(O$_2$CR$_{B1}$)$_{16}$]; or by the Formula III: [M$^1_{8-y}$M$^2_y$F$_3$(O$_2$CR$_{B1}$)$_{15}$(Gluc-NH—R$_{O1}$)], wherein Gluc-NH—R$_{O1}$ is N-(1-8C)alkyl-D-glucamine.

12. The method of claim 3, wherein the or each linker component (LINK) is independently selected from:

i) a single atom, molecule, ion, or complex containing a single co-ordinating moiety capable of accepting or donating two or more lone pairs of electrons;

ii) a single molecule, ion, or complex comprising two or more co-ordinating moieties, each co-ordinating moiety being capable of accepting or donating one or more lone pairs of electrons;

iii) a molecule, ion, or complex defined by Formula IV:

$$Q\text{-[CORE]-[W]}_w$$

wherein:

[CORE] is absent or is the core of the linker component and comprises one or optionally more than one core groups;

Q is a group directly attached to [CORE] or to one or more core group(s) thereof, wherein Q comprises a co-ordinating moiety;

each W is a group independently directly attached to [CORE] or to one or more core group(s) thereof, and optionally further attached to one or more other W groups or to Q, each of which W independently comprises a co-ordinating moiety;

wherein w is an integer greater than zero.

13. The method of claim 12, wherein the linker component is:

a) a single atom, molecule, ion, or complex containing a single co-ordinating moiety capable of donating two or more lone pairs of electrons, and the linker component(s) is or comprises a group selected from halide, oxo, oxide, hydroxide (OH$^-$), (1-6C)alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C)alkylthio, (2-6C)alkenylthio, (2-6C)alkynylthio, thiocarbonyl, heterocyclyl containing at least one internal heteroatom selected from oxygen or sulphur, or (where appropriate) a deprotonated form or salt thereof; wherein any CH, CH$_2$, or CH$_3$ is optionally substituted;

b) a single atom, molecule, ion, or complex containing a single co-ordinating moiety capable of accepting two or more lone pairs of electrons, and the linker component(s) is or comprises a group selected from a metal cation, a Lewis acidic metal compound, a Lewis acidic metal complex, and/or a metal compound or complex comprising a leaving group or substitutable ligand c) a single molecule, ion, or complex comprising two or more co-ordinating moieties, each being capable of donating one or more lone pairs of electrons, and the linker component(s) is or comprises one or more groups selected from halide, amino, cyano, imino, enamino, (1-6C)alkylamino, di-[(1-6C)alkyl]amino, tri-[(1-6C)alkyl]amino, oxo, oxide, hydroxide (OH$^-$), (1-6C)alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C)alkylthio, (2-6C)alkenylthio, (2-6C)alkynylthio, thiocarbonyl, heterocyclyl containing at least one internal heteroatom selected from nitrogen, oxygen or sulphur, heteroaryl containing at least one internal hetero atom selected from nitrogen, oxygen or sulphur, or (where appropriate) a deprotonated form or salt thereof; wherein any CH, CH$_2$, or CH$_3$ is optionally substituted;

d) a single molecule, ion, or complex comprising two or more co-ordinating moieties, each being capable of accepting one or more lone pairs of electrons, and the linker component(s) is or comprises one or more groups selected from a metal cation, a Lewis acidic metal compound, a Lewis acidic metal complex, and/or a metal compound or complex comprising a leaving group or substitutable ligand; or e) a molecule, ion, or complex defined by Formula IV, and:

(I) the [CORE] comprises a single core group to which the Q group and the or each of the W group(s) are commonly attached, wherein the single core group is selected from:
  i) a divalent or multivalent optionally substituted acyclic core group;
  ii) a divalent or multivalent cyclic or polycyclic core group;
  iii) a divalent or multivalent core group comprising at least one cyclic or polycyclic group linked to one or more acyclic moieties and/or cyclic or polycyclic moieties; or
  iv) a divalent or multivalent macrocyclic core group;
(II) the [CORE] comprises a plurality of core groups which are indirectly linked together to form the [CORE] via the Q group and/or one or more of the or each of the W group(s), wherein each of such core groups are independently selected from:
  i) a single atom, molecule, ion, or complex containing a single co-ordinating moiety capable of donating two or more lone pairs of electrons; and/or
  ii) a single molecule, ion, or complex comprising two or more co-ordinating moieties each capable of independently donating an electron lone pair; or
(III) the [CORE], comprises a plurality of core groups and is defined by:

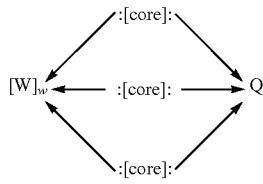

wherein W and Q are electron pair-accepting Q and/or W groups; abd each [core] is such that the linker component is selected from:
  A dimetallic carboxylate complex $[M_2(O_2C^R)_4]$ where M is a divalent metal ion;
  A dimetallic carboxylate complex $[MM'(O_2C^R)_4]^+$ where M is a divalent metal ion; and M' is a trivalent metal ion;
  A trimetallic carboxylate complex $[M_3O(O_2CR)_6]^+$ where M is a trivalent metal ion;
  A trimetallic carboxylate complex $[M_2M'O(O\_CR)_6]$ where M is a trivalent metal ion, and M' is a divalent metal ion;
  A hexametallic carboxylate complex $[M'_4M_2O_7(O_2CR)_{12}]$ where M is a trivalent metal ion, and M' is a divalent metal ion;
  a dodecametallic complex $M_{12}(chp)_{12}(O_2CMe)_6(H_2O)_6$ where chp=6-chloro-2-pyridonate, and where M=Ni or Co.

14. The method of claim 1, wherein the substrate comprises or consists essentially of a substrate base material, wherein the substrate base material is a lithographic plate, a material for a lithographic mask, or an electronic component substrate.

15. The method of claim 14, wherein the substrate base material is a single monolithic silicon crystal.

16. The method as claimed in any preceding claim of claim 1, wherein the eBeam resist composition further comprises a secondary electron generator which is or comprises a compound having an effective atomic number ($Z_{eff}$) greater than or equal to 15, wherein:

$Z_{eff} = \Sigma \alpha_i Z_i$ where $Z_i$ is the atomic number of the ith element in the compound, and $\alpha_i$ is the fraction of the sum total of the atomic numbers of all atoms in the compound (i.e. the total number of protons in the compound) constituted by said ith element.

17. An eBeam resist composition comprising an anti-scattering compound; wherein the anti-scattering compound has a density less than or equal to 1.3 g/cm$^3$ and a molecular weight greater than or equal to 2000 g/mol.

18. A method of fabricating an integrated circuit die or an integrated circuit wafer comprising a plurality of integrated circuit dice, the or each die comprising a plurality of electronic components, wherein the method comprises performing electron-beam lithography of claim 1 by:
  i) providing, as defined in claim 1, an (eBeam) resist-coated substrate or applying, as defined in claim 1, an (eBeam) resist coating to a substrate; and
  ii) exposing, as defined in claim 1, part(s) of the (eBeam) resist coating to electron beam radiation to provide an exposed (eBeam) resist coating;
  iii) developing, as defined in claim 1, the exposed (eBeam) resist coating to generate an (eBeam) resist pattern layer, the (eBeam) resist pattern layer comprising: developer-insoluble coating portions of the (eBeam) resist coating (i.e. ridges); and an array of grooves extending through the (eBeam) resist pattern layer;
  iv) modifying, as defined in claim 1, the substrate, substrate surface, or part(s) thereof, underlying the (eBeam) resist pattern layer;
  v) removing, as defined in claim 1, the (eBeam) resist pattern layer to provide a modified substrate;
  vi) optionally repeating, as defined in claim 1, one or more times, step iv) and/or steps i)-v) upon the modified substrate, (using either an eBeam resist coating or an alternative resist coating, (e.g., a photoresist); with either electron beam radiation or alternative radiation during exposure; and thereafter
  vii) conductively interconnecting the electronic components of the or each die with conductor(s), if not already performed during one or more substrate/substrate-surface modifying steps, to provide an integrated circuit with external contact terminals;
  viii) optionally performing one or more further finishing steps;
  ix) optionally separating an integrated circuit die from a wafer comprising a plurality of integrated circuit dice;
wherein the eBeam resist-coated substrate is a substrate coated with an eBeam resist coating;
wherein the eBeam resist coating comprises an optionally dried and/or cured resist composition;
wherein the eBeam resist composition comprises an anti-scattering as defined in a claim 1;
wherein the resist-coated substrate is a substrate coated with a resist coating, whether an eBeam resist coating as defined in claim 1 or an alternative resist coating (e.g., a photoresist);
wherein the resist coating comprises an optionally dried and/or cured resist composition, whether an eBeam resist composition as defined in claim 1 or an alternative resist composition (e.g., a photoresist).

19. A method of manufacturing an integrated circuit package, the integrated circuit package comprising a plurality of pins and an integrated circuit die with external contact terminals conductively connected to the corresponding plurality of pins, wherein the method comprises providing an integrated circuit die by a method of fabricating an integrated circuit die of claim 18; and thereafter:

i) attaching the integrated circuit die to a package substrate, wherein the package substrate comprises electrical contacts, each of the electrical contacts being optionally connected or connectable to a corresponding pin;

ii) conductively connecting each of the external contact terminals of the integrated circuit die to corresponding electrical contacts of the package substrate; and iii) optionally, and if necessary, connecting the electrical contacts of the package substrate to corresponding pins;

iv) encapsulating the integrated circuit die.

20. A method of manufacturing a circuit board comprising an integrated circuit package comprising a plurality of pins, wherein the method comprises providing an integrated circuit package by a method of manufacturing an integrated circuit package as claimed in claim 19; and thereafter:

conductively connecting the integrated circuit package to a circuit board.

21. A method of manufacturing an electronic device or system, the electronic device or system comprising or being connectable to a power source and comprising a circuit board conductively connected to or connectable to a power source, wherein the method comprises providing a circuit board by the method of manufacturing a circuit board as claimed in claim 20; and thereafter:

incorporating the circuit board within the electronic device or system.

\* \* \* \* \*